(12) United States Patent
Yu et al.

(10) Patent No.: US 12,007,425 B1
(45) Date of Patent: Jun. 11, 2024

(54) MEASURING RADIO FREQUENCY ELECTROMAGNETIC WAVES WITH AN IN-LINE MEASUREMENT DEVICE

(71) Applicant: Quantum Valley Ideas Laboratories, Waterloo (CA)

(72) Inventors: Su-Peng Yu, Waterloo (CA); Kent Arnold Nickerson, Waterloo (CA); Rajesh Pandiyan, Kitchener (CA); Hadi Amarloo, Waterloo (CA); Mohammad Noaman, Waterloo (CA); James P. Shaffer, Kitchener (CA)

(73) Assignee: Quantum Valley Ideas Laboratories, Waterloo (CA)

( * ) Notice: Subject to any disclaimer, the term of this patent is extended or adjusted under 35 U.S.C. 154(b) by 0 days.

(21) Appl. No.: 18/503,071

(22) Filed: Nov. 6, 2023

(51) Int. Cl.
G01R 29/08 (2006.01)

(52) U.S. Cl.
CPC ..... *G01R 29/0885* (2013.01); *G01R 29/0814* (2013.01)

(58) Field of Classification Search
CPC .................. G01R 29/0885; G01R 29/0814
See application file for complete search history.

(56) References Cited

U.S. PATENT DOCUMENTS

| | | | |
|---|---|---|---|
| 8,571,373 | B2 | 10/2013 | Wang et al. |
| 10,605,840 | B1 | 3/2020 | Amarloo et al. |
| 10,859,981 | B1 | 12/2020 | Ramirez-Serrano et al. |
| 11,300,599 | B1 | 4/2022 | Amarloo et al. |
| 11,303,087 | B1 | 4/2022 | Amarloo et al. |
| 11,307,233 | B1 | 4/2022 | Amarloo et al. |
| 11,313,926 | B1 | 4/2022 | Amarloo et al. |
| 11,843,420 | B1 | 12/2023 | Caliga et al. |
| 2014/0248020 | A1 | 9/2014 | Fujita et al. |
| 2018/0031620 | A1 | 2/2018 | Anderson et al. |
| 2019/0187198 | A1 | 6/2019 | Anderson et al. |
| 2020/0292606 | A1 | 9/2020 | Holloway et al. |
| 2021/0190589 | A1 | 6/2021 | Fleisher et al. |

(Continued)

OTHER PUBLICATIONS

USPTO, Non-Final Office Action issued in U.S. Appl. No. 18/503,062, filed Jan. 24, 2024, 19 pages.

(Continued)

*Primary Examiner* — Jamil Ahmed
(74) *Attorney, Agent, or Firm* — Henry Patent Law Firm PLLC

(57) ABSTRACT

In a general aspect, a system for measuring radio frequency (RF) electromagnetic waves includes a laser system configured to generate plurality of input optical signals. The system also includes an RF measurement device having first and second mode converters and an internal cavity therebetween. The internal cavity contains a vapor that is configured to produce an output optical signal based on the plurality of input optical signals. The RF measurement device also includes an RF waveguide that extends between the first and second mode converters and is configured to carry the second RF waveguide mode through the internal cavity. The system also includes an optical detector system configured to generate a detector signal in response to receiving the output optical signal. The system additionally includes a signal processing system configured to generate data in response to receiving the detector signal.

30 Claims, 33 Drawing Sheets

(56) References Cited

U.S. PATENT DOCUMENTS

2022/0018914 A1 1/2022 Holloway et al.
2022/0390496 A1* 12/2022 Aksyuk .............. G01R 29/0878

OTHER PUBLICATIONS

USPTO, Notice of Allowance issued in U.S. Appl. No. 18/503,068, filed Feb. 1, 2024, 9 pages.
Adams, et al., "Rydberg atom quantum technologies", J. Phys. B: At. Mol. Opt Phys. 53, Dec. 3, 2019, 14 pgs.
Fan, et al., "Atom based RF electric field sensing", Journal of Physics B: Atomic, Molecular and Optical Physics, Sep. 9, 2015, 17 pgs.
Fan, et al., "Dispersive radio frequency electrometry using Rydberg atoms in a prism-shaped atomic vapor cell", J. Phys. B: At. Mol. Opt. Phys. 49, 2016, 8 pgs.
Fan, et al., "Effect of Vapor-Cell Geometry on Rydberg-Atom-Based Measurements of Radio-Frequency Electric Fields", Physical Review Applied 4, 044015, 2015, 7 pgs.
Fan, et al., "Subwavelength microwave electric-field imaging using Rydberg atoms inside atomic vapor cells", Optics Letters, vol. 39, No. 10, May 15, 2014, 4 pgs.
Holloway, Christopher L., et al., "A New Quantum-Based Power Standard: Using Rydberg Atoms for a SI-Traceable Radio-Frequency Power Measurement Technique in Rectangular Waveguides", Applied Physics Letters, 113, 094101 (2018), arXiv:1806.06983v2, 4 pages.
Kumar, et al., "Atom-Based Sensing of Weak Radio Frequency Electric Fields Using Homodyne Readout", Scientific Reports 7:42981, Feb. 20, 2017, 10 pgs.
Kumar, et al., "Rydberg-atom based radio-frequency electrometry using frequency modulation spectroscopy in room temperature vapor cells", Optics Express, vol. 25, No. 8, Apr. 17, 2017, 13 pgs.
Mitsch, R., et al., "Exploiting the local polarization of strongly confined light for sub-micron-resolution internal state preparation and manipulation of cold atoms", Physical Review A, vol. 89 Iss. 6, Jun. 30, 2014, arXiv:1403.5129v2, 6 pages.
Sedlacek, et al., "Atom-Based Vector Microwave Electrometry Using Ribidium Rydberg Atoms in a Vapor Cell", Physical Review Letters, Aug. 6, 2013, 5 pgs.
Sedlacek, et al., "Microwave electrometry with Rydberg atoms in a vapour cell using bright atomic resonances", Nature Physics 8, Nov. 2012, 6 pgs.
Shaffer, et al., "A read-out enhancement for microwave electric field sensing with Rydberg atoms", SPIE Photonics Europe, 2018, Strasbourg, France, 2018, 11 pgs.
Soellner, Immo, et al., "Deterministic photon-emitter coupling in chiral photonic circuits", Nature Nanotechnology, Oct. 2015, arXiv:1406.4295v3, 8 pages.
Yu, "Nano-Photonic Platform for Atom-Light Interaction", Ph.D. Dissertation, California Institute of Technology, 2017, 168 pgs.
USPTO, Ex Parte Quayle issued in U.S. Appl. No. 18/503,068 dated Jan. 11, 2024, 14 pages.

* cited by examiner

3mm thick wall, 1mm wide hole
Loss @ freq = 0.5 (40GHz) = 0.03dB

| Section | Bandwidth Definition | Bandwidth Value |
|---|---|---|
| Mode Converted | T > -0.1dB | ~12 GHz (center = 40 GHz) |
| Wall transmission TE | Tether bandgap | 6.4 GHz |
| Wall transmission TM | T > -0.1dB | ~16 GHz |
| WR coupling flared-style | T > -0.1dB | ~12 GHz |
| WR coupling rotated-style | T > -0.1dB | ~9.6 GHz |

FIG. 13B

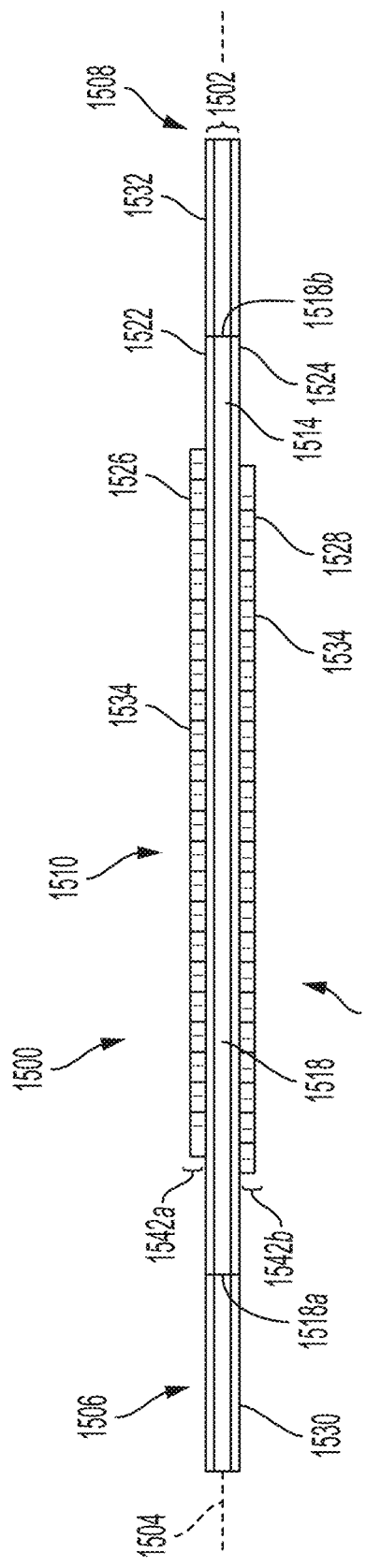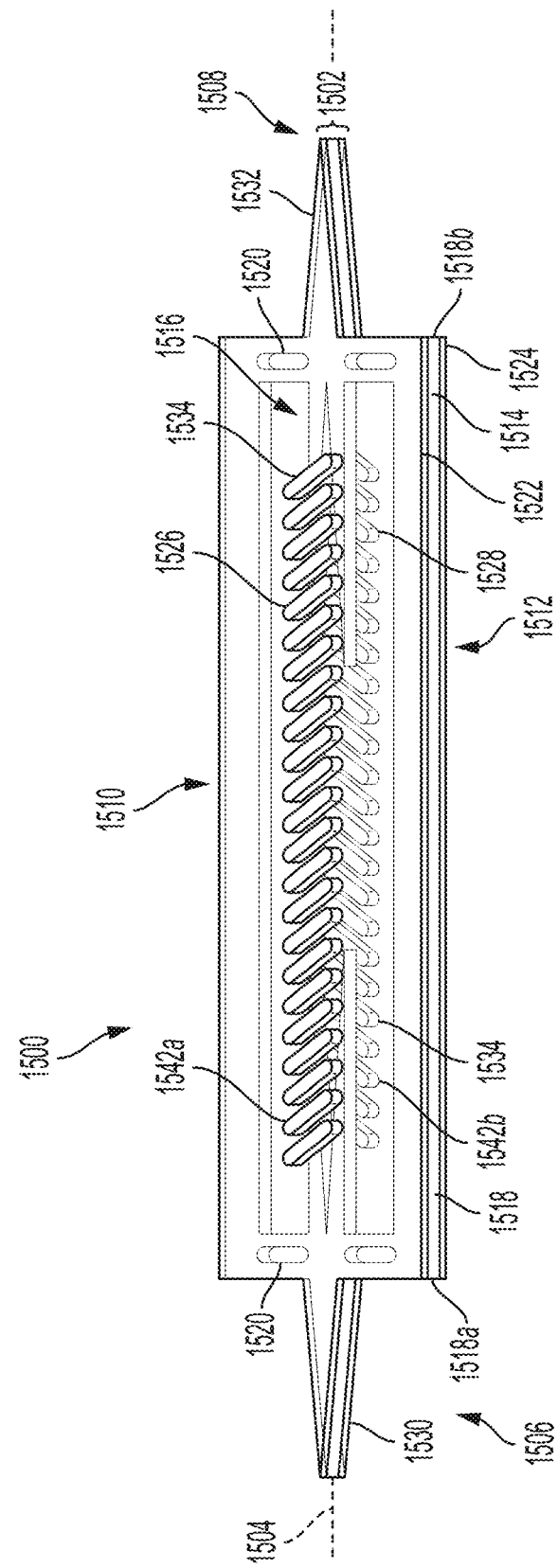
FIG. 15C
FIG. 15D

MEASURING RADIO FREQUENCY ELECTROMAGNETIC WAVES WITH AN IN-LINE MEASUREMENT DEVICE

BACKGROUND

The following description relates to measuring radio frequency electromagnetic waves with an in-line measurement device.

Waveguides have been used to transmit radio frequency (RF) electromagnetic radiation. In certain cases, the waveguides may alter the RF electromagnetic radiation during transmission. For example, the waveguides may reduce an intensity of the RF electromagnetic radiation during transmission, thereby imparting losses to the RF electromagnetic radiation.

DESCRIPTION OF DRAWINGS

FIG. 13B is a table that compares transmission losses between the example RF measurement device and waveguide section of FIG. 13A;

FIG. 15C is a schematic diagram, in side view, of the example RF measurement device of FIG. 15A;

FIG. 15D is a schematic diagram, in top perspective view, of the example RF measurement device of FIG. 15A;

DETAILED DESCRIPTION

Figure 1A:
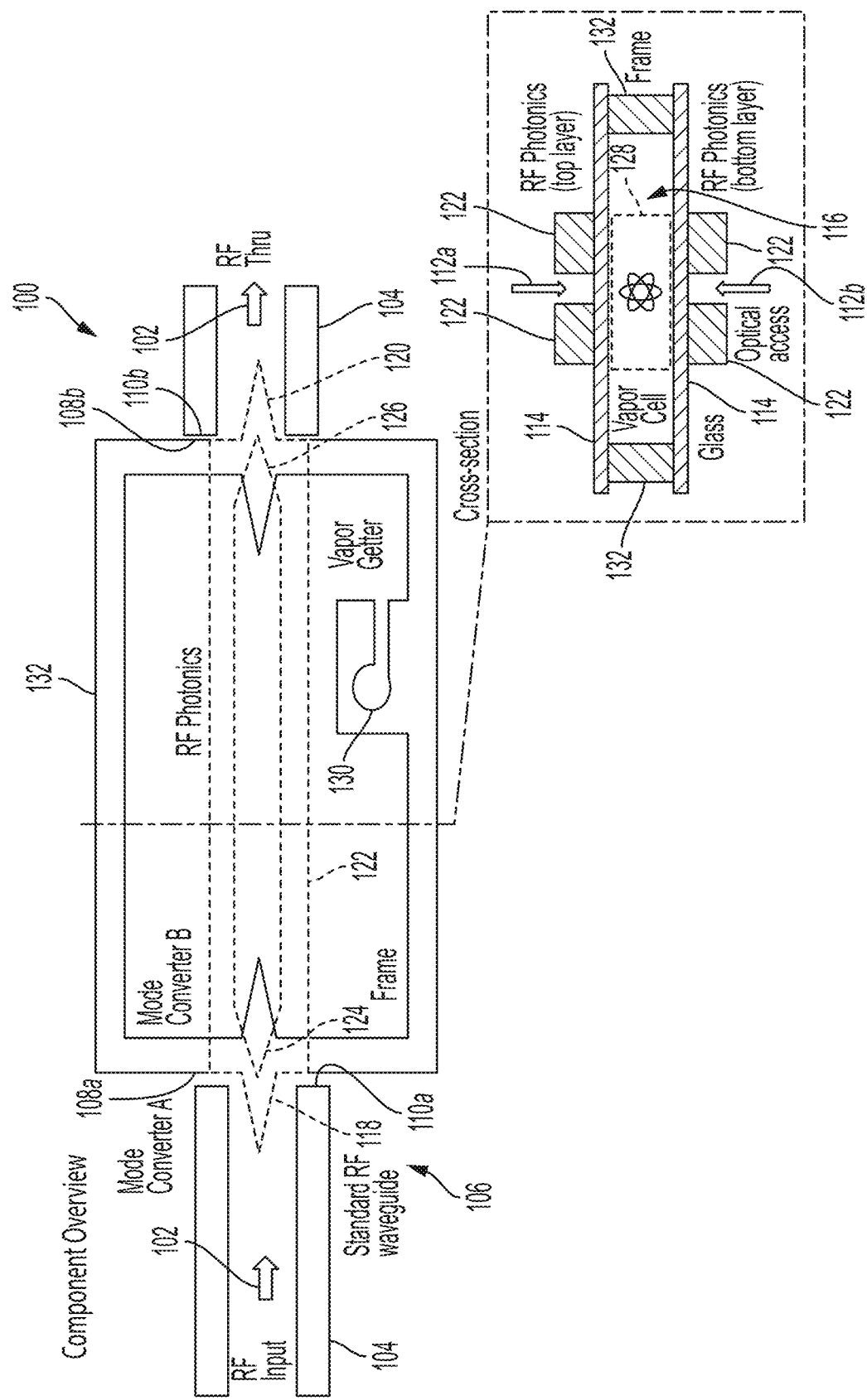
FIG. 1A is a schematic diagram, in top and cross-section view, an example RF measurement device.

In a general aspect, radio-frequency (RF) measurement devices can be coupled to an RF waveguide to measure an RF electromagnetic field. The RF waveguide may be part of an RF circuit, and the RF electromagnetic field may result from an RF electromagnetic wave that propagates along the RF circuit to traverse the RF waveguide. The RF measurement devices may include features such as a vapor cell, first and second RF mode converters, and an RF photonic waveguide to measure properties of the RF electromagnetic field. In certain cases, the RF measurement devices may be configured to couple to the RF waveguide along an RF pathway (e.g., a linear RF pathway), thereby serving as in-line devices. In some implementations, the RF measurement device can be configured to measure RF electromagnetic waves in a range of RF frequencies; the range of RF frequencies may include a target frequency or a target frequency range. Generally, RF frequencies range from about 100 MHz to 1 THz.

For example, an RF measurement device may include a vapor cell whose vapor (e.g., a gas of Rydberg atoms or molecules) can interact with an RF electromagnetic field. The RF measurement device may, in some instances, be constructed using silicon photonics and include an RF photonic waveguide. In these instances, the RF measurement device is configured to transform an RF electromagnetic wave propagating along the RF photonic waveguide into a desired form. The desired form may occur in an interaction region of the vapor cell, where the vapor is located for sensing the RF electromagnetic wave via Rydberg electrometry. The silicon photonic construction may allow the vapor cell to be placed in line with the RF photonic waveguide (e.g., adjacent to) so that the vapor cell does not perturb (or minimally perturbs) the propagation of the RF electromagnetic wave along the RF photonic waveguide. The silicon photonic construction may also provide advantages over configurations where the RF waveguide itself includes the vapor (e.g., filled with vapor), which in certain applications, can be impractical.

In some implementations, the RF measurement device includes a first standard RF waveguide flange that is configured to couple to a mating flange of an RF circuit, which may be conventional RF waveguide device (e.g., an RF waveguide). The RF measurement device may also include a first mode converter that converts a mode of the RF electromagnetic wave from an RF circuit mode to an RF photonic waveguide mode. This conversion may happen as the RF electromagnetic wave travels towards an interaction region in the vapor cell (e.g., enters the RF measurement device). The first mode converter may be aligned with the first standard RF waveguide flange and the RF photonic waveguide. Moreover, the first mode converter may be defined by silicon photonic structures. In some cases, the RF photonic waveguide mode may have close to uniform power in the interaction region of the vapor cell. In these cases, light (e.g., laser light) can interact with vapor in the interaction region while the RF electromagnetic wave—which is in the RF photonic waveguide mode—also interacts with the vapor. The RF measurement device can thus sense properties of the RF electromagnetic wave, with the light operable to optically read out its properties from the RF measurement device. The properties of the RF electromagnetic wave can include properties such as a field amplitude (e.g., electric, magnetic, etc.), a frequency, a phase, or a polarization. In certain cases, the power profile in the interaction region may be non-uniform (e.g., parabolic).

The RF measurement device may also include a second mode converter that allows the RF electromagnetic wave to exit the RF measurement device and re-enter the RF circuit. The second mode converter is configured to convert the mode of the RF electromagnetic wave from the RF photonic waveguide mode back to the RF circuit mode. As such, and after the RF electromagnetic wave passes through the interaction region, its mode is converted from the RF photonic waveguide mode back to the RF circuit mode using the second mode converter. The RF electromagnetic wave then travels down a section of the RF photonic waveguide to a second standard RF waveguide flange of the RF measurement device that can be used to couple the RF electromagnetic wave back into the RF circuit.

In some implementations, the walls of the vapor cell can be modified to reduce losses (e.g., power or intensity losses) at an interface between the vapor cell and one or both of the first and second mode converters. For example, the vapor cell may include walls that are configured as metamaterial walls. Such configurations are described further in relation to FIGS. 8A-8B and 9A-9B. In these implementations, the overall loss of the RF measurement device can be reduced, so that it is below, or approximately equal to, the loss of the RF circuit. As a consequence, the RF measurement device may be essentially lossless relative to the losses of the RF circuit. In some implementations, the RF measurement device is configured to measure the properties of two counter-propagating RF electromagnetic waves. By changing the polarization of the light beams, using the correct electronic transitions of the vapor, and engineering a configuration of the RF photonic waveguide (e.g., engineering its silicon photonic structure), the two waves can be separated from each other and their properties measured. The measurement of one wave may occur independently of the other.

In some implementations, a laser and signal processing system can be used to read-out multiple instances of the RF measurement device in a radio frequency setup. The RF measurement device has advantages over conventional methods such as diode detectors since it is non-destructive. The power is transmitted through the device after a measurement; thus, the radio frequency field can be measured without interfering with the setup, or apparatus, and its intended purpose. In addition, the RF measurement device can also be self-calibrated, is more stable, and in certain cases, can have a broad carrier bandwidth. The same laser and signal processing system can be used for multiple sensors simultaneously (as mentioned), or for multiple systems with different sensors operating at different frequencies, ranging from several GHz-above 100 GHz. The sensors can be tailored to a specific application. For example, a particular sensor can be designed for high sensitivity at a specific frequency.

In many radio frequency (RF) applications, the properties of an RF electromagnetic wave (e.g., a power, a frequency, a phase, etc.) in an RF circuit needs to be determined. The RF circuit may be constructed from, or include, a waveguide structure. In conventional methods, a directional coupler may be used to tap a small amount of RF power from the RF circuit and direct it so that it interacts with a power meter (e.g., a diode detector). These methods can lead to loss in systems incorporating the RF circuit, can require additional components (e.g., the directional coupler), and are not self-calibrated. Moreover, the power meter must be calibrated to measure a real power, which is often tedious and expensive. The directional coupler may also need an independent calibration. If the power measurement is done at some point in the RF circuit and a directional coupler is not utilized, the RF circuit may first need to be disassembled and then reassembled after the measurement is completed, which can be particularly problematic at higher RF frequencies, as much of the loss can occur at the waveguide junctions. Furthermore, re-attaching the sections of the RF circuit (e.g., a waveguide structure) can lead to errors and consequently inaccurate measurements.

In some implementations, the RF measurement devices described herein may provide technical improvements, which can include, for example, overcoming the disadvantages of certain conventional methods. For example, an RF measurement device may be configured as a special in-line power measurement device. This device may adopt Rydberg electrometry to measure the properties of an RF electromagnetic wave propagating in the RF circuit. The Rydberg electrometry may be based on a vapor that includes Rydberg atoms or molecules. Rydberg electrometry is self-calibrated since the measurement can be linked to the electronic transitions of the Rydberg atoms or molecules used for sensing as well as Planck's constant. The vapor cell containing the vapor of Rydberg atoms or molecules is minimally perturbative of the RF electromagnetic field, since very little RF power is scattered from the Rydberg atoms or molecules. The vapor cell can also be made highly transparent to the RF electromagnetic wave. The carrier bandwidth can be broad, and although individual RF measurement devices can be tailored to narrow bandwidths, the laser and signal processing system can be optically coupled to multiple instances of the RF measurement device, including those designed for different RF carrier frequencies, (e.g., those outside the bandwidth of a particular RF measurement device). This advantage allows a user to place multiple RF measurement devices in the RF circuit or to simply change the device connections to change to another RF circuit using the same laser and signal processing system. The self-calibration, broad carrier bandwidth, flexibility, and minimal perturbation of the RF electromagnetic wave or its fields can make the performance of the RF measurement device superior to conventional power meters, such as diode detectors.

Figure 1B:
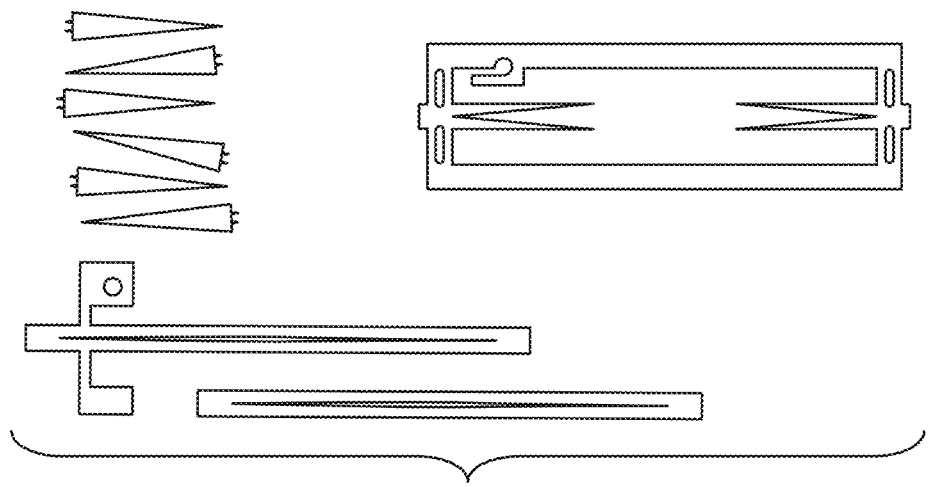
FIG. 1B is a schematic diagram, in top view, of example components of the example RF measurement device of FIG. 1A.
Figure 1C:
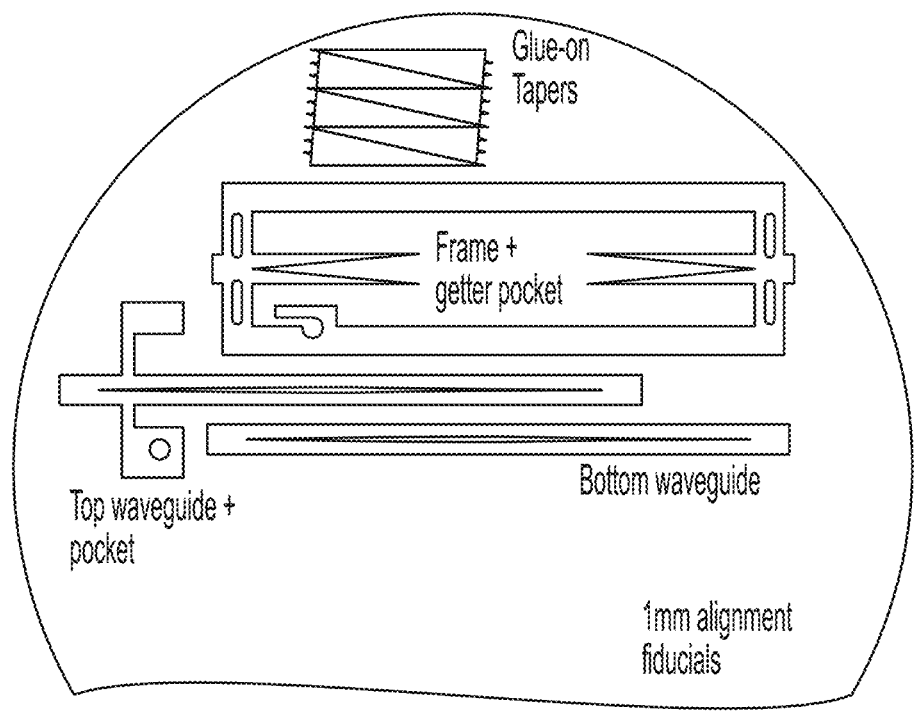
FIG. 1C is a schematic diagram, in top view, of an outline of the example components of FIG. 1B on a surface of a wafer.
Figure 1D:
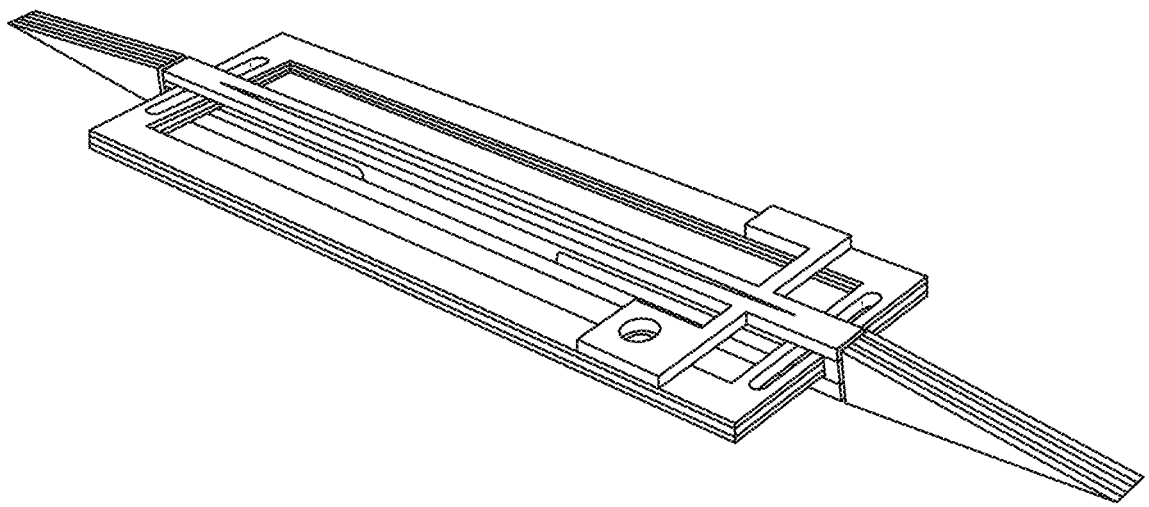
FIG. 1D is a schematic diagram, in perspective view, of the example components of FIG. 1B assembled into the example RF measurement device of FIG. 1A.

FIG. 1A presents a schematic diagram, in top and cross-section view, an example RF measurement device 100. The example RF measurement device 100 may utilize Rydberg-based sensing to measure RF electromagnetic waves or field components thereof (e.g., electric field components, magnetic field components, etc.). For instance, an RF electromagnetic wave measured by the RF measurement device 100 may include all or part of an RF pulse or any other type of RF signal. In the example shown in FIG. 1A, the RF measurement device 100 measures an RF electromagnetic wave 102 propagating in an RF waveguide 104 of an RF circuit 106. In certain cases, the example RF measurement device may include one or more components formed (e.g., laser cut) out of a wafer, such as a silicon wafer or a glass wafer. FIG. 1B presents a schematic diagram, in top view, of example components of the example RF measurement device 100. The example components may include mode converters (e.g., glue-on tapered components), a frame with an internal cavity to assist in defining a vapor cell (e.g., a frame with a getter pocket), and an RF waveguide (e.g., a top waveguide with a pocket, a bottom waveguide, etc.). Other components are possible (e.g., window plates). FIG. 1C presents a schematic diagram, in top view, of an outline of the example components of FIG. 1B on the surface of a wafer. The outline may define a cutting path for a laser to cut the example components out of the wafer. FIG. 1D presents a schematic diagram, in perspective view, of the example components of FIG. 1B assembled into the example RF measurement device 100. In certain cases, the components shown in FIGS. 1B-1D may be formed of silicon and their assembly may define a silicon photonic construction for the example RF measurement device 100.

In some implementations, such as shown in FIG. 1A, the example RF measurement device 100 is inserted into the RF waveguide 104 of the RF circuit 106 by fixing a first flange 108a of the example RF measurement device 100 to a first flange 110a of the RF circuit 106 where the power is to be measured. The power may be based on an electric field component of the RF electromagnetic wave 102, a magnetic field component of the RF electromagnetic wave 102, or both. A second flange 108b of the example RF measurement device 100 is then attached to a second flange 110b of the RF circuit 106, which may place the example RF measurement device 100 in line with the RF circuit 106. The second flange 110b of the RF circuit 106 may be downstream of the first flange 110a, relative to a propagation direction of the RF electromagnetic wave 102. However, in certain cases, the second flange 110b is upstream of the first flange 110a, relative to the propagation direction of the RF electromagnetic wave 102. In operation, laser light 112 is transmitted to the example RF measurement device 100 via an optical fiber or directly to an optical window 114 of the example RF measurement device 100. The optical window 114 may be formed of glass (e.g., a borosilicate glass, fused silica, etc.). The laser light 112 travels through the optical window 114 and interacts with a vapor (e.g., a gas of Rydberg atoms or molecules) in the vapor cell 116 to measure the properties of the RF electromagnetic wave 102 (e.g., an electric field strength or amplitude). In cases where the vapor includes a gas of Rydberg atoms, this measurement may occur via the techniques of Rydberg atom electrometry. Examples of such measurements are described in U.S. Pat. No. 10,509,065 entitled "Imaging of Electromagnetic Fields."

After the laser light 112 has interacted with the vapor, the laser light 112 can traverse the vapor cell 116 to be captured in an optical fiber or an optical detector (e.g., a photodiode). In FIG. 1A, the laser light 112 includes first and second input optical signals 112a, 112b (e.g., probe and coupling optical signals) that traverse the vapor cell 116 along counter-propagating directions. This traversal may allow the laser light 112 to serve as the basis for an output optical signal (not shown) that can represent the properties of the RF electromagnetic wave 102. However, in certain cases, the laser light 112 may include more than two input optical signals (e.g., three), and the optical pathway of the laser light 112 may be different than shown in FIG. 1A. The optical detector can generate a detector signal in response to receiving the output optical signal from the example RF measurement device 100. The detector signal carries information about the RF electromagnetic wave 102 (e.g., its properties) and can be transported to a signal processing system via an electrical cable, an optical fiber, and so forth. The signal processing system may be located where a laser and its control system are positioned. In some variations, the signal processing system may be a part of the laser and its control system. The optical signals can have one or more optical frequencies, which can range from about 5 THz to about 2500 THz.

In some implementations, the example RF measurement device 100 includes respective mode converters 118, 120 for receiving and discharging the RF electromagnetic wave 102. For example, the mode converters 118, 120 may include a first mode converter 118 for receiving the RF electromagnetic wave 102 from the RF waveguide 104 of the RF circuit 106. The first mode converter 118 may be configured to convert a mode of the RF electromagnetic wave 102 from a first waveguide mode to a second waveguide mode. The first waveguide mode may correspond to the mode of the RF electromagnetic wave 102 when traveling along the RF waveguide 104, and the second waveguide mode may correspond to the mode of the RF electromagnetic wave 102 when traveling along the example RF measurement device 100 (e.g., along an RF waveguide therein). The mode converters 118, 120 may also include a second mode converter 120 for discharging the RF electromagnetic wave 102 back to the RF waveguide 104 of the RF circuit 106. The second mode converter 120 may be configured to convert the mode of the RF electromagnetic wave 102 from the second waveguide mode back to the second waveguide mode. In converting the mode of RF electromagnetic wave 102, the mode converters 118, 120 may reduce or eliminate losses, such as power or intensity losses, as the RF electromagnetic wave 102 travels through the example RF measurement device 100. However, the mode converters 118, 120 may include other features to reduce or eliminate losses (e.g., a pattern of holes). Such features are described further in relation to FIGS. 7-9B. In some variations, the mode converters 118, 120 and the vapor cell 116 are encased in a housing (e.g., a shell) to protect them. The housing can be, for example, a 3D-printed dielectric structure, a metal box, a metal tube, or a plastic tube.

In some implementations, the example RF measurement device includes an RF waveguide 122 that may be positioned adjacent to or around the vapor cell 116. For example, the RF waveguide 122 may include top and bottom portions that straddle the vapor cell 116 in the middle of the example RF measurement device 100. In some variations, the RF waveguide 122 includes portions 124, 126 that assist the mode converters 118, 120 in converting the mode of the RF electromagnetic wave 102. For example, the RF waveguide 122 may include a first portion 124 adjacent to the first mode converter 118 to assist the first mode converter 118 in converting the mode of the RF electromagnetic wave 102 from the first RF waveguide mode to the second RF waveguide mode. The RF waveguide 122 may also include a second portion 126 adjacent to the second mode converter 120 to assist the second mode converter 120 in converting the mode of the RF electromagnetic wave 102 back to the first RF waveguide mode from the second RF waveguide mode. In certain configurations, the RF waveguide 122 includes a photonic structure for altering a profile of the RF electromagnetic wave 102 as it travels along the RF waveguide. The photonic structure may be integral to the RF waveguide 122. For example, the photonic structure may be configured to create a target RF profile in an interaction region 128 of the vapor where the optical measurements are conducted. Examples of the target RF profile include a uniform electric field intensity and a parabolic electric field intensity.

In operation, the RF electromagnetic wave 102 travels along the RF waveguide 104 of the RF circuit 106 and is received by the first mode converter 118 to be mode converted from the first waveguide mode to the second waveguide mode. The RF electromagnetic wave 102 then propagates along the RF waveguide 122, which is designed around the vapor cell 116. Inside the vapor cell 116, the profile of the RF electromagnetic wave 102 is altered to match a target RF profile in the interaction region 128. In FIG. 1A, the target RF profile is a uniform electric field intensity. However, other profiles are possible (e.g., magnetic, polarization, non-uniform intensities, etc.). The laser light 112 is passed through the vapor cell 116 to optically read-out the properties of the RF electromagnetic wave 102. The vapor cell 116 can be filled with a vapor, such as a gas of alkali atoms (e.g., a gas of cesium atoms, a gas of rubidium atoms, etc.). This filling can be done directly with an alkali metal, or in some variations, a chemical reaction can be used. For example, in FIG. 1A, the example RF measurement device 100 includes a getter chamber 130 for holding a getter material capable of releasing the gas of alkali atoms in response to receiving an energetic stimulus (e.g., in response to heat, light, etc.).

As the RF electromagnetic wave 102 traverses the example RF measurement device 100, the RF electromagnetic wave 102 may experience little to no losses (e.g., little to no power or intensity losses). For example, the losses may be equal to or below the losses experienced by the RF electromagnetic wave 102 in the RF waveguide 104 of the RF circuit 106. Such minimal losses may result from the dielectric materials used to construct the example RF measurement device 100 (e.g., silicon, glass, etc.). The minimal losses may also result from a configuration of the example RF measurement device 100. For example, in some configurations, the mode converters 118, 120 have a tapered shape. In some configurations, a perimeter wall 132 surrounding the vapor cell 116 includes a pattern of holes adjacent the mode converters 118, 120.

The example RF measurement device 100 may include other advantages. For example, the vapor cell 116 may allow the example RF measurement device 100 to conduct self-calibrated measurements. Such self-calibrated operation may result from the electronic transitions of the vapor (e.g., Rydberg electronic transitions), which can serve as accurate energy and frequency references for laser light. The example RF measurement device 100 may also be configured to allow in-line measurements of RF electromagnetic fields at multiple points in the RF circuit 106, including simultaneous in-line measurements (e.g., with multiple instances of the example RF measurement device 100). The example RF measurement device 100 can also have a broad carrier bandwidth, and the laser control and signal processing system can be used with different variants of the device 100, including over-the-air variants for wireless communication applications as well as variants specialized for different frequencies, bandwidths, and losses. Moreover, the configuration of the mode converters 118, 120 and the RF waveguide 122 can be modified for different applications, such as for small signals versus a uniform readout.

In some implementations, the example RF measurement device 100 is useful to RF engineers for monitoring complex circuit performance, especially in test and measurement environments. The example device 100 can also be useful for monitoring RF properties within radar systems and communications systems, such as for optimizing performance and proactively predicting equipment failures. Remote monitoring is possible since the laser light 112 used for the preparation and read-out of the vapor can be transported over large distances via fiber optic cable. The laser light 112 may carry information about the RF electromagnetic wave 102 and can be remotely processed at the location of the laser and signal processing system.

In some implementations, the example RF measurement device 100 is configured to measure the RF electromagnetic wave 102 as it travels through a waveguide circuit, such as the RF waveguide 104 of the RF circuit 106. In conventional methods, such as those relying on diode detectors, such measurements are destructive and can result in losses to the RF electromagnetic wave 102. However, in many variations, the example RF measurement device 100 is configured to make non-destructive measurements. In these variations, the vapor in the vapor cell 116 may include a gas or vapor of Rydberg atoms (e.g., Group IA atoms such as Cs or Rb) or molecules (e.g., 12). Because Rydberg electrometry is self-calibrated, it is also possible to conduct metrologically relevant measurements with example RF measurement device 100. Moreover, the RF electromagnetic transparency of example RF measurement device 100 can be increased to a level that is comparable to a standard section of the waveguide circuit. The broad carrier bandwidth allowed by the Rydberg atoms or molecules can make it possible to construct a wide range of RF measurement devices that meet specialized needs without having to purchase multiple laser and signal processing systems. Multiple, non-destructive measurements can then be made by putting multiple RF measurement devices in the waveguide circuit. These devices can share the same laser and control system for signal processing. In these implementations, the example RF measurement device 100 can be useful for test and measurement as well as for monitoring of RF circuits that use waveguides.

Figure 2A:
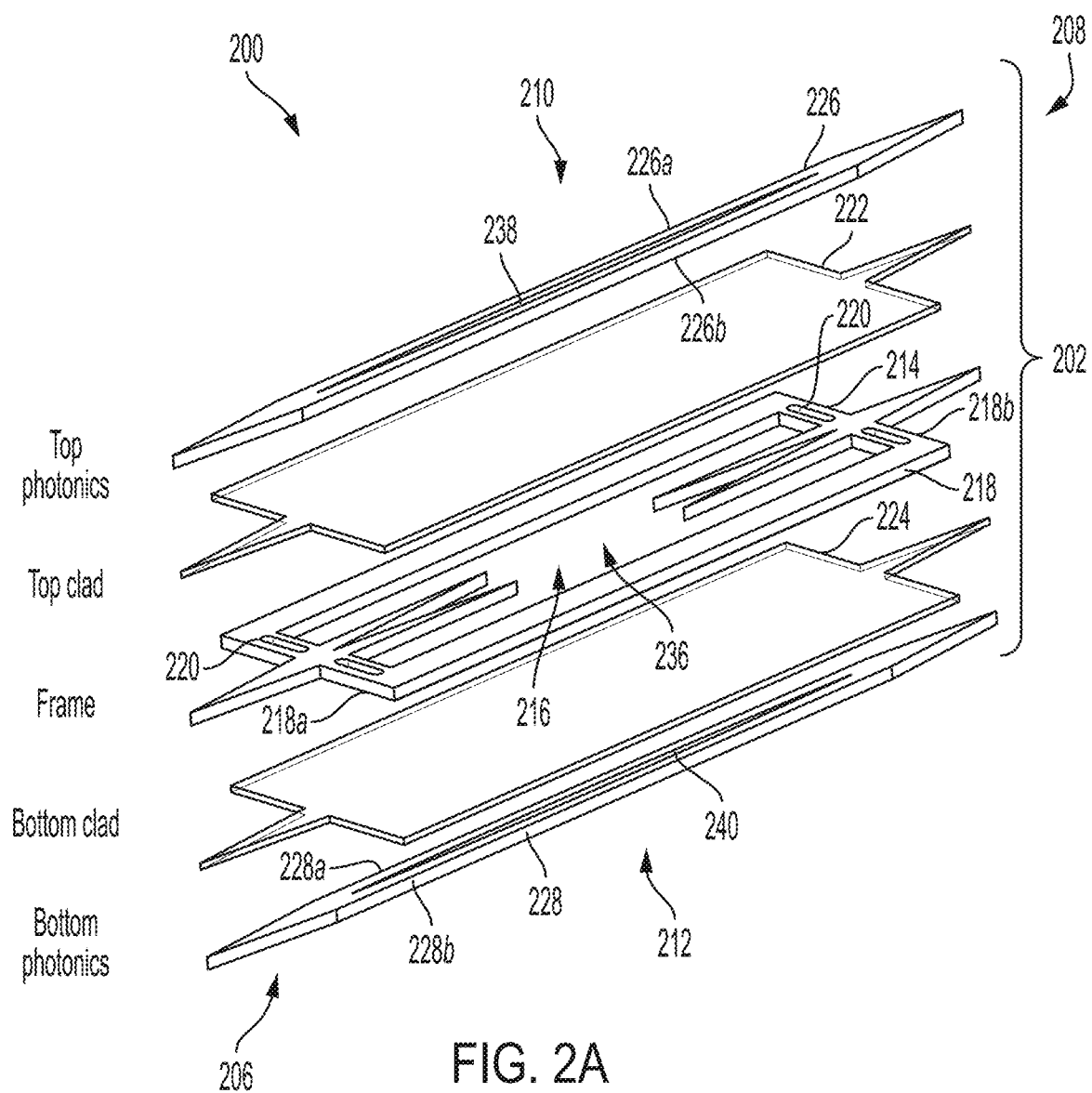
FIG. 2A is a schematic diagram, in exploded view, of an example RF measurement device.
Figure 2B:
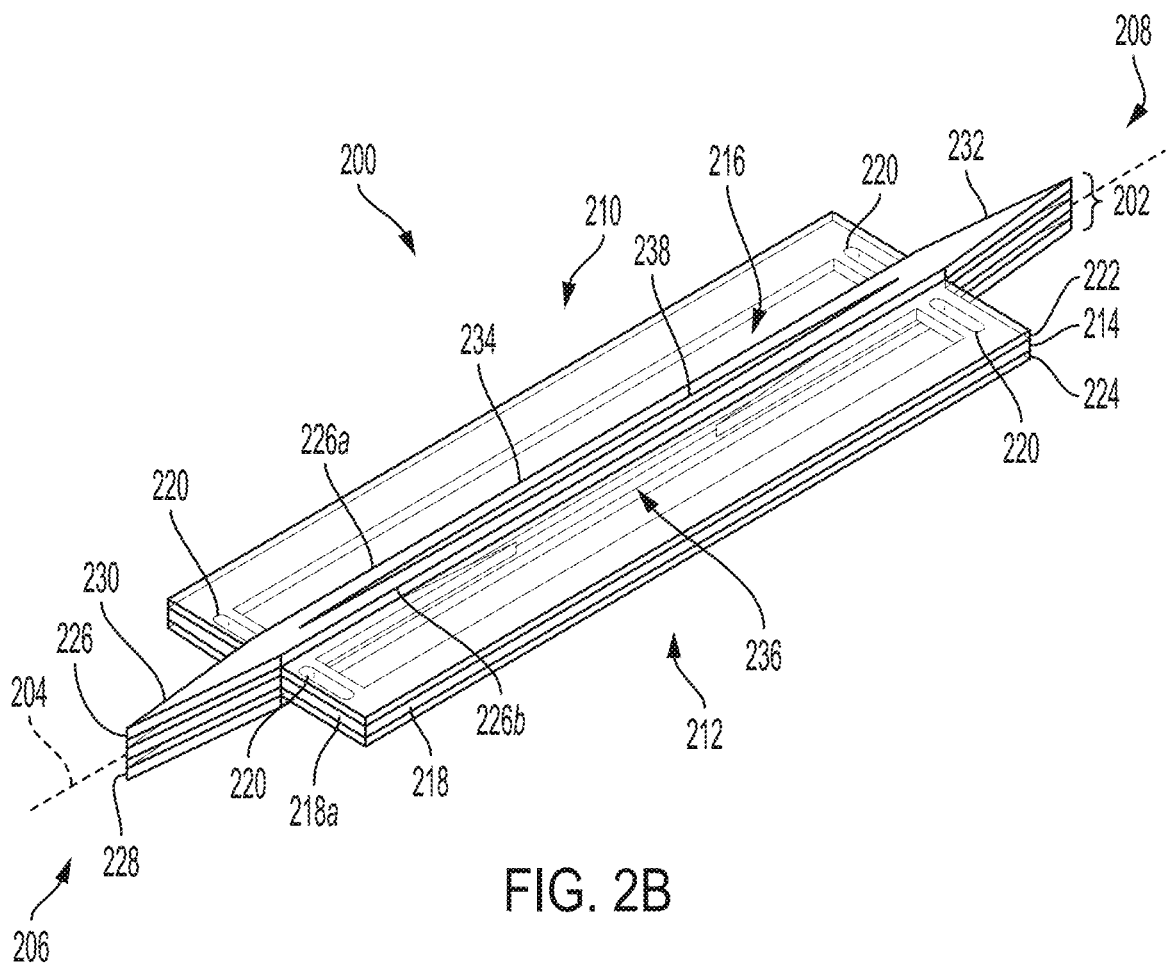
FIG. 2B is a schematic diagram, in a first perspective view, of the example RF measurement device of FIG. 2A.
Figure 2C:
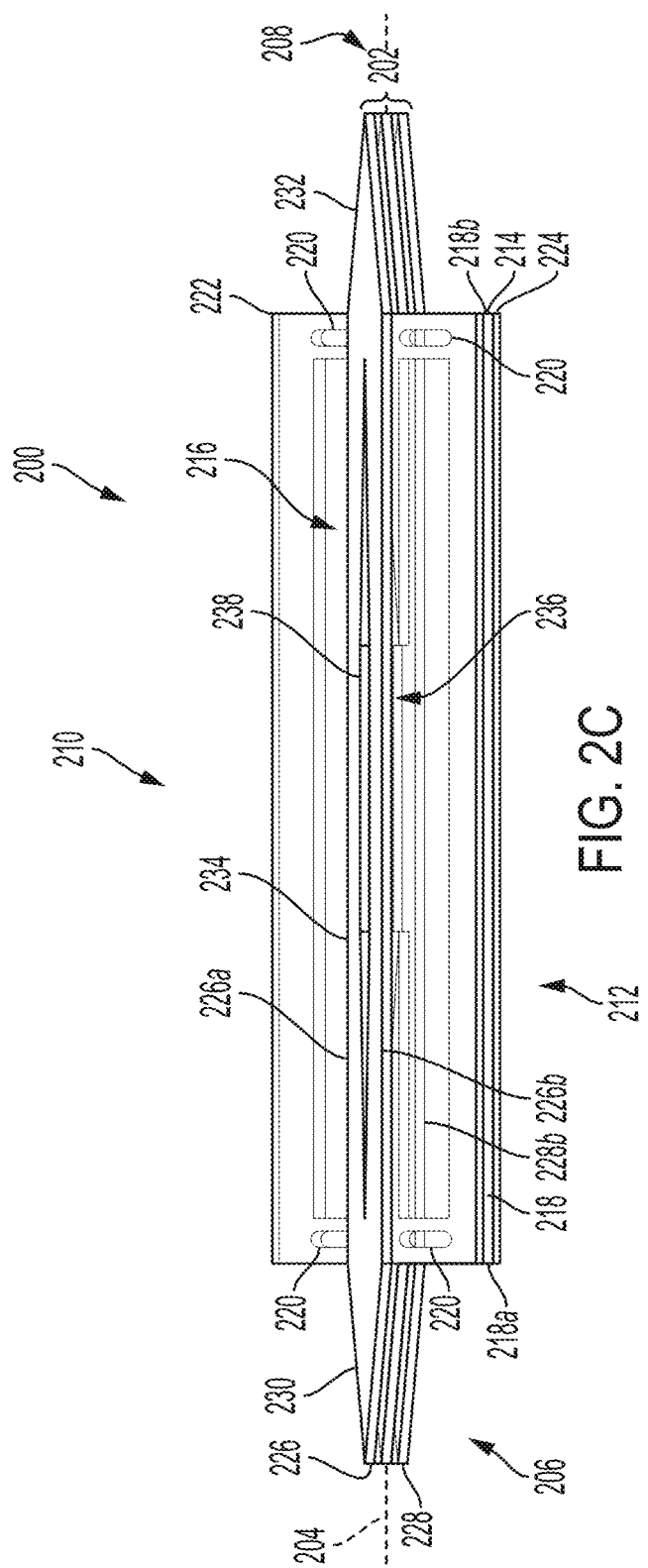
FIG. 2C is a schematic diagram, in a second perspective view, of the example RF measurement device of FIG. 2A.
Figure 2D:
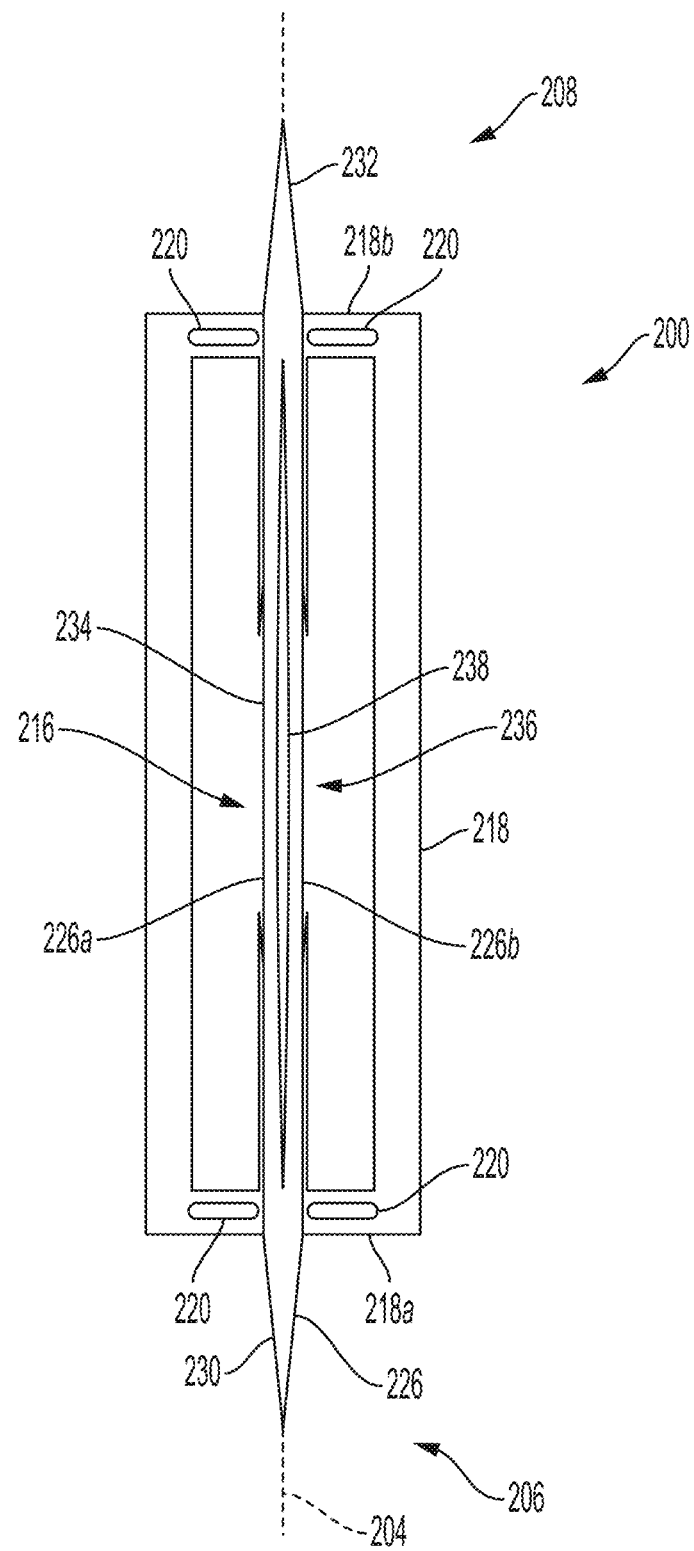
FIG. 2D is a schematic diagram, in top view, of the example RF measurement device of FIG. 2A.

FIG. 2A presents a schematic diagram, in exploded view, of an example RF measurement device 200. FIGS. 2B-2C present respective schematic diagrams, in perspective view, of the example RF measurement device 200 of FIG. 2A, and FIG. 2D presents a schematic diagram, in top view, of the example measurement device 200 of FIG. 2A. The example RF measurement device 200 may be analogous to the example RF measurement device 100 described in relation to FIGS. 1A-1D.

The example RF measurement device 200 includes a dielectric body 202 that extends along an axis 204 between first and second ends 206, 208 and has first and second sides 210, 212 that flank the axis 204 (or its length). The first and second sides 210, 212 may correspond to opposite sides of the dielectric body 202, such as top and bottom sides. In some variations, the dielectric body 202 includes a frame portion 214 defined by a substrate that has opposing planar surfaces. However, other configurations are possible for the dielectric body 202. In these variations, the frame portion 214 includes an internal cavity 216 that extends along the axis 204 between the first and second ends 206, 208. In the example shown in FIGS. 2A-2D, the internal cavity 216 is bounded by internal surfaces of the dielectric body 202, including internal surfaces of a perimeter wall 218, and internal surfaces of first and second window portions 222, 224. The perimeter wall 218 surrounds a perimeter of the internal cavity 216 and includes first and second wall portions 218a, 218b at, respectively, the first and second ends 206, 208. The first and second wall portions 218a, 218b may bound a length of the internal cavity 216 along the axis 204. The first and second wall portions 218a, 218b may also include a pattern of holes 220 that, in certain variations, are configured to improve the transmission of an RF electromagnetic wave through example RF measurement device 200. Examples of the pattern of holes 220 are described further in relation to FIGS. 7-9B.

The frame portion 214 may be formed of a dielectric material that is transparent to fields (e.g., an electric field, a magnetic field, etc.) measured by example RF measurement device 200. The dielectric material may be an insulating material having a high resistivity, e.g., $\rho > 10^8$ $\Omega \cdot$cm, and may also correspond to a single crystal, a polycrystalline ceramic, or an amorphous glass. For example, the frame portion 214 may be formed of silicon. In another example, the frame portion 214 may be formed of a glass that includes silicon oxide (e.g., $SiO_2$, $SiO_x$, etc.), such as vitreous silica, a borosilicate glass, or an aluminosilicate glass. In some instances, the material of the frame portion 214 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In other instances, the material of the frame portion 214 is a non-oxide material such as silicon (Si), diamond (C), gallium nitride (GaN), calcium fluoride (CaF), and so forth. In these instances, an adhesion layer may be disposed on the frame portion 214, such as on the opposing planar surfaces of the frame portion 214. The adhesion layer may be capable of bonding to the non-oxide material of the frame portion 214 while also being capable of forming a contact bond with a window portion of the dielectric body 202 (or material thereof). For example, the frame portion 214 may be formed of silicon and the example RF measurement device 200 may include an adhesion layer that includes silicon oxide (e.g., $SiO_2$, $SiO_x$, etc.) on the opposing planar surfaces of the frame portion 214. This adhesion layer may define a bonding surface for the frame portion 214 and is capable of bonding to a window portion that is formed of a silicon oxide material (e.g., vitreous silica, a borosilicate glass, or an aluminosilicate glass, etc.). Examples of adhesion layers and their bonding processes are described in U.S. Pat. No. 10,859,981 entitled "Vapor Cells Having One or More Optical Windows Bonded To A Dielectric Body."

The dielectric body 202 also includes first and second window portions 222, 224 bonded to the frame portion 214 on, respectively, the first and second sides 210, 212 of the dielectric body 202. Such bonding may allow the first and second window portions 222, 224 to seal a vapor or a source of the vapor in the internal cavity 216, thereby integrating a vapor cell into the example RF measurement device 200. In some instances, the first window portion 222 or the second window portion 224 may be an integral part of the dielectric body 202.

The vapor may include a gas of Rydberg atoms, a gas of Rydberg molecules, or both. Examples of Rydberg atoms include alkali-metal atoms (e.g., from Group IA of the periodic table). Examples of Ryberg molecules include halogen molecules (e.g., from Group VIIA of the periodic table). Other Rydberg atoms and molecules are possible. In some variations, the vapor includes constituents such as a gas of alkali-metal atoms, a noble gas, a gas of diatomic halogen molecules, a gas of organic molecules, or some combination thereof. For example, the vapor may include a gas of alkali-metal atoms (e.g., Na, K, Rb, Cs, etc.), a noble gas (e.g., He, Ne, Ar, Kr, etc.), or both. As another example, the vapor may include a gas of diatomic halogen molecules (e.g., $F_2$, $Cl_2$, $Br_2$, $I_2$, etc.), a noble gas, or both. In still another example, the vapor includes a gas of organic molecules (e.g., acetylene), a noble gas, or both. Other combinations are possible for the vapor, including different constituents.

The first and second window portions 222, 224 may be formed of a dielectric material that is transparent to electromagnetic radiation (e.g., laser light) used to probe a vapor sealed within the internal cavity of the dielectric body 202. For example, the dielectric material of the window portions 222, 224 may be transparent to infrared wavelengths of electromagnetic radiation (e.g., 700-1000 nm), visible wavelengths of electromagnetic radiation (e.g., 400-7000 nm), or ultraviolet wavelengths of electromagnetic radiation (e.g., 10-400 nm). Moreover, the dielectric material of the window portions 222, 224 may be an insulating material having a high resistivity, e.g., $\rho > 10^8$ $\Omega \cdot cm$, and may also correspond to a single crystal, a polycrystalline ceramic, or an amorphous glass. For example, the dielectric material may include silicon oxide (e.g., $SiO_2$, $SiO_x$, etc.), such as found within quartz, vitreous silica, or a borosilicate glass. In another example, the dielectric material of the window portions 222, 224 may include aluminum oxide (e.g., $Al_2O_3$, $Al_xO_y$, etc.), such as found in sapphire or an aluminosilicate glass. In some instances, the dielectric material of the window portions 222, 224 is an oxide material such as magnesium oxide (e.g., MgO), aluminum oxide (e.g., $Al_2O_3$), silicon dioxide (e.g., $SiO_2$), titanium dioxide (e.g., $TiO_2$), zirconium dioxide, (e.g., $ZrO_2$), yttrium oxide (e.g., $Y_2O_3$), lanthanum oxide (e.g., $La_2O_3$), and so forth. The oxide material may be non-stoichiometric (e.g., $SiO_x$), and may also be a combination of one or more binary oxides (e.g., $Y:ZrO_2$, $LaAlO_3$, etc.). In other instances, the dielectric material of the window portions 222, 224 is a non-oxide material such as diamond (C), calcium fluoride (CaF), and so forth. Other materials are possible.

The dielectric body 202 additionally includes first and second longitudinal portions 226, 228 aligned with the axis 204 and disposed on, respectively, the first and second sides 210, 212 of the dielectric body 202. The first longitudinal portion 226 may be bonded to an exterior surface of the first window portion 222, and the second longitudinal portion 228 may be bonded to an exterior surface of the second window portion 224. Such bonding may occur in whole or in part along a length of each of the first and second longitudinal portions 226, 228.

In many implementations, the example RF measurement device 200 includes first and second mode converters 230, 232 that are defined by the dielectric body 202. For example, the first mode converter 230 may be defined by parts of the frame portion 214, the first and second window portions 222, 224, and the first and second longitudinal portions 226, 228 that are proximate the first end 206 of the dielectric body 202. Similarly, the second mode converter 232 may be defined by parts of the frame portion 214, the first and second window portions 222, 224, and the first and second longitudinal portions 226, 228 that are proximate the second end 208 of the dielectric body 202. In these implementations, each mode converter is configured to convert a mode of an RF electromagnetic wave between a first RF waveguide mode and a second RF waveguide mode. In some variations, the first and second mode converters 230, 232 are adiabatic mode converters. In these variations, the first and second mode converters 230, 232 may generate or absorb little to no heat when converting the mode of an RF electromagnetic wave between the first RF waveguide mode and the second RF waveguide mode.

In some implementations, the example RF measurement device 200 is configured to allow the RF electromagnetic wave to propagate bi-directionally along the axis 204. For instance, the example RF measurement device 200 may be associated with forward and reverse directions. The forward direction may extend along the axis 204 from the first end 206 to the second end 208, and the reverse direction may extend along the axis 204 from the second end 208 to the second end 206. As such, the first and second mode converters 230, 232 may be configured to mode convert the RF electromagnetic wave along both the forward and reverse directions. In these implementations, the example RF measurement device 200 may be able to measure a property of the RF electromagnetic wave (e.g., power, frequency, phase, polarization, etc.) independent of direction. Moreover, the example RF measurement device 200 may also be able to measure the properties of two counter-propagating RF electromagnetic waves. Such measurement may occur as the two counter-propagating RF electromagnetic waves traverse the example measurement device 200 simultaneously.

In some implementations, the example RF measurement device 200 is configured to allow the RF electromagnetic wave to propagate only unidirectionally along the axis 204. For example, the first and second mode converters 230, 232 may be configured to mode convert the RF electromagnetic wave only as it propagates along the forward direction and not the reverse direction. In certain cases, the first mode converter 230 may be an input mode converter, and the second mode converter 232 may be an output mode converter. The input mode converter may be configured to convert the first RF waveguide mode into the second RF waveguide mode as the RF electromagnetic wave propagates toward the internal cavity from an ambient of the example RF measurement device 200 (e.g., an RF waveguide of an RF circuit). The output mode converter may be configured to convert the second RF waveguide mode back into the first RF waveguide mode as the RF electromagnetic wave propagates away from the internal cavity to the ambient of the example RF measurement device 200.

In many implementations, the example RF measurement device 200 includes the internal cavity 216, which resides in the dielectric body 202 between the first and second mode converters 230, 232 and contains the vapor or the source of the vapor. The example RF measurement device 200 also includes an RF waveguide 234 that is defined by the dielectric body 202 and extends between the first and second mode converters 230, 232. For example, the RF waveguide 234 may be defined by the first and second longitudinal portions 226, 228 as well as a part of the frame portion 214 that is disposed along the axis 204. The RF waveguide 234 is configured to carry the second RF waveguide mode through the internal cavity 216. In some instances, such as shown in FIGS. 1A-1D, the RF waveguide 234 includes first and second portions that are part of or overlap with, respectively, the first and second mode converters 230, 232. In these instances, the RF waveguide 234 may assist the first and second mode converters 230, 232 in converting the mode of an RF electromagnetic wave between the first and second RF waveguide modes.

In some implementations, the first and second longitudinal portions 226, 228 of the example RF measurement device 200 are disposed on respective, opposite sides of the example RF measurement device 200 (e.g., the first and second sides 210, 212, respectively). In these implementations, the first and second longitudinal portions 226, 228 may also be configured to establish a target RF profile in an interaction region 236 of the internal cavity 216. For example, the first longitudinal portion 226 may have a first aperture therethrough, and the second longitudinal portion 228 may have a second aperture therethrough. An optical path may extend successively through the first aperture, the interaction region 236, and the second aperture. In this example, the first and second longitudinal portions 226, 228 may be configured to concentrate the field of an RF electromagnetic wave in the interaction region 236, thereby establishing a target RF profile that has a parabolic field intensity.

Figure 3A:
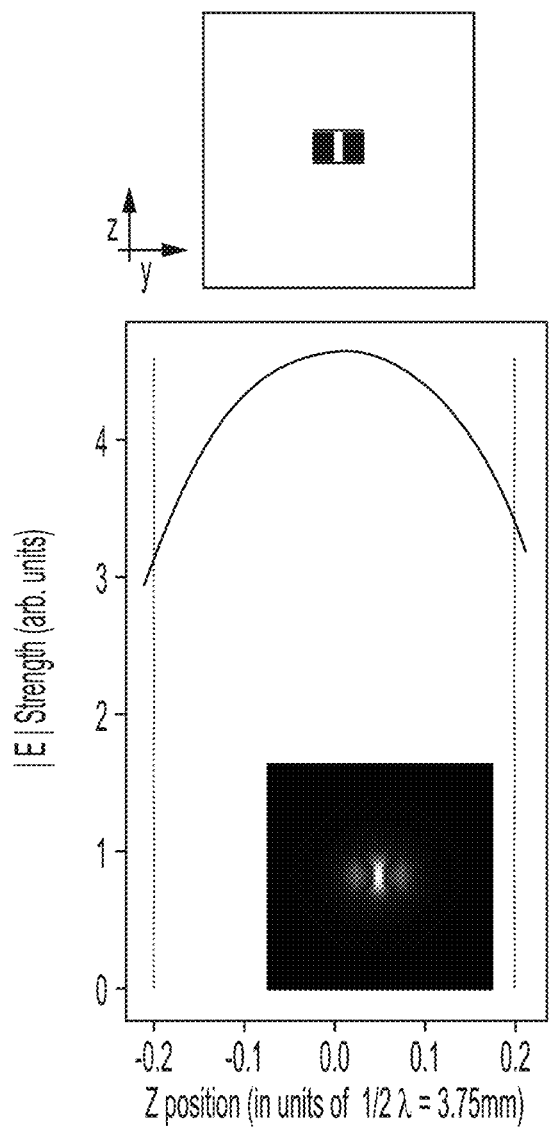
FIG. 3A is a graph showing an example target RF profile generated by a two-beam structural configuration of an RF waveguide.

FIG. 3A presents a graph showing an example target RF profile generated by a two-beam structural configuration of the RF waveguide 234. The graph is derived from a simulation of the example target RF profile. Here, the RF waveguide 234 may include the first and second longitudinal portions 226, 228 and their respective apertures. During operation, an RF electromagnetic wave may propagate along the RF waveguide 234 to interact with vapor in the interaction region 236. Concomitantly, laser light traverses the first and second apertures along the optical path to interact with vapor in the interaction region 236, thereby allowing the example RF measurement device 200 to measure properties of the RF electromagnetic wave (e.g., amplitude, phase, frequency, polarization, etc.). The two-beam configuration of the first and second longitudinal portions 226, 228 may be operational to concentrate a field of the RF electromagnetic wave in a mid-point of the interaction region 236. As such, the target RF profile may be a parabolic field intensity, such as the parabolic electric field intensity shown in the graph of FIG. 3A. It will be appreciated that, by amplifying a field intensity of the RF electromagnetic wave, the two-beam configuration may allow the example RF measurement device 200 to be useful in, for example, measuring small RF field amplitudes.

As another example, and as shown in FIGS. 2A-2D, the first longitudinal portion 226 may include a first pair of longitudinal bodies 226a, 226b that extend along a length of the first longitudinal portion 226. The first pair of longitudinal bodies 226a, 226b may straddle a first elongated aperture 238 through the first longitudinal portion 226. Similarly, the second longitudinal portion 228 may include a second pair of longitudinal bodies 228a, 228b that extend along a length of the second longitudinal portion 228. The second longitudinal portion 228 may straddle a second elongated aperture 240 through the second longitudinal portion 228. Moreover, an optical path may extend successively through the first elongated aperture 238, the interaction region 236, and the second elongated aperture 240. In this example, the first and second longitudinal portions 226, 228 may be configured to establish a target RF profile that has a uniform field intensity.

Figure 3B:
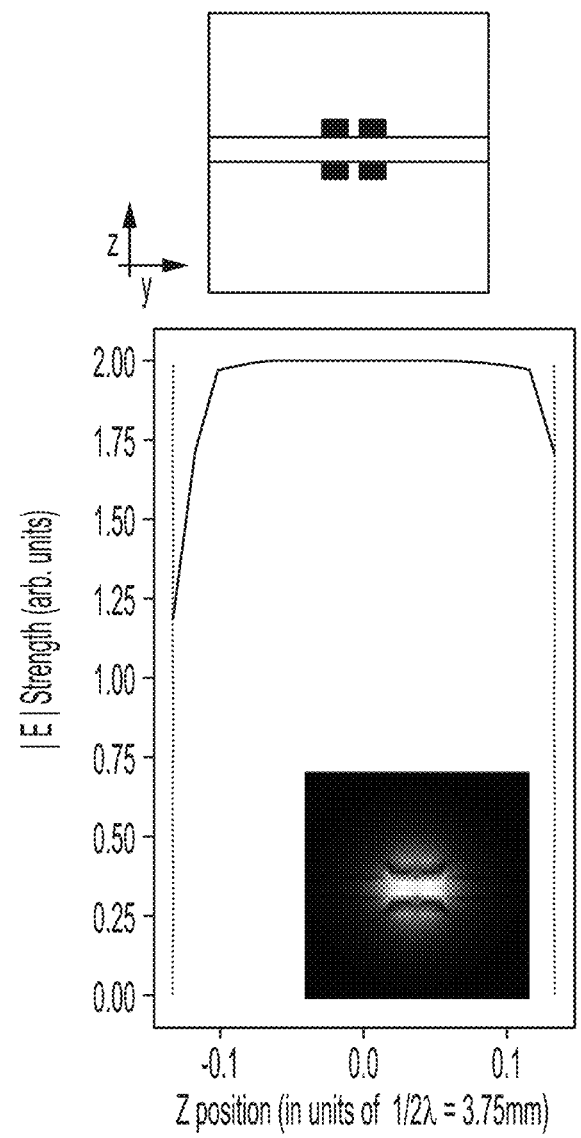
FIG. 3B is a graph showing an example target RF profile generated by a four-beam structural configuration of an RF waveguide.

FIG. 3B presents a graph showing an example target RF profile generated by a four-beam structural configuration of the RF waveguide 234. The graph is derived from a simulation of the example target RF profile. Here, the first and second longitudinal portions 226, 228 of the RF waveguide 234 may include respective pairs of longitudinal bodies, such as the first pair of longitudinal bodies 226a, 226b and the second pair of longitudinal bodies 228a, 228b. During operation, an RF electromagnetic wave may propagate along the RF waveguide 234 to interact with vapor in the interaction region 236. Concomitantly, laser light traverses the first and second elongated apertures 238, 240 along the optical path to interact with vapor in the interaction region 236. In this case, the four-beam configuration of the first and second longitudinal portions 226, 228 may be operational to establish a uniform field across the interaction region 236. As such, the target RF profile may be a uniform field intensity, such as the uniform electric field intensity shown in the graph of FIG. 3B.

In some implementations, the perimeter wall 218 surrounds, and forms part of the boundary of, the internal cavity 216 and passes through the first and second mode converters 230, 232. In these implementations, the internal cavity 216 may be an elongated internal cavity that extends along a cavity axis between first and second ends 206, 208 of the example RF measurement device 200. The cavity axis may, for example, be coincident with the axis 204 of the dielectric body 202. Moreover, the first and second mode converters 230, 232 may be aligned with the cavity axis and disposed at, respectively, the first and second ends 206, 208. In some variations, the first and second mode converters 230, 232 have respective exterior portions that protrude from the perimeter wall 218 on an exterior of the example RF measurement device 200. As shown in FIGS. 2A-2D, the exterior portions may taper along a direction parallel to the axis 204. Such tapering may be toward the exterior of the example RF measurement device 200. However, other configurations are possible. In some variations, the first and second mode converters 230, 232 may have respective interior portions that protrude from an interior of the perimeter wall 218 into the internal cavity 216. As shown in FIGS. 2A-2D, the interior portions may each split into a forked extension along a direction parallel to the axis 204 and into the internal cavity 216. In the examples shown in FIGS. 2A-2D, each forked extension includes two prongs, and each prong is tapered from a base to a tip. In these variations, the interior portions of the first and second mode converters 230, 232 may assist the RF waveguide 234 in establishing the target RF profile in an interaction region 236.

Figure 4:
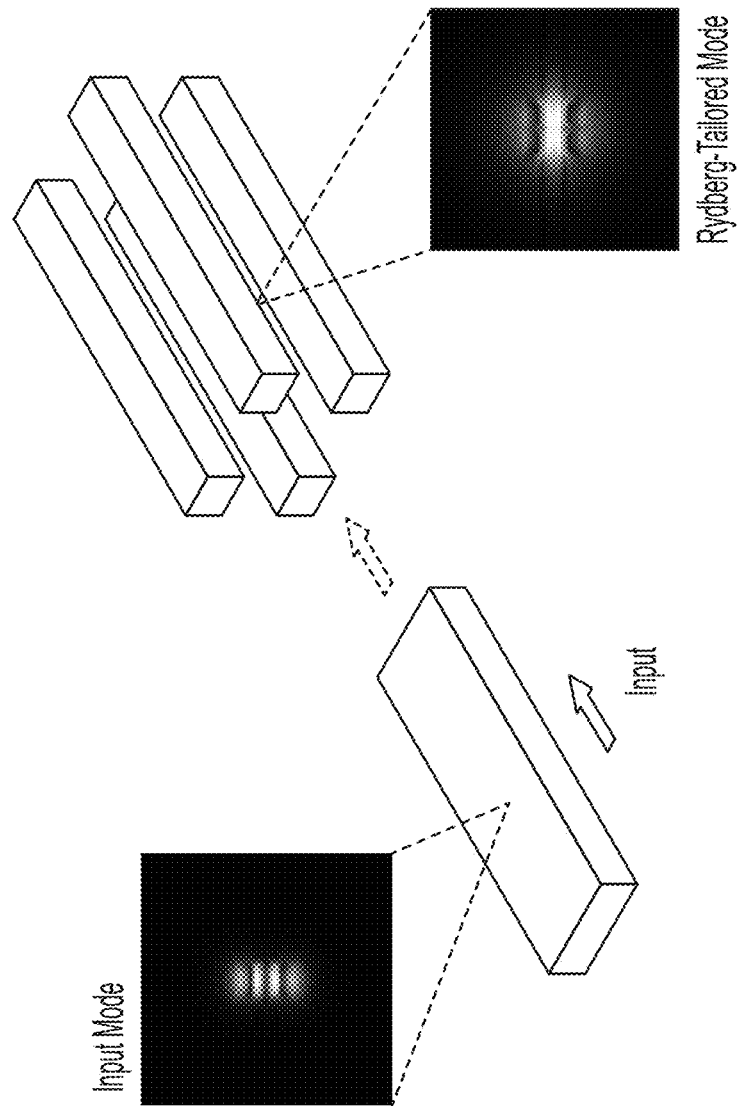
FIG. 4 is a schematic diagram showing an RF electromagnetic mode being converted between two example waveguide modes.

In some implementations, the example RF measurement device 200 is configured to use adiabatic mode conversion when converting the mode of the RF electromagnetic wave between the first and second waveguide modes. FIG. 4 presents a schematic diagram showing an RF electromagnetic mode being converted between two example waveguide modes. The first example waveguide mode (e.g., an input mode) may correspond to the waveguide mode of a conventional metal waveguide, and the second example waveguide mode may correspond to a silicon photonic waveguide mode (e.g., a Rydberg-tailored mode). It will be appreciated that an RF electromagnetic wave that travels in a waveguide may have a particular mode structure. The waveguide is designed so that this mode structure propagates along the waveguide with minimal loss. If the waveguide was altered to include a vapor cell, such as to measure properties of the RF electromagnetic wave, large losses and perturbations of the RF electromagnetic wave would result due to the structure of the vapor cell. Moreover, reflections could occur and any measurement would be heavily influenced by the mode structure of the overlap region between the laser light, the vapor, and the RF electromagnetic field. Further, the overlap region can have different field amplitudes and polarizations in different spatial locations. Such differences could lead to broadening of the spectral line shapes read out by the laser light since a distribution of RF electromagnetic properties are measured. The broadening and averaging of the spectra could lead to a loss in accuracy of the measured quantities, and the lasers sample different conditions as they pass through the vapor cell. However, the example RF measurement devices 200 allows the RF electromagnetic field structure along the RF waveguide 234 to be controlled (e.g., be uniform) and thus provides for a better measurement. Such control can be facilitated by adiabatically changing the mode of the RF electromagnetic wave between the first and second waveguide modes.

Figure 5:
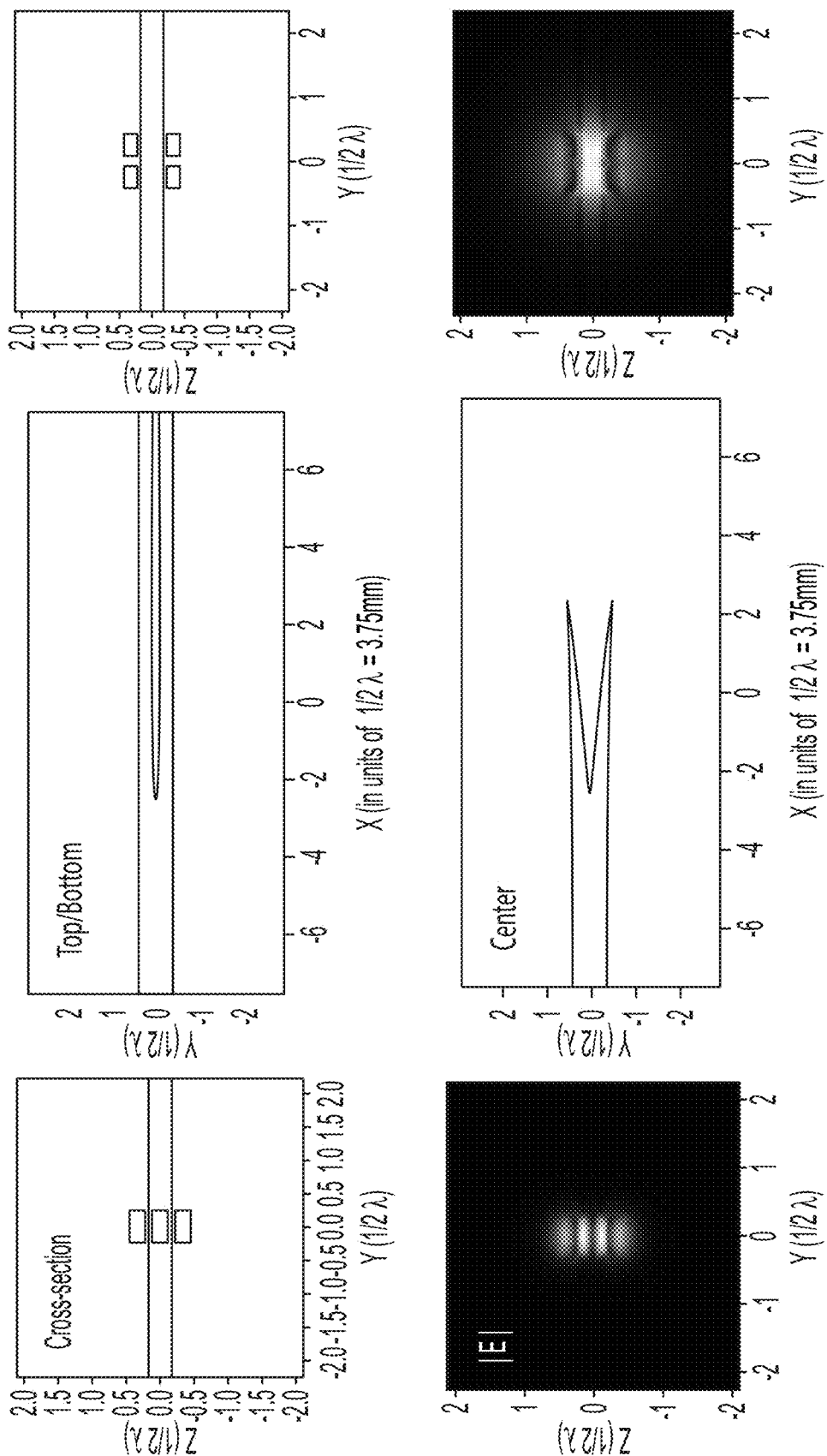
FIG. 5 is a series of graphs that show an example of adiabatic mode conversion.

FIG. 5 presents a series of graphs that show an example of adiabatic mode conversion. The series of graphs are derived from a simulation of the adiabatic mode conversion and may include cross-sectional, top, bottom, and center views of the example RF measurement device 200. The adiabatic mode conversion may result from a tapered structure of the first and second mode converters 230, 232, such as along their interior and exterior portions. For example, the apex of the exterior portions may gradually transition into the forked extension of the interior portions, thereby allowing the first and second mode converters 230, 232 to map a single-beam waveguide mode to a four-beam waveguide mode (and vice versa). This gradual mapping, which may be referred to as adiabatic tapering, may reduce or eliminate losses as an RF electromagnetic wave enters and leaves the example RF measurement device 200. For instance, by having a tapered configuration, the interior portions may alleviate the abrupt index of refraction change that would otherwise result as the RF electromagnetic wave enters and exits the example RF measurement device 200. Similarly, by having a forked configuration, the exterior portions may alleviate the abrupt index of refraction change that would otherwise result as the RF electromagnetic wave progresses, in the frame portion 212, into the internal cavity 216 (or vice versa). The tapered and forked configurations could thus reduce or eliminate the possibility of reflections at the first and second wall portions 218a, 218b.

The RF waveguide 234 may also be involved in the adiabatic mode conversion. For example, the first and second longitudinal portions 226, 228 on the first and second sides 210, 212 of the example RF measurement device 200 may have a pointed taper that splits into a four-beam waveguide. The four-beam waveguide may be defined by the first and second pairs of longitudinal bodies 226a, 226b, 228a, 228b. The pointed taper of the frame portion 214 may also match the pointed taper of the first and second longitudinal portions 226, 228. Inside the interior cavity 216, a forked structure, along with the four-beam configuration of the first and second longitudinal portions 226, 228, is used to transform the mode of the RF electromagnetic wave from the first waveguide mode (e.g., a single beam waveguide mode) into the second waveguide mode (e.g., a four-beam waveguide mode). An inverted configuration on the second side 208 of the example RF measurement device 200 may then be used to recouple the second waveguide mode back to the first waveguide mode. The inverted configuration may correspond to the four-beam waveguide merging back into a singular pointed taper.

Figure 6:
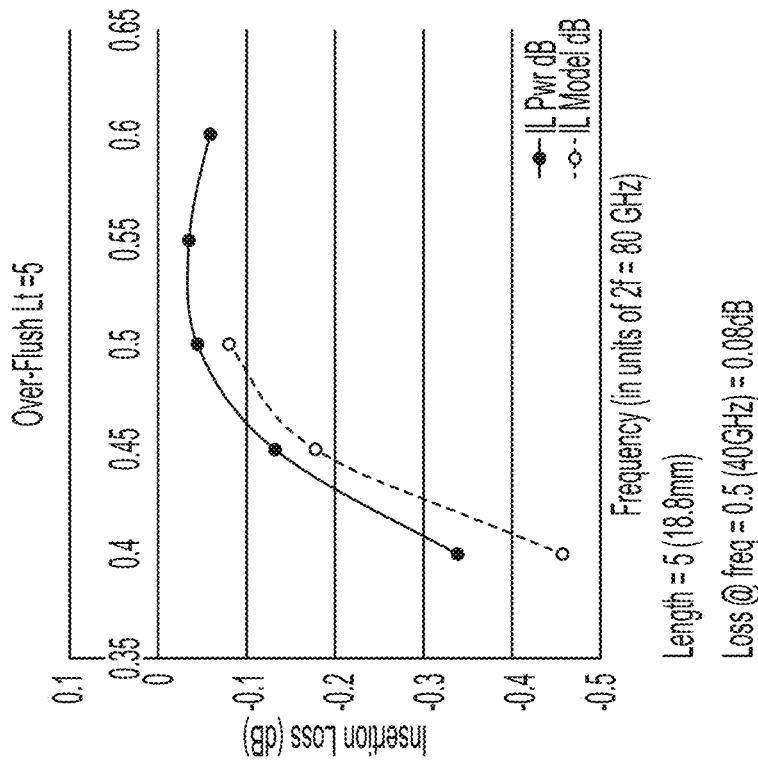
FIG. 6 is a series of graphs that show an example of reduced modal losses that can occur when using adiabatic tapering.
Figure 6:
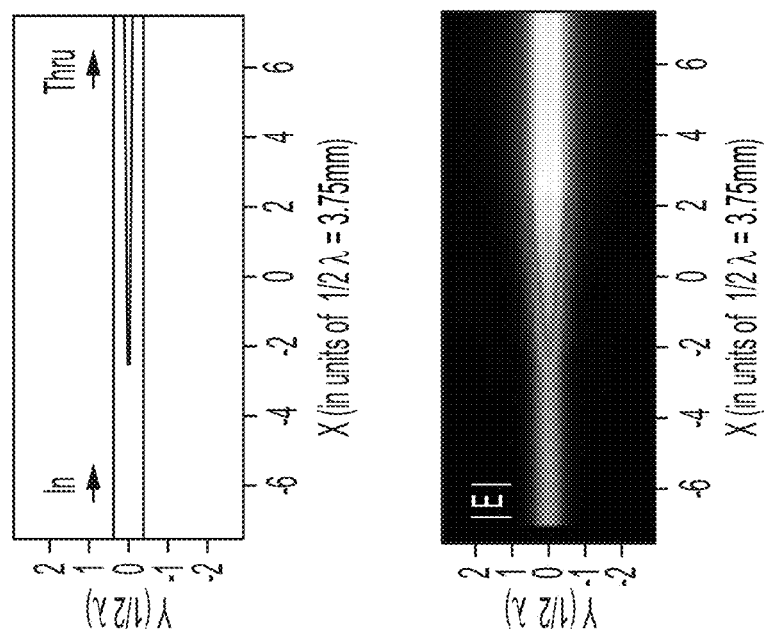

The loss in the adiabatic mode conversion can be minimized using adiabatic tapering. FIG. 6 presents a series of graphs that show an example of reduced modal losses that can occur when using adiabatic tapering. The series of graphs are derived from a simulation of the adiabatic tapering and may include top views of the example RF measurement device 200. In FIG. 6, the example RF measurement device is configured for operation at a frequency of about 40 GHz. However, other frequencies are possible. The series of graphs show adiabatic mode conversion along the axis 204 at a location near the first end 206 that is proximate the first mode converter 230 and a split of the RF waveguide 234 into the first and second pairs of longitudinal bodies 226a, 226b, 228a, 228b. The modal loss at the location is about 0.08 dB, which is relatively small. Such small losses are also expected at the second end 208, which is configured similarly to the first end 206.

The losses across the example RF measurement device 200 can also be minimized using a pattern of holes in the perimeter wall 218. For example, the perimeter wall 218 may include a pattern of holes (e.g., holes 220) that is disposed adjacent one or both of the first and second mode converters 230, 232. The pattern of holes may address a second mechanism for losses that can occur when an RF electromagnetic wave couples across the perimeter wall 218, such as from the exterior of the example RF measurement device 200 to the internal cavity 216 or vice versa. For instance, there may be an impedance mismatch across the perimeter wall 218 since the dielectric constant of the perimeter wall 218 is different than air outside of the example RF electromagnetic device 200 or vapor inside the internal cavity 216.

Figure 7:
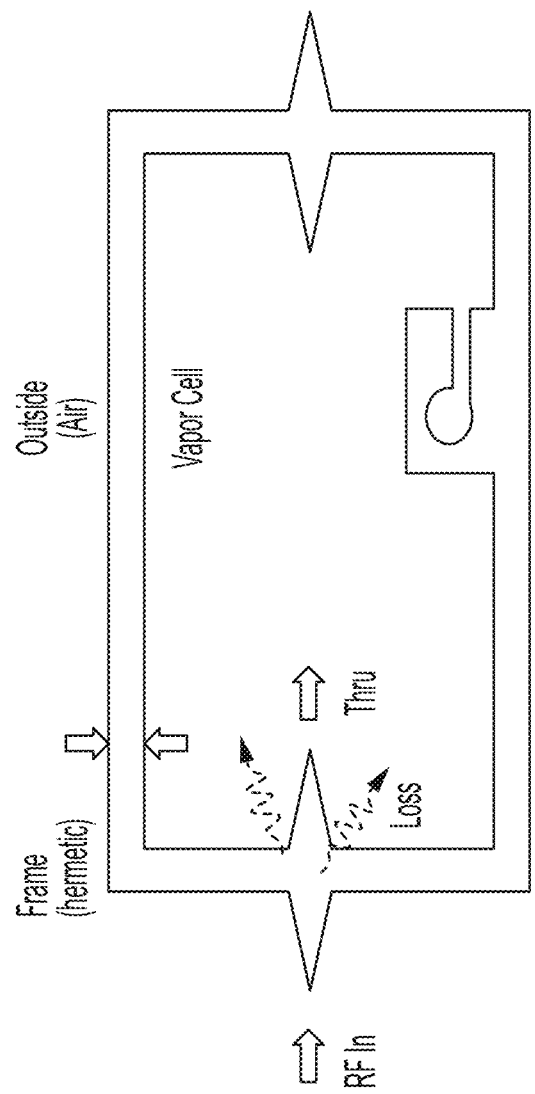
FIG. 7 is a schematic diagram, in top view, of losses that can occur as an RF electromagnetic wave traverses a perimeter wall of an example RF electromagnetic device.

FIG. 7 presents a schematic diagram, in top view, of losses that can occur as an RF electromagnetic wave traverses a perimeter wall of an example RF electromagnetic device. To address these losses, the perimeter wall (or portion thereof) may be configured as a metamaterial wall that includes a pattern of holes therein. In some instances, a laser can be used to machine the pattern of holes in the perimeter wall, and the resulting metamaterial wall may reduce the probability of the RF electromagnetic wave (or portion thereof) reflecting off the perimeter wall. The metamaterial configuration of the perimeter wall may also reduce transmission losses across the perimeter wall. Different types of hole patterns are possible. In some variations, the holes (or modified wall structures) only need to be placed where there is an expectation of significant RF electromagnetic field amplitude, such as adjacent a mode converter. Other parts of the perimeter wall can be solid, if necessary. For example, the perimeter wall may include a pattern of holes that is disposed adjacent a mode converter of the RF measurement device (e.g., one of both of the first and second mode converters 230, 232 shown in FIGS. 2A-2D).

Figure 8A:
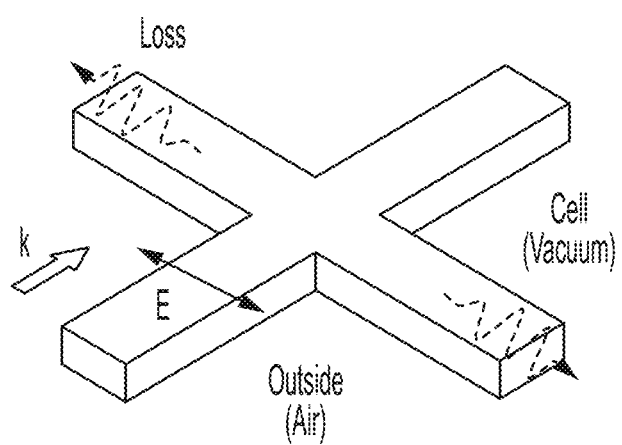
FIG. 8A is a schematic diagram, in perspective view, of possible losses across an example perimeter wall for an RF electromagnetic wave whose an electric field component is oriented in-plane with the example perimeter wall.
Figure 8B:
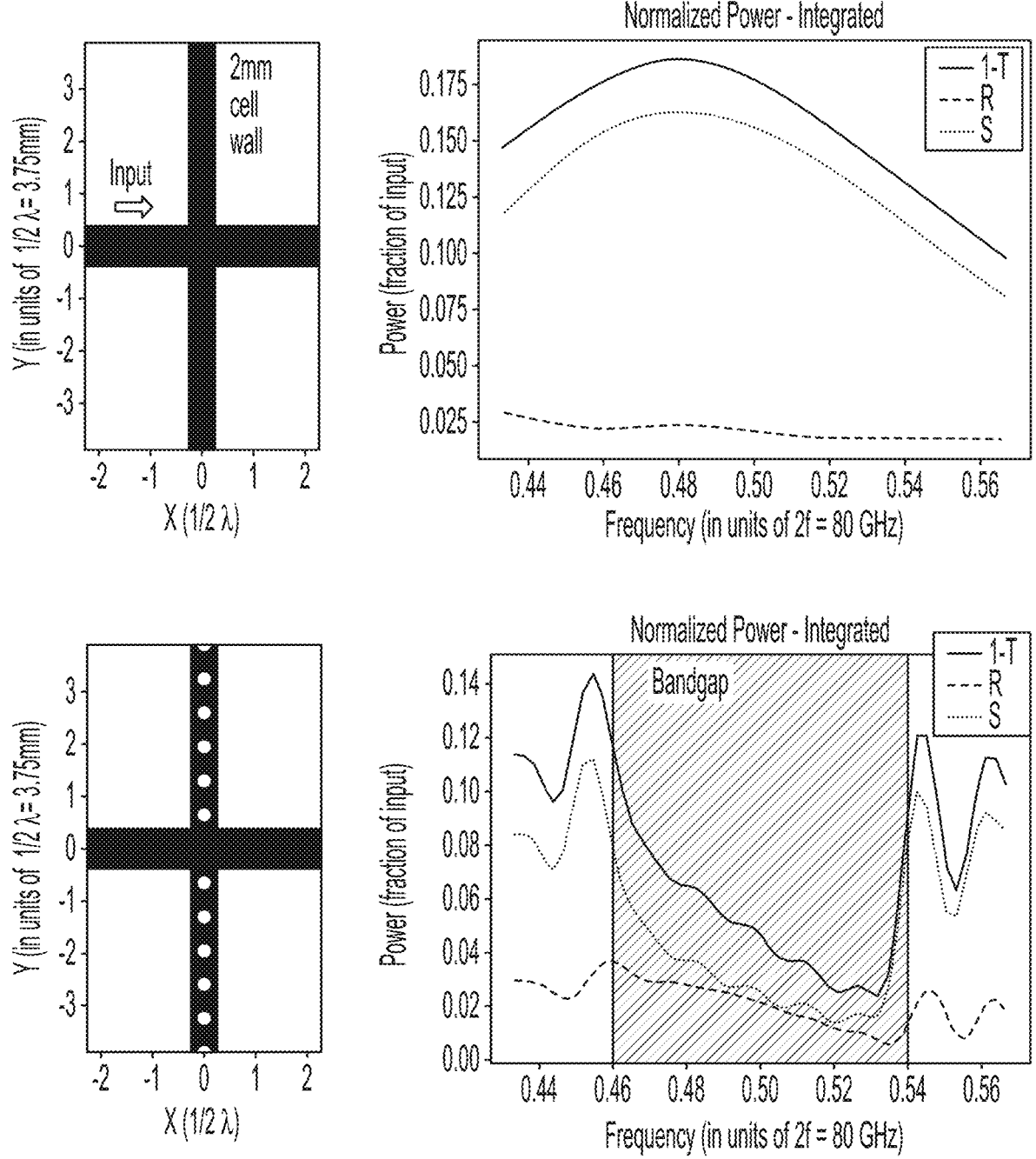
FIG. 8B is a series of graphs showing possible losses across the example perimeter wall of FIG. 8A, but for a first configuration in which the example perimeter wall is solid (top) and for a second configuration in which the example perimeter wall includes a plurality of patterned holes (bottom)

FIG. 8A presents a schematic diagram, in perspective view, of possible losses across an example perimeter wall for an RF electromagnetic wave whose electric field component is oriented in-plane with the example perimeter wall. The example perimeter wall may be part of a frame portion of a dielectric body, and the electric field component may be parallel to a plane defined by the frame portion (e.g., a horizontal polarization). FIG. 8B presents a series of graphs showing possible losses across the example perimeter wall of FIG. 8A, but for a first configuration in which the example perimeter wall is solid (top) and for a second configuration in which the example perimeter wall includes a plurality of patterned holes (bottom). A schematic diagram is shown to the right side of each graph that illustrates the first and second configurations from a top view perspective. The series of graphs show the reflection and scattering coefficients, along with an overall loss, represented as one minus the transmission coefficient. The overall loss is quantified by plotting the reflection coefficient and the scattering coefficient, which can both indicate the overall loss. If the example perimeter wall induces no losses, the transmission coefficient (T) is one. The quantity 1-T represents the overall loss for the example perimeter wall. The overall loss for the second configuration is reduced by a factor of about 5-6 in the bandgap of the metamaterial wall when compared to the first configuration.

Figure 9A:
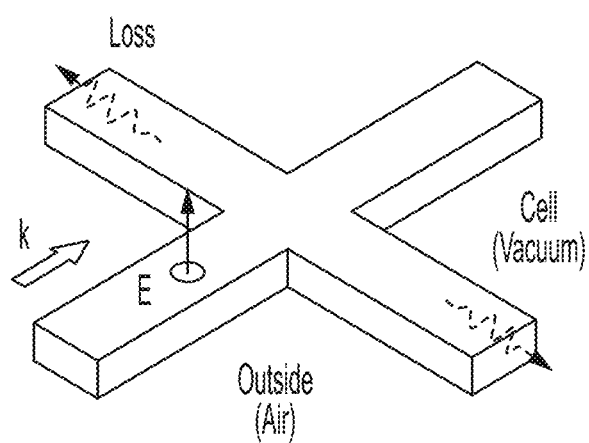
FIG. 9A is a schematic diagram, in perspective view, of possible losses across the example perimeter wall of FIG. 8A, but for an RF electromagnetic wave whose electric field component is oriented perpendicular to the example perimeter wall.
Figure 9B:
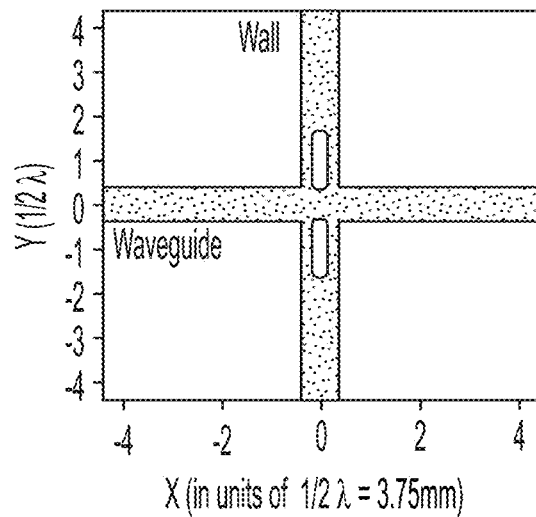
FIG. 9B is a series of graphs showing possible losses across the example perimeter wall of FIG. 9A, but for a configuration in which the example perimeter wall includes a plurality of patterned holes.
Figure 9B:
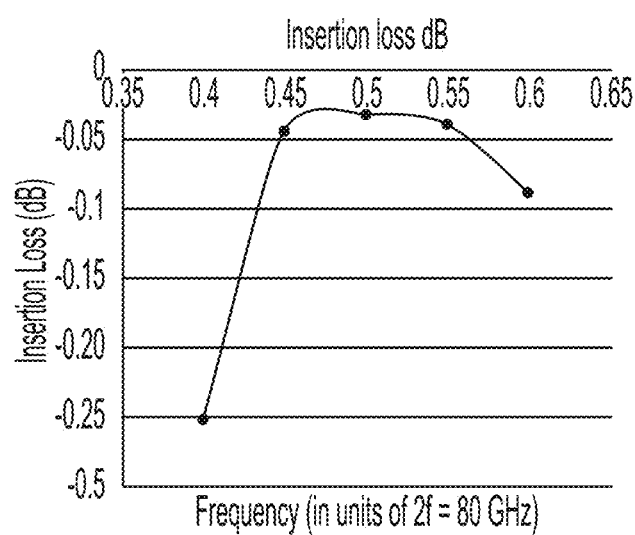
Figure 9B:
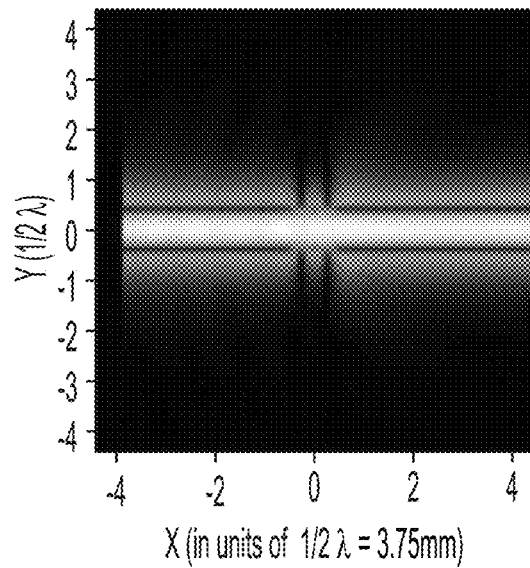

The perimeter wall may also be configured for other electric field orientations. FIG. 9A presents a schematic diagram, in perspective view, of possible losses across the example perimeter wall of FIG. 8A, but for an RF electromagnetic wave whose electric field component is oriented perpendicular to the example perimeter wall. The example perimeter wall may be part of a frame portion of a dielectric body, and the electric field component may be perpendicular to a plane defined by the frame portion (e.g., a vertical polarization). FIG. 9B presents a series of graphs showing possible losses across the example perimeter wall of FIG. 9A, but for a configuration in which the example perimeter wall includes a plurality of patterned holes (bottom). A schematic diagram is shown to the top right of FIG. 9B that illustrates the configuration from a top view perspective. The perimeter wall in the schematic diagram is illustrated with a dotted pattern. The series of graphs show results for vertical polarization relative to the frame portion of the dielectric body. In FIG. 9A, the loss at 40 GHz is about 0.03 dB. This loss is quite low since its magnitude is negligible compared to the loss at an RF connecting flange (or mating pair) that couples the RF waveguide of an RF circuit to the RF waveguide of the RF waveguide of the RF measurement device. In some instances, such as shown in FIG. 9B, the example perimeter wall is configured as a metamaterial wall only along a portion where the RF electromagnetic wave traverses the example perimeter wall (e.g., adjacent a mode converter). In these instances, the mode of the RF electromagnetic wave may be scattered and attenuated in the region where the electromagnetic field of the RF electromagnetic wave is localized.

In some implementations, the example RF measurement device 200 may be disposed in a housing that extends between first and second housing ends. The housing may, for example, include a cavity that extends between the first and second ends. In certain configurations, the housing is a tubular housing. The first and second housing ends may include respective housing flanges that are configured to couple to an RF circuit. For example, the RF circuit may include an RF waveguide (e.g., a test RF waveguide) that has first and second RF ports and an RF pathway therebetween. The example RF measurement device 200 may be disposed along the RF pathway and be aligned therewith. Moreover, the first and second RF ports may include, respectively, first and second waveguide flanges. In these cases, the housing may include first and second housing flanges at the first and second housing ends, respectively, that are configured to couple to the first and second waveguide flanges of the RF waveguide.

In these implementations, the housing may also contain part or all of the example RF measurement device 200 (e.g., in the cavity). For example, the housing may contain the internal cavity 216, the RF waveguide 234, and at least part of each of the first and second mode converters 230, 232. The first and second mode converters 230, 232 may reside proximate the first and second housing flanges, respectively. In some variations, one or both of the first mode converter 230 and the first housing flange may be configured to minimize or eliminate perturbations of an RF electromagnetic wave when the wave traverses between the RF circuit (or RF waveguide thereof) and the example RF measurement device 200. One or both of the second mode converter 232 and the second housing flange may be configured similarly.

Figure 10:
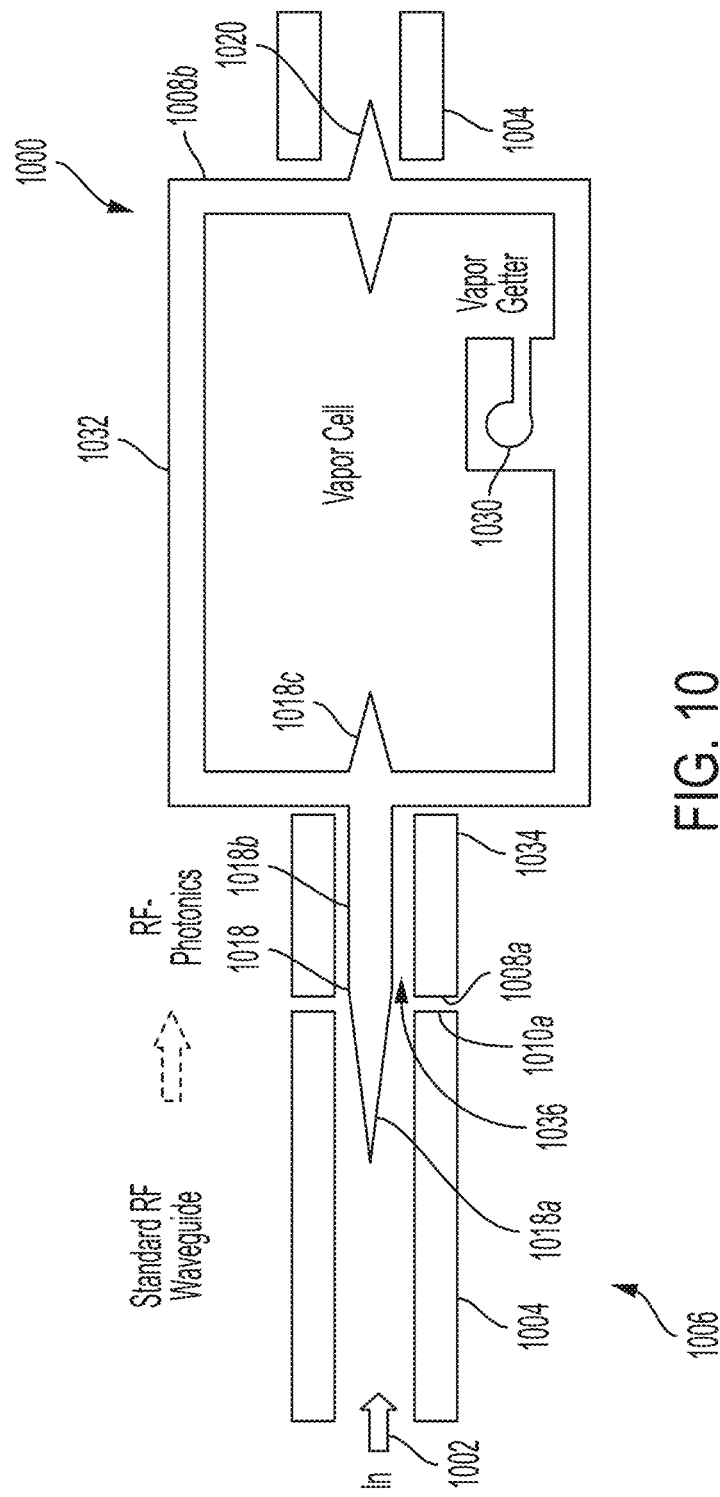
FIG. 10 is a schematic diagram, in top view, of an example RF measurement device having a mode convertor that is configured to minimize or eliminate perturbations of an RF electromagnetic wave incident on the example RF measurement device.

FIG. 10 presents a schematic diagram, in top view, of an example RF measurement device 1000 having a mode convertor 1018 that is configured to minimize or eliminate perturbations of an RF electromagnetic wave 1002 incident on the example RF measurement device 1000. The example RF measurement device 1000 may be analogous to the example RF measurement device 100 described in relation to FIGS. 1A-1D or the example RF measurement device 200 described in relation to FIGS. 2A-2D. Features common to both FIGS. 10 and 1A are related via coordinated numerals that differ in increment by nine hundred. However, certain features of FIG. 1A have been omitted from FIG. 10 for clarity.

In some implementations, the mode converter 1018 is elongated such that, when its exterior portion is inserted into an RF waveguide 1004 of an RF circuit 1006 (or waveguide flange thereof), the mode converter 1018 can convert the mode of the RF electromagnetic wave 1002 along an increased distance. This increased distance may ensure that the mode of the RF electromagnetic wave 1002 is fully converted before reaching the perimeter wall 1032. For example, the mode converter 1018 may include an extension 1018a that protrudes from the perimeter wall 1032 of the example RF measurement device.

In some implementations, the mode converter 1018 includes a tapered portion 1018b that defines an adiabatic taper. The tapered portion 1018b may thus gradually transition the mode of the RF electromagnetic wave 1002 with minimal or no heat generation, thereby minimizing or eliminating perturbations of the RF electromagnetic wave 1002 as it approaches the perimeter wall 1032. The tapered portion 1018b may be configured in length such that its taper occurs over longer or shorter distances. In certain cases, the length of the tapered portion 1018b may be based on properties of the RF electromagnetic wave 1002 (e.g., frequency, amplitude, phase, polarization, etc.).

In some implementations, the example RF measurement device 1000 includes an RF conduit 1034 that extends from the perimeter wall 1032 and terminates in a flange 1008a. Part or all of an exterior portion of the mode converter 1018 may extend through the RF conduit 1034. The RF conduit 1034 may include a channel 1036 therethrough and part or all of the exterior portion (e.g., the tapered portion 1018a, the extension 1018b, etc.) may extend through the channel 1036. In some variations, the RF conduit 1034 is an integral part of a housing that contains part or all of the example RF measurement device 1000. In these variations, the flange 1008a may correspond to a housing flange that is configured to couple to an RF circuit. For example, the flange 1008a may be configured to couple to the flange 1010a of the RF waveguide 1004.

Figures 11A, 11B:
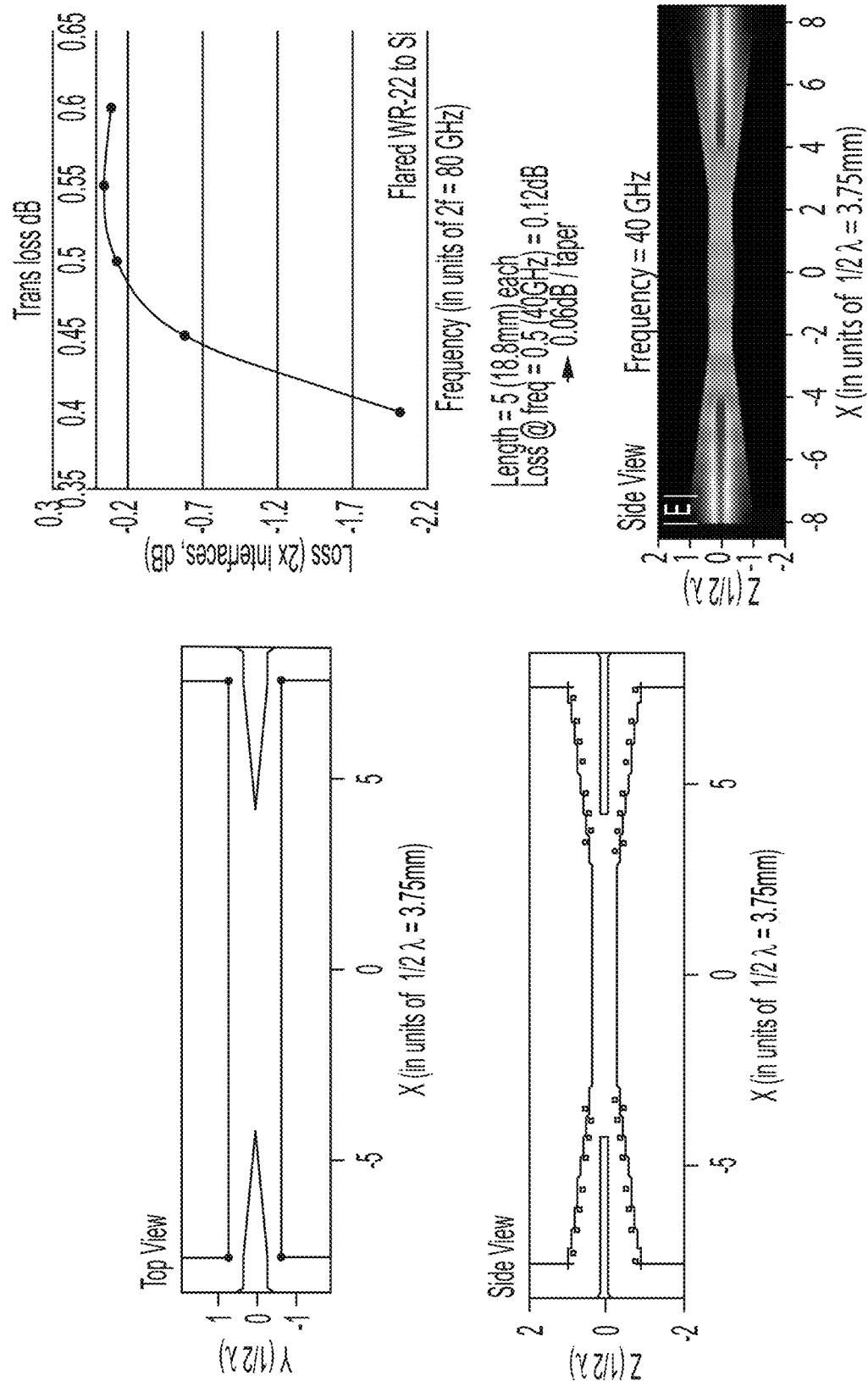
FIG. 11A is a schematic diagram, in top and side views, of an example RF conduit that extends between first and second conduit ends.
FIG. 11B is a pair of graphs showing the simulated losses of the example RF conduit of FIG. 11A while transmitting an RF electromagnetic wave through its channel.

FIG. 11A presents a schematic diagram, in top and side views, of an example RF conduit that extends between first and second conduit ends. A scale at the base of each view is in units of λ/2=3.75 mm and places the first and second conduit ends at approximately −8 and +8, respectively, on the scale. The example RF conduit includes a channel that extends through the example RF conduit between the first and second conduit ends. The channel may be altered in configuration (e.g., dimensions, cross section, etc.) proximate the first and second conduit ends to allow the example RF conduit to receive at least part of an exterior portion of a mode converter. This alteration may also allow an RF electromagnetic wave to experience minimal to no perturbations when entering or leaving the example RF conduit. For example, as shown in the top view of FIG. 11A, the channel may have a uniform width along a length of the example RF conduit. The channel may also increase in height (e.g., flare open) as it approaches either the first or second conduit ends, as shown in the side view of FIG. 11B.

In some variations, the channel is configured to allow an RF electromagnetic wave to be exchanged between two mode converters. In these variations, a mode converter may be inserted into the channel at each of the first and second conduit ends. FIG. 11B presents a pair of graphs showing the simulated losses of the example RF conduit of FIG. 11A while transmitting an RF electromagnetic wave through its channel. In the graphs, the RF electromagnetic wave is transmitted between the two mode converters. The presence of an adiabatic taper in the mode converters (e.g., similar to that described in relation to the tapered portion 1018b of FIG. 10) allows the RF electromagnetic wave to experience minimal transmission losses. The altered configuration of the channel near the first and second conduit ends (relative to its midportion) may also contribute to minimizing the transmission losses. In FIG. 11B, the loss associated with each adiabatic taper is about 0.06 dB. In many instances, the adiabatic taper is designed to reduce loss from in-coupling and out-coupling the RF electromagnetic wave.

In some implementations, a portion of the channel may be used to define a channel profile that serves as the basis for a housing profile, especially at or near a housing flange. For example, a housing may be used to contain part or all of an RF measurement device. To do so, the housing may include a cavity (e.g., a through hole) that extends between first and second housing ends. In these cases, the channel profile of FIG. 11A from about −8 to 0 may be used to define a profile for the cavity (e.g., a housing profile) proximate one or both of the first and second housing ends. The channel profile at about 0, in particular, may define one or both of the first and second housing ends and thus be a part of a housing flange at the housing end. Moreover, the channel profile extending away from 0 may be configured to contain part or all of an exterior portion of a mode converter, such as shown in top and side views of FIGS. 11A-11B.

The channel profile illustrated in FIGS. 11A-11B may be configured to reduce transmission losses when the RF electromagnetic field enters or leaves the example RF conduit via a mode converter. As the RF electromagnetic field traverses the mode converter, its out-of-plane field mode can penetrate into the air a larger distance than its in-plane field mode, and as such, transmission losses may be reduced by placing the surfaces of the channel further away from the mode converter (e.g., compare the side and top views of the FIG. 11A). This configuration of the channel profile reduces the interaction of the RF electromagnetic field with the surfaces of the channel at or near a conduit end. However, other configurations are possible for the channel profile.

Figures 12A, 12B:
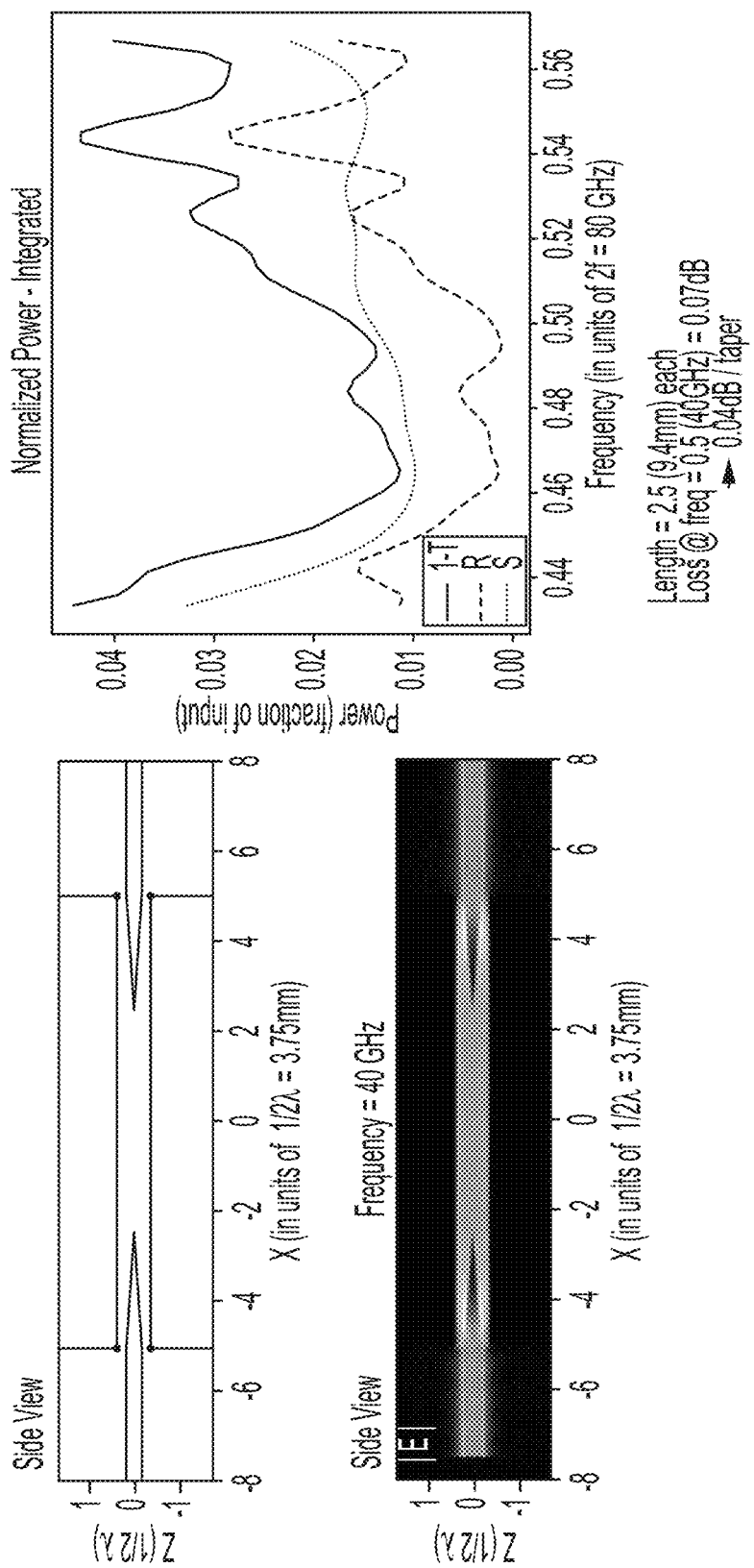
FIG. 12A is a schematic diagram, in side view, of an example RF conduit that extends between first and second conduit ends.
FIG. 12B is a graph showing the simulated losses of the example RF conduit of FIG. 12A while transmitting an RF electromagnetic wave through its channel.

FIG. 12A presents a schematic diagram, in side view, of an example RF conduit that extends between first and second conduit ends. A scale at the base of the side view is in units of λ/2=3.75 mm and places the first and second conduit ends at approximately −5 and +5, respectively, on the scale. The example RF conduit includes a channel that extends through the example RF conduit between the first and second conduit ends. The channel has a channel profile proximate the first and second conduit ends to allow the example RF conduit to receive at least part of an exterior portion of a mode converter. However, unlike the channel profile shown in FIG. 11A, the channel profile in FIG. 12A does not include a flared or tapered opening of the channel. Instead, the channel is uniform in height along a length of the example RF conduit, giving the channel profile a uniform configuration proximate the first and second conduit ends. In FIG. 12A, the mode converters are rotated 90 degrees relative to the mode converters in FIG. 11A (e.g., compare the side view of FIG. 12A to the top and side views of FIG. 11A). This rotation, combined with the channel profile, may reduce a transmission loss of the example RF conduit. FIG. 12B presents a graph showing the simulated losses of the example RF conduit of FIG. 12A while transmitting an RF electromagnetic wave through its channel. The loss associated with the mode converters, and in particular their adiabatic tapers, is about 0.04 dB. As such, the transmission loss of the channel profile in FIG. 12A is lower than that of the channel profile in FIG. 11A.

Figure 13A:
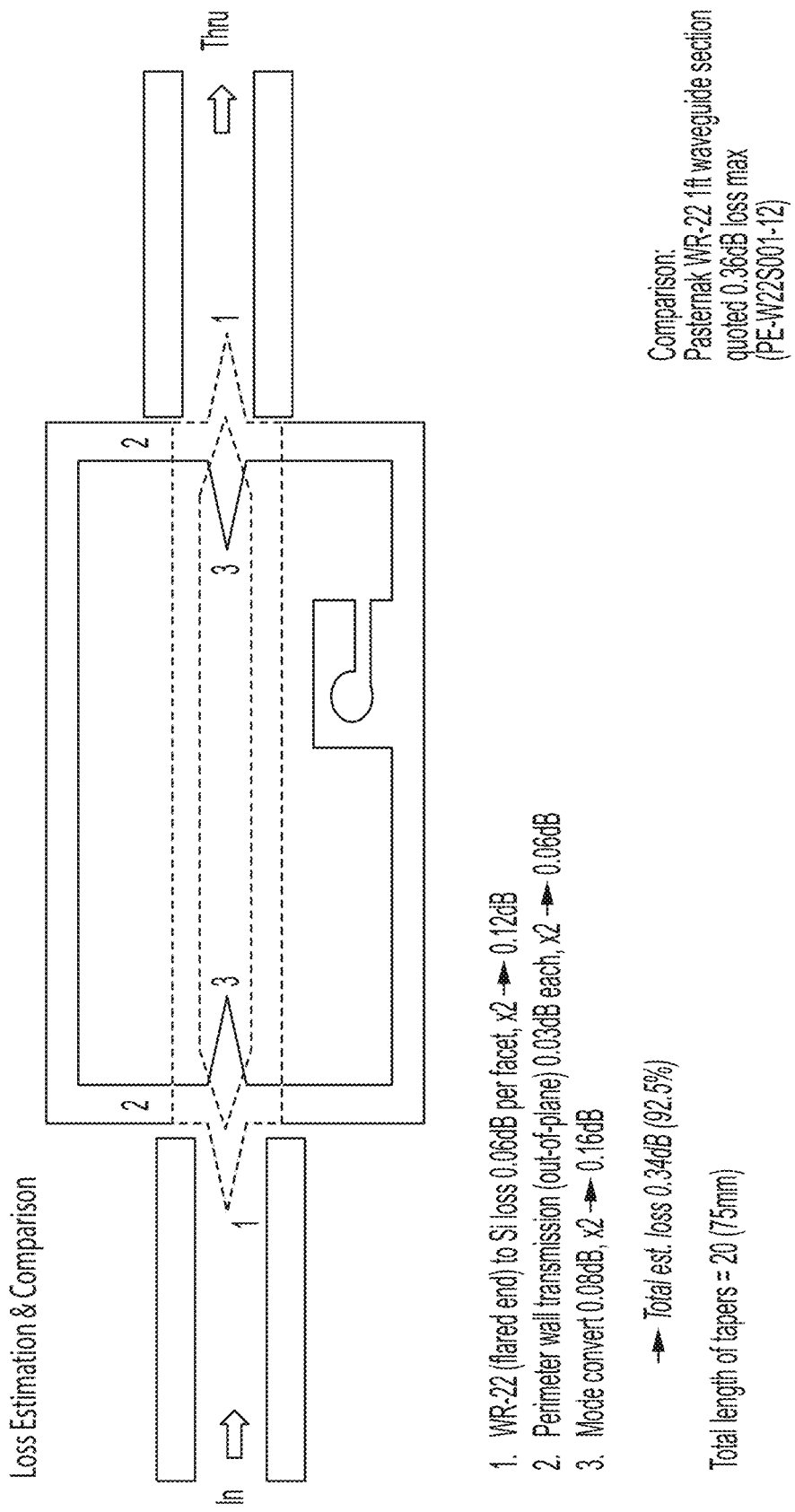
FIG. 13A is a schematic diagram, in top view, of an example RF measurement device that is coupled in-line to a waveguide section of an RF circuit.

In some implementations, the example RF measurement devices have a total transmission loss that is lower than a component of the RF circuit, such as an RF waveguide of the RF circuit. FIG. 13A presents a schematic diagram, in top view, of an example RF measurement device that is coupled in-line to a waveguide section of an RF circuit. The example RF measurement device may, for example, be analogous to the example RF measurement device 100 described in relation to FIGS. 1A-1D or the example RF measurement device 200 described in relation to FIGS. 2A-2D. The example RF measurement device resides in a mid-portion of the waveguide section, and as such, may provide continuity to an RF pathway that extends through the waveguide section (and also the RF circuit). In FIG. 13A, the waveguide section is shown as manufactured by Pasternak (Model No. PE-W22S001-12). However, waveguide sections from other manufacturers are possible. The example RF measurement device may also be use with other types of components of the RF circuit.

FIG. 13B presents a table that compares transmission losses between the example RF measurement device and waveguide section of FIG. 13A. The WR-22 waveguide section is quoted by the manufacturer (i.e., Pasternak) as having a maximum transmission loss of 0.36 dB. The estimated transmission loss for the RF measurement device, at 0.34 dB, is comparable to that of the waveguide section. However, even if the loss of the device was slightly larger (e.g., 10% larger), the example RF measurement device would still be useful in measuring properties of an RF electromagnetic wave traversing the waveguide section. The overall configuration of the example RF measurement device is low loss and non-perturbative of the RF electromagnetic wave (or its fields). When compared to diode detectors which are dissipative—for example, the diode detectors may dissipate the RF electromagnetic field energy thermally—the example RF measurement device does not (or minimally so) and can be constructed so that it is largely lossless.

The workable bandwidth for each component of the example RF measurement device is summarized in the table of FIG. 13B. In this case, the various portions of the example RF measurement device are optimized for a peak performance at 40 GHz for low insertion loss. However, other frequencies are possible. The table gives the frequency ranges with insertion loss lower than 0.1 dB as a quantitative estimation for the workable bandwidth of the device. An exception may be the perimeter wall transmission configuration for the horizontal polarization, which demonstrates a well-defined photonic bandgap that can be identified as its bandwidth. Generally, bandwidths around 25 to 30 percent of the center frequency can be achieved, owing to the robust nature of adiabatic conversion of the mode converters. Functions created by a photonic bandgap, such as the in-plane wall transmission, can be improved by enlarging the dielectric contrast with a trade-off in the perimeter wall structural integrity.

In some implementations, the RF measurement devices described herein may include a first RF waveguide flange at their inputs. The first RF waveguide flange may be attached to a conventional RF waveguide of an RF circuit and can, in certain cases, be modified in its structure to facilitate coupling into an RF silicon photonic structure. The RF measurement device may also include a first RF mode converter at the input. The first RF mode converter may be configured with an in-coupling structure that defines an adiabatic taper. Adiabatic tapering of the in-coupling structure can minimize transmission loss as a mode of an RF electromagnetic wave is converted into a mode of the RF silicon photonic structure. The tapered in-coupling structure can be integrated into the first RF mode converter for receiving the RF electromagnetic wave. However, in certain cases, the tapered in-coupling structure is defined by a combination of the first RF mode converter and an RF waveguide of the RF measurement device.

In some implementations, the first RF mode converter is configured to change a mode of the RF electromagnetic wave into a mode that is conducive to measurements using Rydberg electrometry. In these implementations, the RF measurement device may include a vapor cell that is configured for RF measurements using Rydberg electrometry. These RF measurements may be conducted with minimum loss due to, for example, the dielectric materials used to fabricate the RF silicon photonic structure (e.g., silicon, borosilicate glass, etc.). The RF measurements may determine properties of the RF electromagnetic wave, such as an amplitude, a phase, a polarization, or a frequency of the RF electromagnetic wave. Combinations of properties may be measured, including concurrently. The mode of the RF silicon photonic structure can be configured according to a profile, such as for uniformity, bandwidth, low loss, and amplification of the electric and/or magnetic fields.

A vapor cell highly transparent to RF electromagnetic radiation resides inside the RF silicon photonic structure, and this vapor cell can be configured for Rydberg electrometry. In such configurations, the vapor cell may contain a vapor of Rydberg atoms or molecules. Examples of Rydberg electrometry can be found in U.S. Pat. No. 10,509,065 entitled "Imaging of Electromagnetic Fields". In some variations, the perimeter wall of the vapor cell is configured to maximize the transmission of the RF electromagnetic wave through an RF measurement device. For example, the vapor cell can be optimized for RF transmission by machining the perimeter wall of the vapor cell to include an ordered array of holes. These holes may reside at a portion of the perimeter wall where the RF electromagnetic wave spatially interacts with the perimeter wall.

In some implementations, the RF measurement devices include an RF waveguide that extends between the first RF mode converter and a second RF mode converter of the RF measurement devices. The RF waveguide is configured to carry the RF electromagnetic wave, in the mode conducive to measurements, through the vapor cell. The RF waveguide is also configured with an aperture to allow an optical signal (e.g., laser light) to pass through a target region of the vapor cell. In some instances, the optical signal is transmitted to the RF waveguide using an optical fiber. The RF electromagnetic wave may interact with vapor in a target region of the vapor cell and this interaction may occur concurrently with the optical signal. In these cases, the optical signal may exit the vapor cell as an output optical signal that represents a property of the RF electromagnetic wave. The output optical signal can be captured on the other side of the vapor cell using an optical detector (e.g., a photo diode). However, in some instances, the output optical signal is transmitted away from the vapor cell using an optical fiber. In these instances, the output optical signal may be transmitted to signal processing electronics, which may include an optical detector.

In some implementations, the RF measurement devices include a second RF waveguide flange. The second RF waveguide flange and the second RF mode converter may reside proximate an output of the RF measurement devices, such on a side opposite of the first RF waveguide flange and the first RF mode converter. The second RF waveguide flange and the second RF mode converter are operable to couple the RF electromagnetic wave back into the conventional RF waveguide of the RF circuit. The second RF mode converter is also configured to change the mode of the RF electromagnetic wave from the mode that is conducive to measurements back into its original mode. This change may be assisted by the RF waveguide. Once the RF electromagnetic wave is coupled back into the conventional RF waveguide of the RF circuit, it passes through a flange on the conventional RF waveguide that can transport the RF electromagnetic wave back into the RF circuit. In some implementations, multiple instances of an RF measurement device can be shared by a single laser system and signal processing unit.

In some implementations, a method for measuring RF electromagnetic waves includes passing two or more input optical signals through a vapor to generate an output optical signal. The vapor may include Rydberg atoms or molecules and may be part of an RF measurement device that includes first and second mode converters. Moreover, each mode converter may be configured to convert a mode of an RF electromagnetic wave between a first RF waveguide mode and a second RF waveguide mode. The first RF waveguide mode may be, for example, a mode of the RF electromagnetic mode exterior to the RF measurement device, such as while propagating through an RF circuit. The second RF waveguide mode may be, for example, a mode of the RF electromagnetic mode interior to the RF measurement device, such as while traversing a vapor cell of the RF measurement device. In some variations, the first and second mode converters are adiabatic mode converters.

The RF measurement device may also include an internal cavity that contains the vapor and is disposed between the first and second mode converters. In many variations, the internal cavity defines or is part of a vapor cell of the RF measurement device. In some instances, the internal cavity is surrounded by a perimeter wall of the RF measurement device. The RF measurement device may additionally include an RF waveguide that extends between the first and second mode converters and is configured to carry the second RF waveguide mode through the internal cavity.

In some implementations, the method also includes receiving, at the first mode converter, the RF electromagnetic wave from a test RF waveguide. The mode of the RF electromagnetic wave may have the first RF waveguide mode which, in certain cases, may be set by the test RF waveguide to be the first RF waveguide mode. In some implementations, the test RF waveguide is part of an RF circuit. The method additionally includes converting, by operation of the first mode converter, the mode of the RF electromagnetic wave from the first RF waveguide mode to the second RF waveguide mode. Moreover, the method includes guiding, by operation of the RF waveguide, the RF electromagnetic wave through the internal cavity and from the first mode converter to the second mode converter. In many implementations, the method further includes converting, by operation of the second mode converter, the mode of the RF electromagnetic wave from the second RF waveguide mode to the first RF waveguide mode. In these implementations, the method may also include transmitting the RF electromagnetic wave from the second mode converter to the test RF waveguide (or RF port thereof).

In some implementations, the RF waveguide includes first and second longitudinal portions disposed on respective, opposite sides of the RF measurement device. The first and second longitudinal portions may be configured to establish a target RF profile in an interaction region of the internal cavity. In such implementations, guiding the RF electromagnetic wave may include altering, by operation of the first and second longitudinal portions, a profile of the RF electromagnetic wave to match the target RF profile. Examples of the target profile include a uniform electric field intensity and a parabolic electric field intensity. However, other target profiles are possible, including profiles for magnetic field intensities.

In further implementations, the first longitudinal portion has a first aperture therethrough, and the second longitudinal portion has a second aperture therethrough. In such implementations, passing two or more input optical signals through a vapor may include propagating the two or more input optical signals along an optical path that extends successively through the first aperture, the interaction region, and the second aperture. In some implementations, the first longitudinal portion includes a first pair of longitudinal bodies that extend along a length of the first longitudinal portion and straddle a first elongated aperture through the first longitudinal portion. Moreover, the second longitudinal portion includes a second pair of longitudinal bodies that extend along a length of the second longitudinal portion and straddle a second elongated aperture through the second longitudinal portion. In further implementations, passing two or more input optical signals through a vapor includes propagating the two or more input optical signals along an optical path that extends successively through the first elongated aperture, the interaction region, and the second elongated aperture.

In some implementations, the method includes measuring, by operation of an optical detector, an optical property of the output optical signal, the optical property representing a property of the RF electromagnetic wave. Examples of the optical property include an amplitude of the output optical signal, a frequency of the output optical signal, a phase of the output optical signal, and a polarization of the output optical signal. One or more of these optical properties may serve as a basis for a signal processing system to determine a property of the RF electromagnetic wave. Examples of the property of the RF electromagnetic wave include a power of the RF electromagnetic wave, a frequency of the RF electromagnetic wave, and a phase of the RF electromagnetic wave. Other properties may be possible (e.g., a polarization of the RF electromagnetic wave).

In some implementations, the two or more input optical signals comprise a probe optical signal. In these implementations, passing the two or more input optical signals through the vapor may include interacting the probe optical signal with the vapor to alter an optical property of the probe optical signal. As such, the optical property of the probe optical signal, when altered, may define an optical property of the output optical signal.

The RF measurement device may, in certain cases, measure the properties of two counter-propagating RF electromagnetic waves. Such measurement may occur concurrently. In these cases, the method may include receiving, at the second mode converter, a second RF electromagnetic wave from the test RF waveguide. A mode of the second RF electromagnetic wave may be set by the test RF waveguide to be the first RF waveguide mode. The method also includes converting, by operation of the second mode converter, the mode of the second RF electromagnetic wave from the first RF waveguide mode to the second RF waveguide mode. Moreover, the method includes guiding, by operation of the RF waveguide, the second RF electromagnetic wave through the internal cavity from the second mode converter to the first mode converter. The method additionally includes converting, by operation of the first mode converter, the mode of the second RF electromagnetic wave from the second RF waveguide mode to the first RF waveguide mode. In some variations, the method includes transmitting the first RF electromagnetic wave from the second mode converter to the test RF waveguide and transmitting the second RF electromagnetic wave from the first mode converter to the test RF waveguide.

In some implementations, the RF measurement device comprises a perimeter wall that surrounds the internal cavity and passes through the first and second mode converters. In some instances, the perimeter wall includes a pattern of holes that is disposed adjacent one or both of the first and second mode converters. In some instances, the internal cavity is an elongated internal cavity that extends along a cavity axis between first and second ends of the RF measurement device. The first and second mode converters may be aligned with the cavity axis and disposed at, respectively, the first and second ends of the RF measurement device.

The RF measurement devices described herein can include an RF waveguide that is also configured to establish a circular polarization in the RF electromagnetic wave. For example, the RF waveguide 1434 described in relation to FIGS. 14A-14D can establish a circular polarization that has an axis of rotation perpendicular to the plane of the example RF measurement device 1400. The RF waveguide described in relation to FIGS. 15A-15F can establish a circular polarization that has an axis of rotation parallel to the cavity axis 1504 of the example RF measurement device 1500. In some cases, the circular polarization is established by creating a new circular polarization in the RF electromagnetic wave where there was previously none. In some cases, the circular polarization is established by altering an existing circular polarization of the RF electromagnetic wave.

In some implementations, the circular polarization includes first and second rotational directions, with the latter having a direction opposite of the former. The first rotational direction may occur when the RF electromagnetic wave is guided by the RF waveguide from the first mode converter to the second mode converter, and the second rotational direction may occur when the RF electromagnetic wave is guided by the RF waveguide from the second mode converter to the first mode converter. However, other associations are possible between the first and second rotational directions and a direction of propagation for the RF electromagnetic wave.

In some implementations, the RF waveguide may include first and second longitudinal portions disposed on respective, opposite sides of the RF measurement device. These longitudinal portions may be configured to establish first and second target profiles. For example, the first RF target profile may be established in a first interaction region of the internal cavity and include a first circular polarization. The second target RF profile may be established in a second interaction region of the internal cavity and include a second circular polarization. In many instances, the second circular polarization is opposite in direction of the first circular polarization.

Figure 14A:
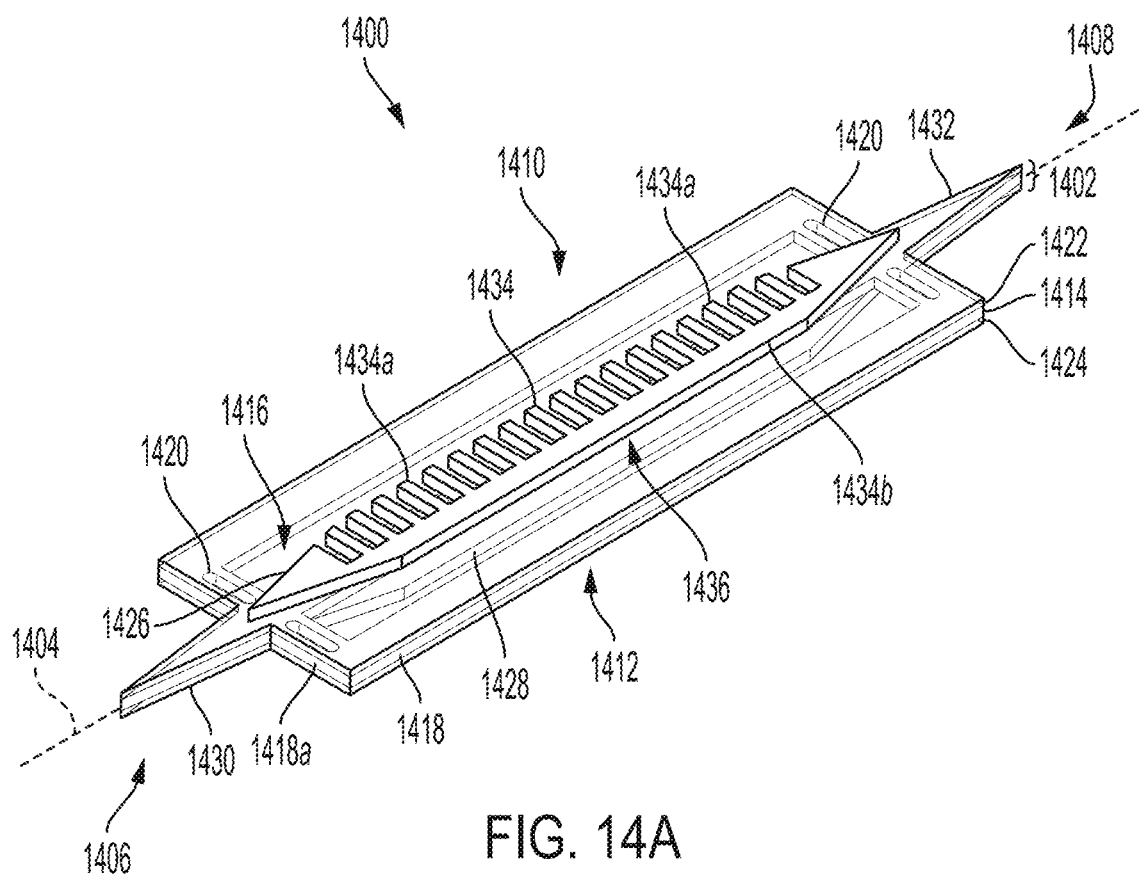
FIG. 14A is a schematic diagram, in perspective view, of an example RF measurement device that includes an RF waveguide that is configured to establish a circular polarization in an RF electromagnetic wave.
Figure 14B:
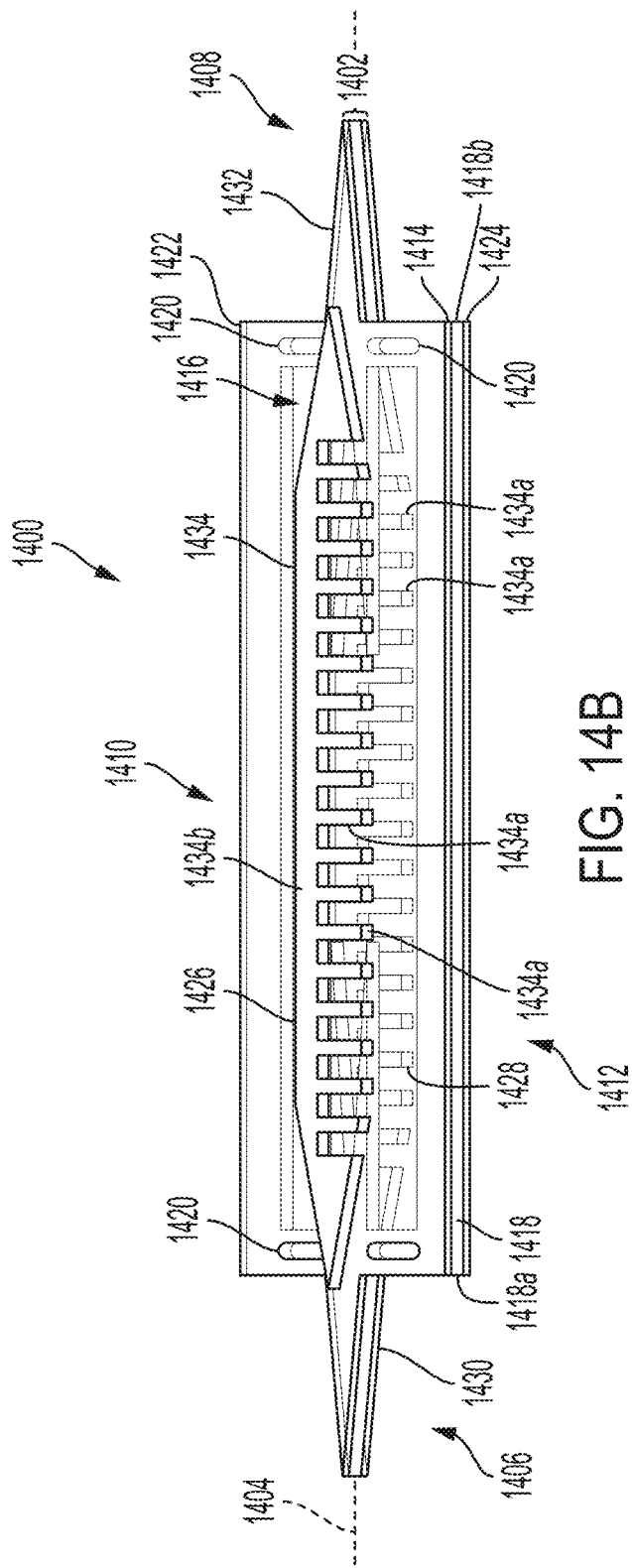
FIG. 14B is a schematic diagram, in top perspective view, of the example RF measurement device of FIG. 14A.
Figure 14C:
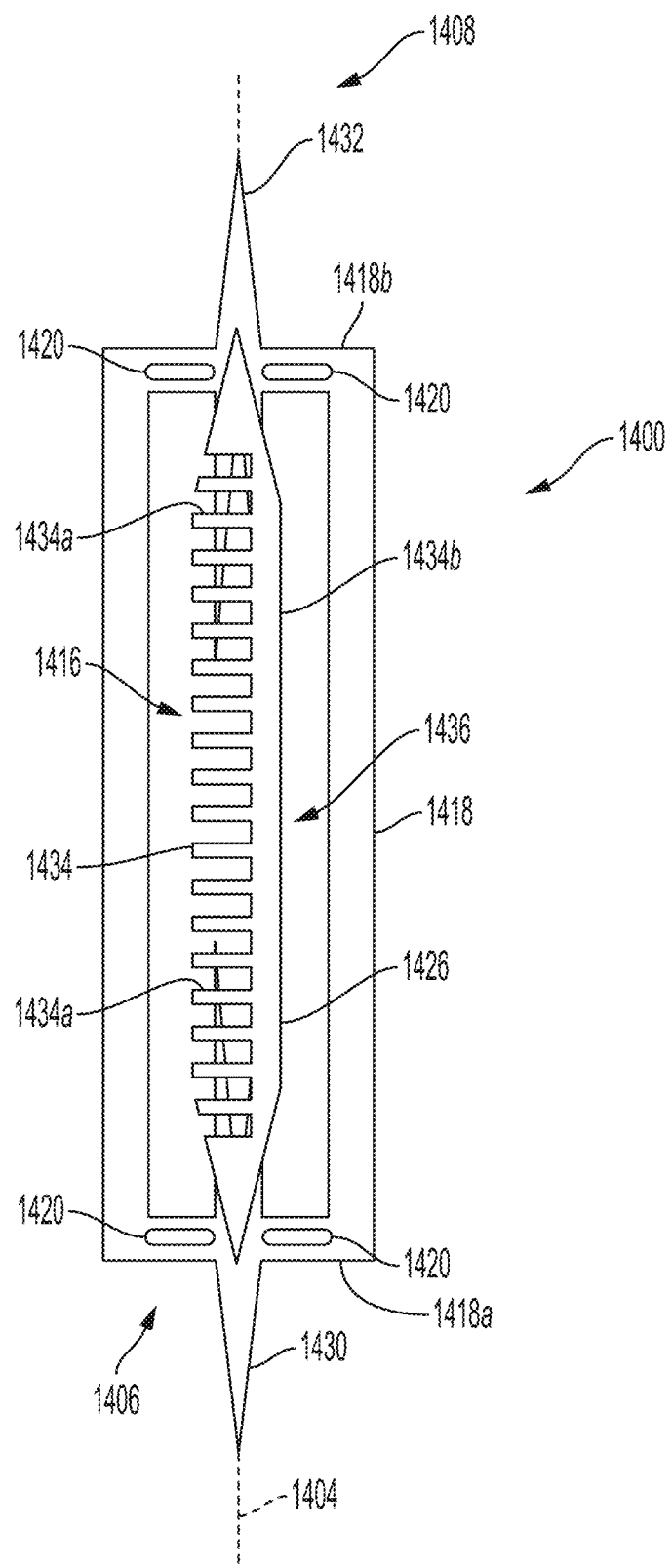
FIG. 14C is a schematic diagram, in top view, of the example RF measurement device of FIG. 14A.

FIG. 14A presents a schematic diagram, in perspective view, of an example RF measurement device 1400 that includes an RF waveguide 1434 that is configured to establish a circular polarization in an RF electromagnetic wave. The RF waveguide 1434 is also configured to carry a second RF waveguide mode through an internal cavity 1416 of the example RF measurement device 1400. The second RF waveguide mode may be, for example, a mode of the RF electromagnetic mode interior to the example RF measurement device 1400, such as while traversing the internal cavity 1416. FIGS. 14B and 14C present, respectively, a top perspective view and a top view of the example RF measurement device 1400 of FIG. 14A. The example RF measurement device 1400 shown in FIGS. 14A-14C is analogous, at least in part, to the example RF measurement device 200 described in relation to FIGS. 2A-2D and features common to both FIGS. 14A-14C and FIGS. 2A-2D are related via coordinated numerals that differ in increment by twelve hundred.

In FIGS. 14A-14C, the perimeter wall 1418 encircling the internal cavity 1416 defines a plane of the example RF measurement device 1400. An axis of rotation may be defined relative to this plane. For example, the circular polarization established by the RF waveguide 1434 may have an axis of rotation that is perpendicular to the plane of the example RF measurement device 1400. In some variations, the RF waveguide 1434 includes a planar body that is parallel to the plane of the example RF measurement device 1400. In these variations, the axis of rotation of the circular polarization may be perpendicular to the planar body.

In some implementations, the internal cavity 1416 is an elongated internal cavity that extends along a cavity axis 1404 between first and second ends 1406, 1408 of the example RF measurement device 1400. In these implementations, the RF waveguide 1434 may include an array of segments 1434a that are spaced periodically in an array plane along a direction parallel to the cavity axis 1404. The array plane may be parallel to the plane of the example RF measurement device 1400, and in certain cases, each segment 1434a may be oriented perpendicular to the cavity axis 1404. In some instances, the RF waveguide includes a spine 1434b from which the array of segments 1434a extend. In other instances, the array of segments 1434a is directly attached (e.g., bonded) to a window portion of the example RF measurement device 1400 (e.g., first window portion 1422 or second window portion 1424). In these latter instances, the spine 1434b may be absent from the RF waveguide 1434.

Figure 14D:
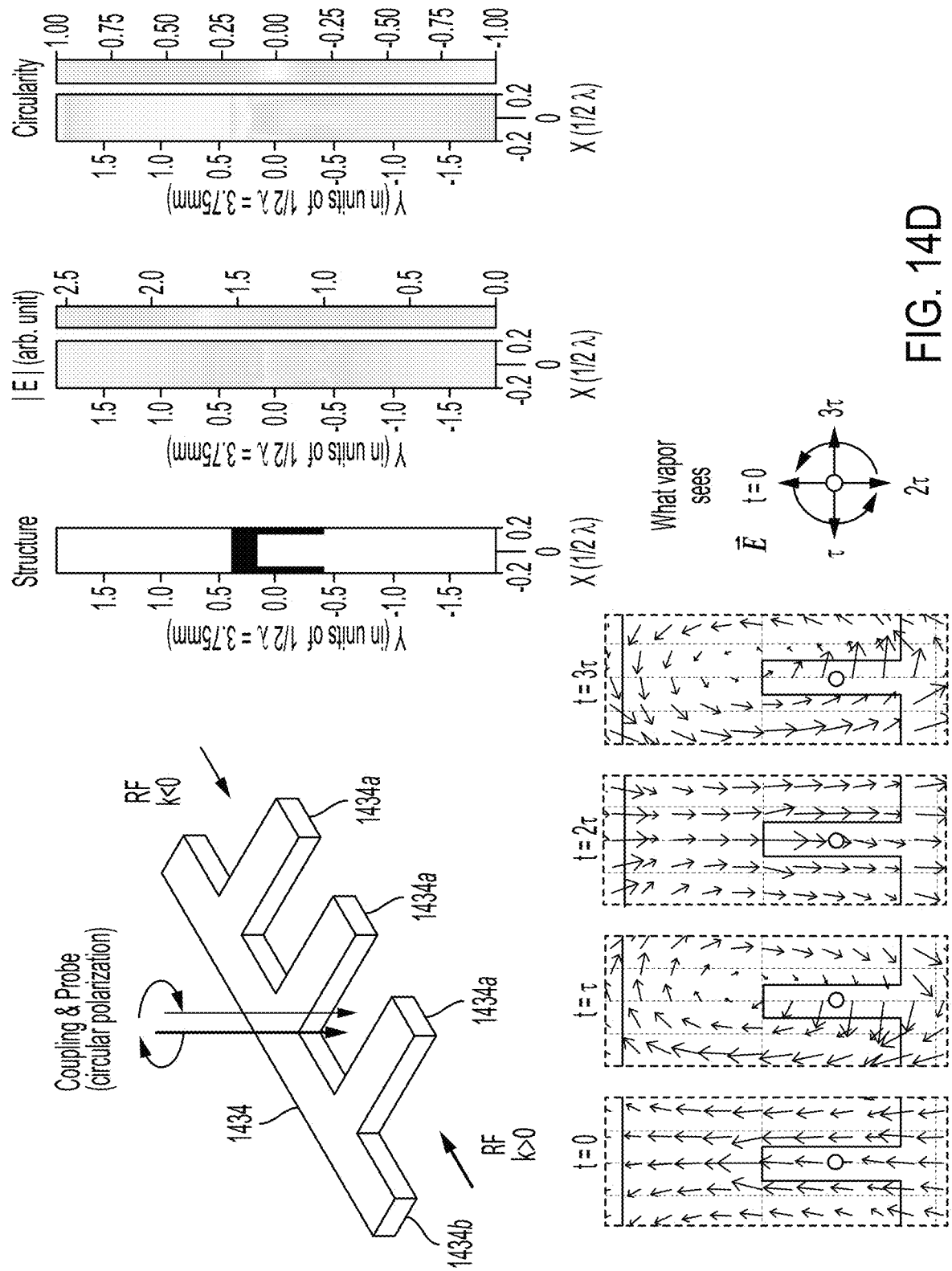
FIG. 14D is a schematic diagram of a portion of the RF waveguide of FIG. 14A, showing a simulated example of the circular polarization that can be established in an RF electromagnetic wave.

FIG. 14D presents a schematic diagram of a portion of the RF waveguide 1434 of FIG. 14A, showing a simulated example of the circular polarization that can be established by the RF waveguide 1434. The circular polarization has a rotational direction that is perpendicular to the plane of the RF waveguide 1434. The lower portion of FIG. 14D presents four graphs showing how the circular polarization may change over a periodic time interval of 4τ. This change may be due, for example, to the RF electromagnetic wave propagating along the RF waveguide 1434. The four graphs indicate the evolution of a vector field at respective times t=0, τ, 2τ, and 3τ proximate the same single segment 1434a of the RF waveguide 1434. The vector field corresponds to an electric field of the RF electromagnetic wave, and each graph shows the magnitude and direction of the electric field at various locations proximate the single segment 1434a and at various times, t.

As can be seen in the four graphs of FIG. 14D, the electric field has a direction of rotation that is perpendicular to the plane of the RF waveguide 1434, thus establishing an axis of rotation for the circular polarization that is also perpendicular to the plane of the RF waveguide 1434. The graphs also show that the helicity of the circular polarization (e.g., its direction of rotation) changes with time as the RF electromagnetic wave propagates along the RF waveguide 1434. For example, the helicity at t=τ is clockwise while the helicity at t=3τ is counterclockwise. The helicity and its change over time can influence the electronic states of the vapor in the internal cavity 1416. As such, the RF waveguide 1434 can be configured to establish a target RF profile in an interaction region 1436 of the internal cavity 1416. For example, the RF waveguide 1434 may be configured to establish a target RF profile in an interaction region adjacent the single segment 1434a of the four graphs. The target RF profile may include the helicity of the circular polarization adjacent the single segment 1434a, including changes to this helicity over time as the RF electromagnetic wave propagates along the RF waveguide 1434. Multiple target RF profiles are possible, such at various locations along the RF waveguide 1434 (e.g., various segments 1434a of the RF waveguide 1434).

FIG. 14D also presents three graphs in the upper right corner that simulate the magnitude of the electric field and the circularity of the polarization. The RF waveguide 1434 includes slots or gaps between the array of segments 1434a. These slots or gaps can assist the segments 1434a in establishing a circular polarization that is quantized in an out-of-plane direction. The vector field graphs at different times show the electric field vector rotating in a circular manner at the position of the vapor, demonstrating circular polarization. The high circularity of the two helicities at t=τ and t=3τ are denoted by a circularity of either −1 or 1, which is shown in the contour graph in the upper right corner of FIG. 14D.

Figure 15A:
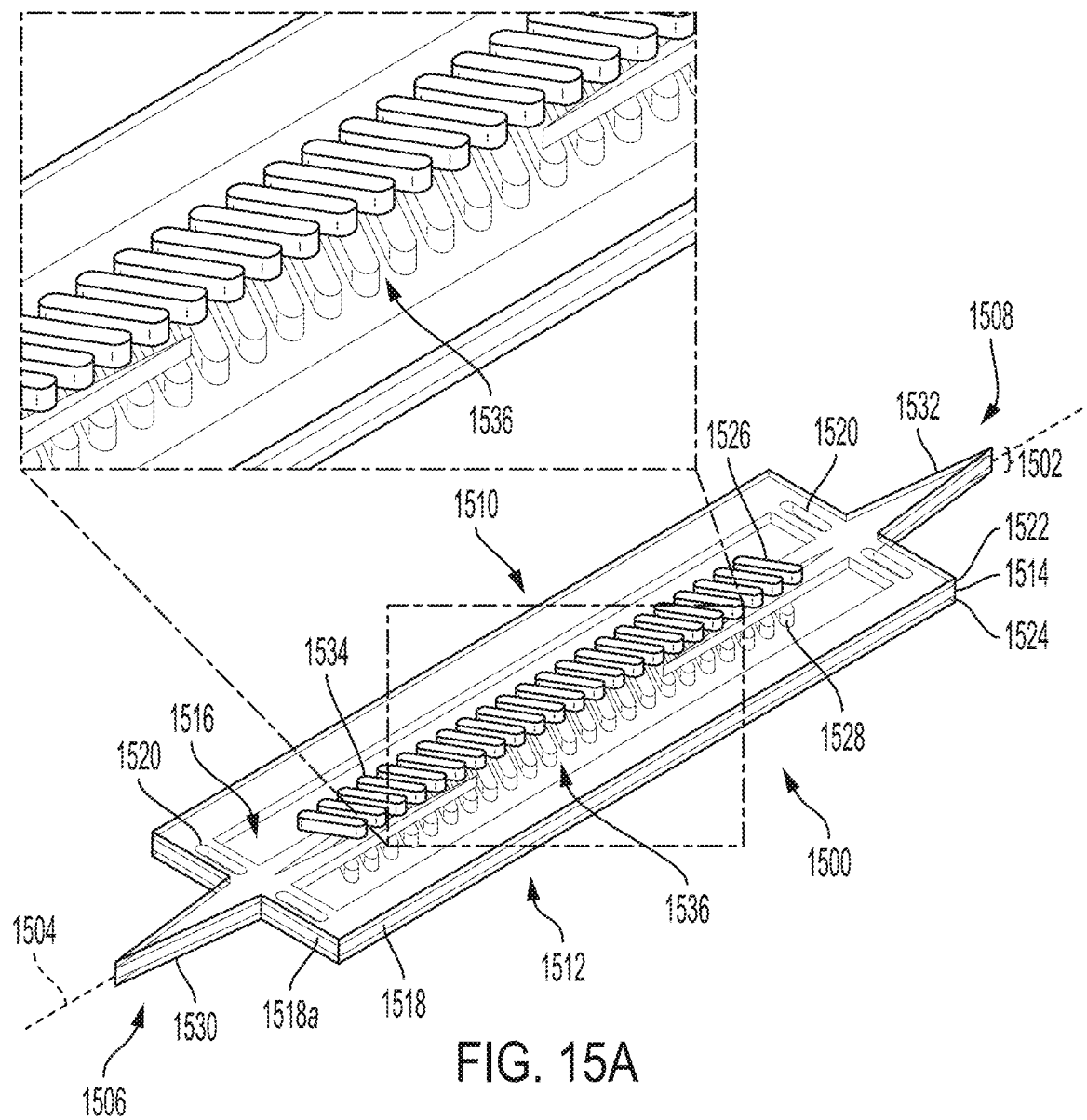
FIG. 15A is a schematic diagram, in perspective view, of an example RF measurement device that includes an RF waveguide that is configured to establish a circular polarization in an RF electromagnetic wave, but parallel to a plane of the example RF measurement device.
Figure 15B:
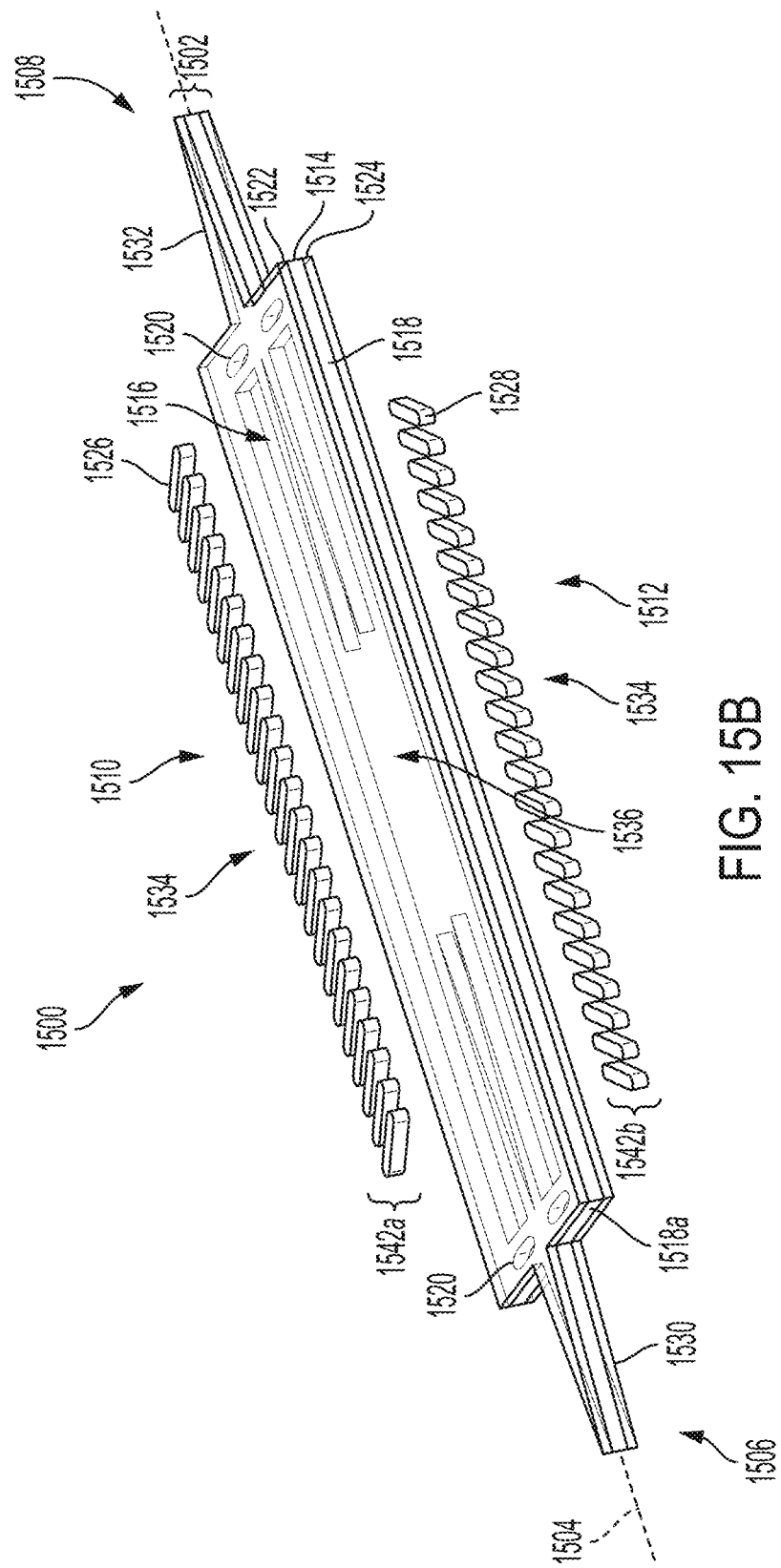
FIG. 15B is a schematic diagram, in an exploded perspective view, of the example RF measurement device of FIG. 15A.
Figure 15E:
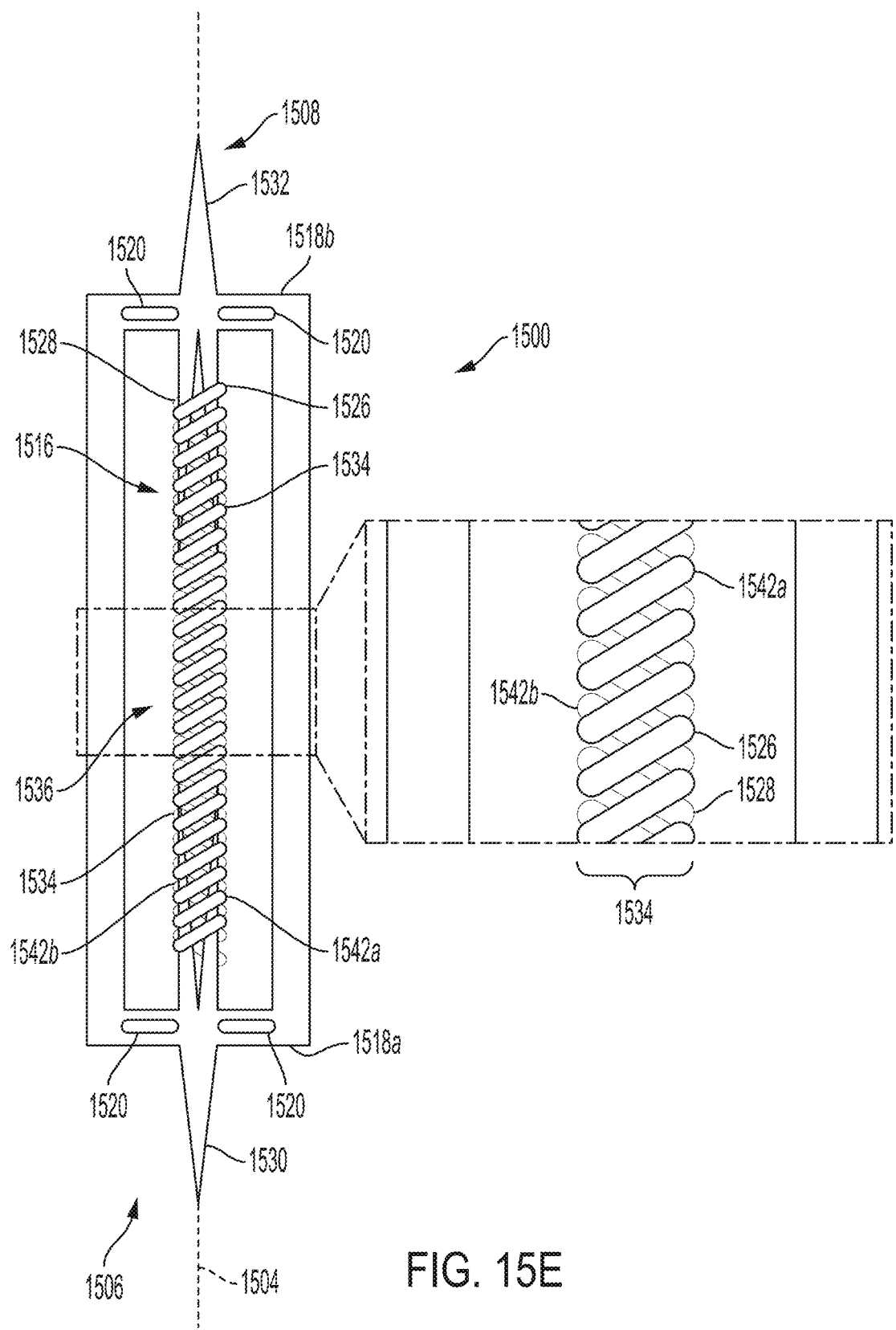
FIG. 15E is a schematic diagram, in top view, of the example RF measurement device of FIG. 15A.

In some implementations, the RF waveguide 1434 is configured to establish a circular polarization that has a rotational direction other than perpendicular to the plane of the example RF measurement device 1400. For example, FIG. 15A presents a schematic diagram, in perspective view, of an example RF measurement device 1500 that includes an RF waveguide 1534 that is configured to establish a circular polarization in an RF electromagnetic wave, but parallel to a plane of the example RF measurement device 1500. The example RF measurement device 1500 of FIG. 15A may be analogous to the example RF measurement device 1400 described in relation to FIGS. 14A-14C and features common to both FIG. 15A and FIGS. 14A-14C are related via coordinated numerals that differ in increment by one hundred. FIGS. 15B-15E present various alternative views of the example RF measurement device of FIG. 15A.

The example RF measurement device 1500 includes an internal cavity 1516, which may be an elongated internal cavity that extends along a cavity axis 1504 between first and second ends 1506, 1508 of the example RF measurement device 1500. The example RF measurement device 1500 also includes an RF waveguide 1534 that is configured to establish a circular polarization in an RF electromagnetic wave. In FIGS. 15A-15F, the circular polarization has an axis of rotation parallel to the cavity axis 1504. A perimeter wall 1518 surrounds, and forms part of the boundary of, the internal cavity 1516 and passes through the first and second mode converters 1530, 1532. Moreover, the perimeter wall 1518 defines a plane of the example RF measurement device 1500, and the cavity axis 1504 and the plane of the example RF measurement device 1500 are parallel to each other.

In some implementations, the RF waveguide 1534 includes an array of segments 1542 spaced periodically along a direction parallel to the cavity axis 1504. In these implementations, the segments 1542 are positioned alternatively above and below a reference plane (e.g., the plane of the example RF measurement device 1500) to define respective first and second sub-arrays of segments 1542a, 1542b. The first and second sub-arrays of segments 1542a, 1542b may be rotated in opposite directions relative to a reference orientation. The reference orientation may, for example, be perpendicular to the cavity axis 1504. In some variations, such as shown in FIGS. 15A-15E, the array of segments 1542 are arranged according to a glide-plane symmetry that, during operation, creates a circular polarization that is quantized in a propagation direction of the RF electromagnetic wave along the RF waveguide 1534.

Figure 15F:
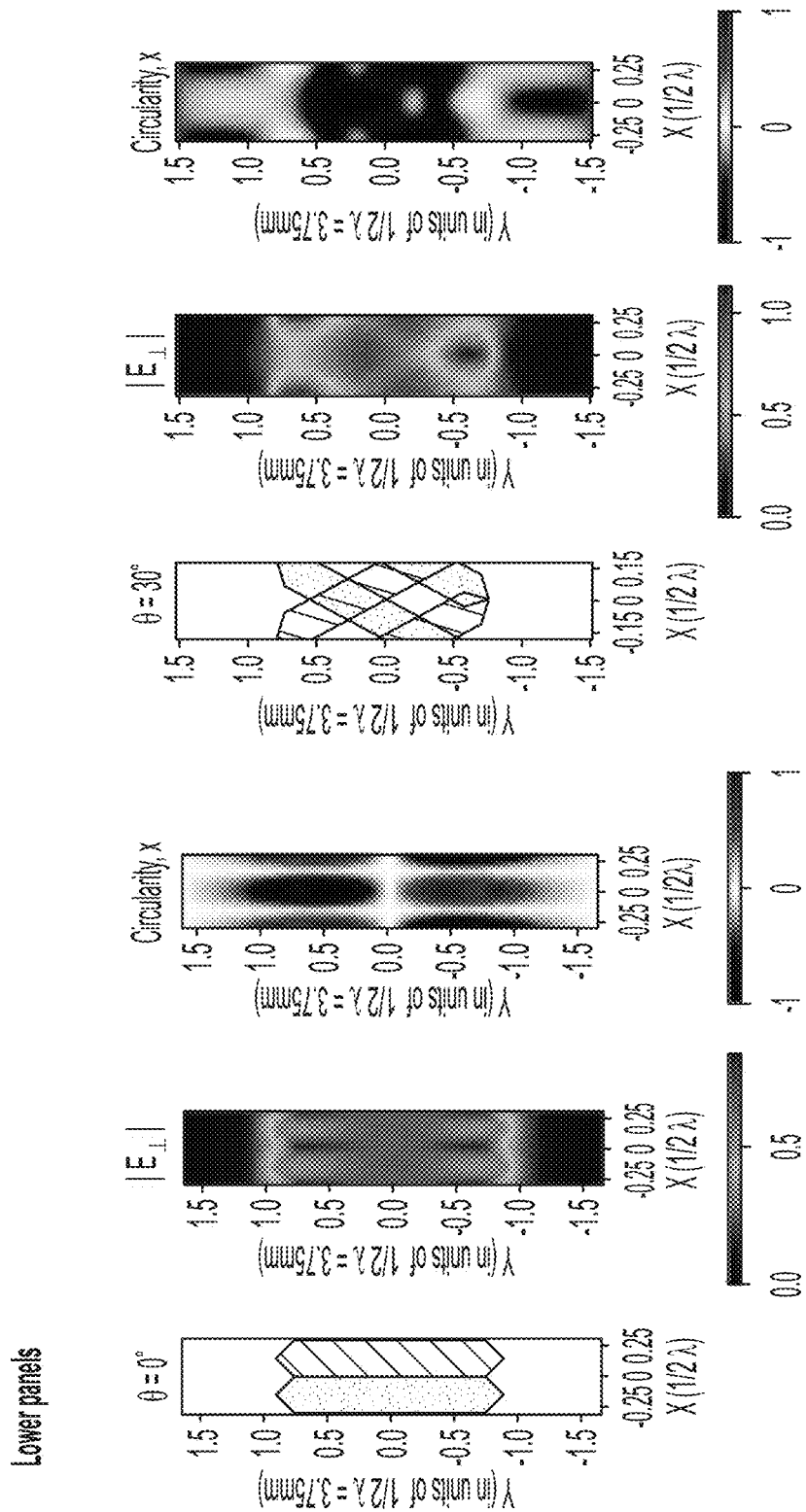
FIG. 15F is a schematic diagram, in top and perspective views, of a portion of an example RF waveguide that is configured to include a glide-plane symmetry.

FIG. 15F presents a schematic diagram, in top and perspective views, of a portion of an example RF waveguide that is configured to include a glide-plane symmetry. The left side of FIG. 15F shows an array of segments that are positioned alternatively above and below a reference plane to form top and bottom sub-arrays. Such alternate positioning may create a glide-plane symmetry in the example RF waveguide. The right side of FIG. 15F shows the top and bottom sub-arrays but canted relative to each other in opposite directions. The array of segments shown in the right side may correspond to a portion of the RF waveguide illustrated in FIGS. 15A-15E. FIG. 15F also presents a series of graphs showing a simulation that quantifies the magnitude of the electric field and the circularity of the polarization for each array configuration shown in FIG. 15F. The graphs associated with the canted configuration show that the counter rotation of the top and bottom sub-arrays serves to establish a circular polarization whose rotational direction is parallel to the propagation direction of an RF electromagnetic wave along the example RF waveguide.

Now referring to FIGS. 14A-14C, array of segments 1434a may define first and second longitudinal portions 1426, 1428 for the RF waveguide 1434 that are disposed on respective, opposite sides of the example RF measurement device 1400 (e.g., first and second sides 1410, 1412). Similarly, the array of segments 1542 shown in FIGS. 15A-15E may each define first and second longitudinal portions 1526, 1528 for the RF waveguide 1534 (e.g., the first and second sub-arrays of segments 1542a, 1542b) that are disposed on respective, opposite sides of the example RF measurement device 1500 (e.g., first and second sides 1510, 1512). These longitudinal portions 1426, 1428, 1526, 1528 may each have apertures therethrough, such as formed by slots or gaps between their segments. The apertures may be part of an optical path that extends through the example RF measurement device 1400, 1500. For example, for the example RF measurement device 1400, an optical path may extend successively through an aperture of the first longitudinal portion 1426, the interaction region 1436, and an aperture of the second longitudinal portion 1428. Multiple optical paths are possible and may involve different pairs of apertures in the first and second longitudinal portions 1426, 1428. Analogous optical paths are possible for the example RF measurement device 1500. During operation, these optical paths may allow the example RF measurement devices 1400, 1500 to receive input optical signals (e.g., laser beams), and in response, generate output optical signals. The output optical signals may include an optical property that represents a property of the RF electromagnetic wave being measured by the example RF measurement devices 1400, 1500.

The RF waveguides 1434, 1534 described in relation to FIGS. 14A-14D and FIGS. 15A-15F can be used to determine a propagation direction of an RF electromagnetic wave. These waveguides are configured to establish a first and second circular polarizations in, respectively, forward and backward propagating RF electromagnetic waves. In doing so, the second circular polarization is established opposite the first circular polarization. For example, the second circular polarization may have a helicity that is opposite that of the first circular polarization. However, the axis of rotation for the RF waveguide 1434 of FIGS. 14A-14D is different than the axis of rotation for the RF waveguide 1534 of FIGS. 15A-15F. The circular polarizations of the RF waveguide 1434 have axes of rotation that are out-of-plane and perpendicular to a propagation direction of the RF electromagnetic wave. In contrast, the circular polarizations of the RF waveguide 1534 have axes of rotation that are in-plane and parallel to a propagation direction of the RF electromagnetic wave. The different configurations of the RF waveguides 1434, 1534 may allow RF measurement devices that incorporate them to be adapted to, for example, different laser beam geometries or systems with magnetic fields. These adaptations, however, retain the ability of the RF measurement devices to resolve forward versus backward propagating RF electromagnetic waves, including forward versus backward propagating components of a single RF electromagnetic wave. In some variations, waves or components are resolved using the stretched states of an electromagnetically induced transparency (EIT) system, such as found in a vapor that includes Ryberg atoms or molecules.

FIGS. 14A-14D show a photonic waveguide that creates a circular polarization with an axis perpendicular to the device plane. The periodic lattice of dielectric structures approximates electric dipoles with relative phase delays that are controlled by an RF propagation constant. The total electric field of these dipoles at a given point becomes circular if the correct phase is chosen. Circular polarization of near-unity purity is created in a region with a strong electric field to facilitate vapor-RF interactions. In this configuration, the circular polarization is along an axis perpendicular to the device plane. The RF wave polarization axis is parallel to the optical access for the optical signals (e.g., laser beams), therefore creating a shared quantization direction for the RF, laser, and vapor states (e.g., states of Rydberg atoms or molecules).

By comparison, the lattice shown in FIGS. 15A-15F is made from staggered silicon blocks that are rotated by an angle, denoted by $\theta$ but in opposite directions. This configuration creates circular polarization with a quantization axis within the device plane and parallel to the RF propagation direction. In this configuration, and with suitable optics to arrange the optical signals (e.g., laser beams) in the same plane, the interaction volume of the vapor (e.g., an atomic or molecular vapor) with the optical signals and the RF wave can be increased. The circular polarization may be created by system symmetry. If the overall period of the array of segments 1542 is a for both the top 1542a and bottom 1542b set of blocks, the two layers are shifted (or staggered) with respect to each other by $\alpha/2$. The structure has a glide plane symmetry, which is represented by an $\alpha/2$ translation and a flip of the structure so the top becomes the bottom and vice versa. The $\alpha/2$ translation and the flip do not change the structure. Moreover, the structure has the glide plane symmetry in addition to the periodicity in a. The rotation by $\theta$ of the respective layers breaks the right-left mirror symmetry, thereby changing how a forward and backward propagating RF electromagnetic wave is circularly polarized.

With either configuration shown in FIGS. 14A-14D and FIGS. 15A-15F, one can independently distinguish and measure reflected and transmitted RF electromagnetic waves in an RF circuit using the example RF measurement devices 1400, 1500. With these configurations, the response of the vapor in the example RF measurement devices 1400, 1500 can be made to be sensitive to the RF electromagnetic wave polarization. For example, the vapor may include a vapor of Rydberg atoms (e.g., Group IA atoms such as Cs or Rb). The input optical signals can be polarized such that they excite the stretched hyperfine states of a Rydberg atom launch (or sensing state), which are the stretched states of the overall atomic system shown in FIG. 16A.

Figure 16A:
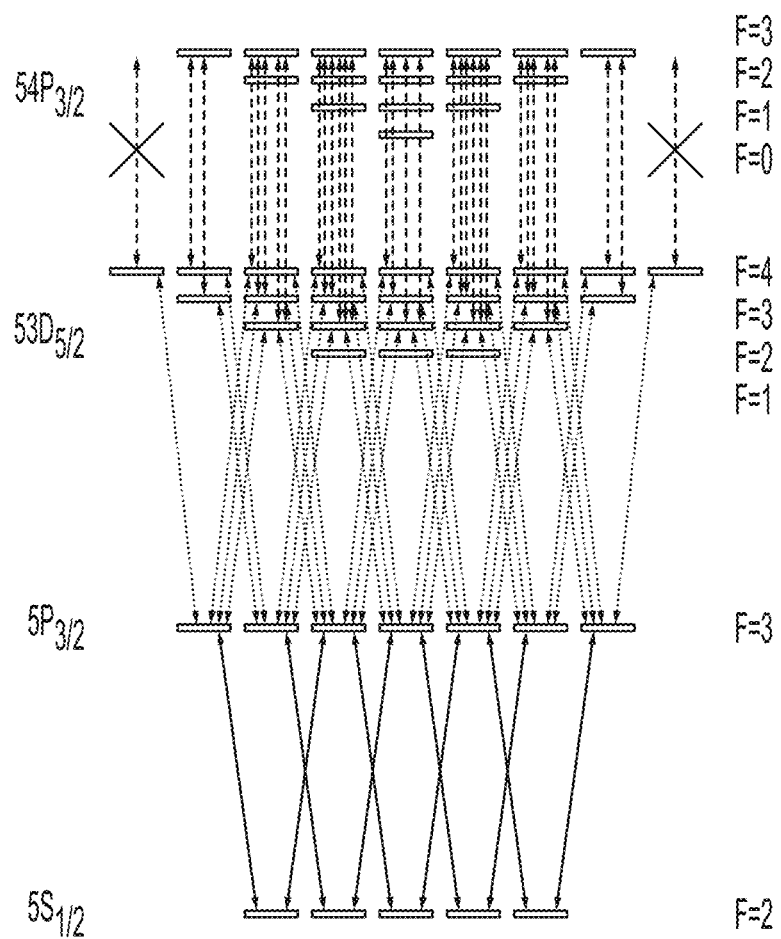
FIG. 16A is an example energy level diagram for Rydberg atom-based sensing using electromagnetically induced transparency (EIT) in a rubidium vapor.

FIG. 16A presents an example energy level diagram for Rydberg atom-based sensing using electromagnetically induced transparency (EIT) in a rubidium vapor. The sensing transition, which is resonant with the RF electromagnetic wave, is the $53D_{5/2}$ to $54P_{3/2}$ transition shown in FIG. 16A. This sensing transition may be influenced by input optical signals, such as a probe optical signal and a coupling optical signal. If the probe and coupling optical signals have the same circular polarization (e.g., same helicity) then they will optically pump atoms in the rubidium vapor to the most extreme states on the edges of the example energy level diagram due to the atomic selection rules for the different electronic transitions. Although the energy levels of the atoms can be degenerate or near degenerate, the sub-levels are nevertheless non-uniformly populated because of the selection rules. Right circularly polarized light (sigma plus) will pump the system to the right-hand side stretched state via $\Delta m_F=+1$ transitions, while left circularly polarized light (sigma minus) will pump the system to the left stretched state, via $\Delta m_F=-1$ transitions. If the F quantum number (hyperfine) of the RF coupled state ($54P_{3/2}$ in the case shown) is less than the launch state ($53D_{5/2}$ in the case shown) then the spectra will depend on the RF electromagnetic field polarization. If the input optical signals are right-hand circular polarized then the RF electromagnetic field polarization has to be left circularly polarized to observe a RF electromagnetic field induced splitting of the EIT resonance. If the input optical signals are left-handed circularly polarized then the RF electromagnetic field must be right hand circularly polarized to observe an RF electromagnetic field induced EIT splitting.

Figure 16B:
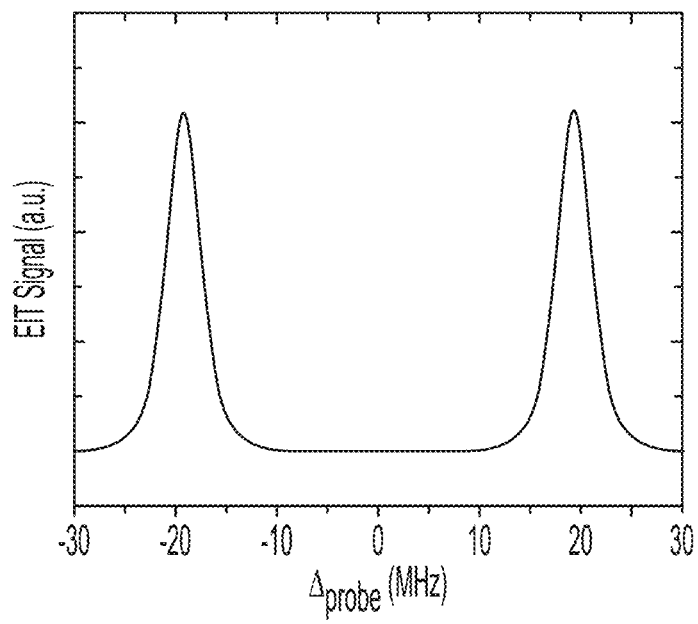
FIG. 16B is a graph that shows a representative EIT signal when the field of an RF electromagnetic wave drives a $53F_{5/2}$ to $53P_{3/2}$ sensing transition.
Figure 16C:
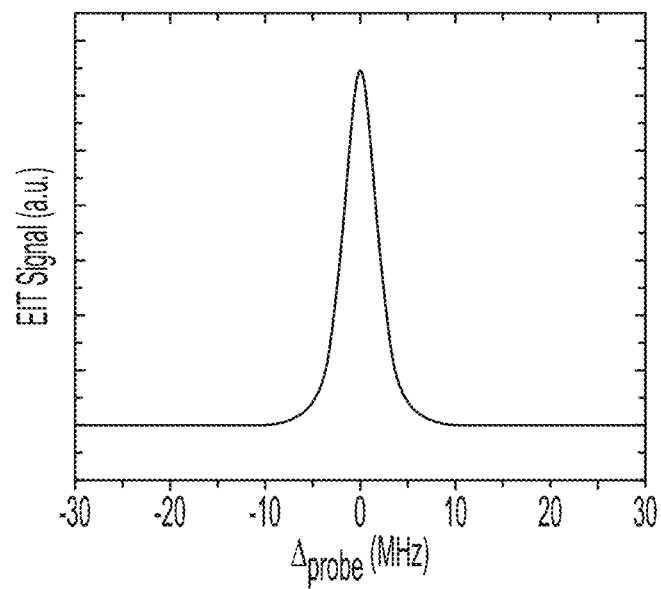
FIG. 16C is a graph that shows a representative EIT spectrum when the RF electromagnetic wave of FIG. 16A is unable drive the sensing transition.

In FIG. 16A, the generic allowed transitions are shown for a circular polarization of the two input optical signals on the probe (e.g., $5S_{1/2}$ to $5P_{3/2}$) and coupling transitions ($53D_{5/2}$ to $54P_{3/2}$). If both optical signals have the same helicity, then the extreme side of the diagram (right or left side) is populated. Repeated transitions drive the system to the F=4, mF=4 or F=4, mF=-4 state by $\Delta m_F=+1$ or $\Delta m_F=-1$ transitions, respectively. Recall circular polarization will drive transitions that change the $m_F$ state. In either of these cases, linear, or the wrong circularly polarized, RF radiation will not couple the $53D_{5/2}$ to the $54P_{3/2}$ state. On the other hand, if the RF electromagnetic wave has the opposite helicity to the input optical signals, the field of the RF electromagnetic wave can drive the $53D_{5/2}$ to $54P_{3/2}$ transition, resulting in an electromagnetically induce transmission (EIT) feature that is Autler-Townes split and reflects the amplitude of the RF field. The structure of the vapor cell (or RF waveguide surrounding the vapor cell) maps the direction of wave propagation to the helicity of its field so the amplitude of the forward vs. backward propagating RF electromagnetic waves can be determined. FIG. 16B presents a graph that shows a representative EIT spectrum when the field of an RF electromagnetic wave drives a $53F_{5/2}$ to $53P_{3/2}$ sensing transition. FIG. 16B presents a graph that shows a representative EIT spectrum when the RF electromagnetic wave of FIG. 16A is unable drive the sensing transition. If both backward and forward RF electromagnetic waves are propagating in the RF measurement device, the observed spectrum can be a combination of FIGS. 16B and 16C. The maximum F quantum number of the upper state must be less than that of the launch state for the selection rules illustrated in FIG. 16A to work in the manner described.

Since the example RF measurement devices 1400, 1500 in FIGS. 14A-14D and FIGS. 15A-15E can produce a first helicity for the RF electromagnetic wave if it travels in one direction and a second, opposite helicity if it travels in an opposite direction, the power of RF electromagnetic wave, for example, can be non-destructively determined for a particular direction of propagation. The optical signal polarizations can be rotated to measure the forward and backward propagating RF waves. However, the example RF measurement devices 1400, 1500 could also have two different interaction regions, one where a backward propagating RF wave is sensed and one where a forward RF propagating wave is sensed. The regions could have, for example, opposite optical signal polarizations. In many implementations, the example RF measurement devices 1400, 1500 function as a directionally sensitive non-destructive in-line power sensor. Moreover, quantities like reflection and transmission through an RF circuit can be measured, which can allow an operator of the RF circuit to understand how its pieces are electrically matched.

In some implementations, a method for measuring radio frequency (RF) signals, such as the example RF measurement devices 1400, 1500 described in relation to FIGS. 14A-14D and FIG. 15A-15E, includes passing two or more input optical signals through a vapor to generate an output optical signal. The input optical signals are circularly polarized, and the vapor is part of an RF measurement device. Moreover, the vapor includes Rydberg atoms or molecules. The RF measurement device includes first and second mode converters in which each mode converter is configured to convert a mode of an RF electromagnetic wave between a first RF waveguide mode and a second RF waveguide mode. The RF measurement device also includes an internal cavity containing the vapor and disposed between the first and second mode converters. An RF waveguide extends between the first and second mode converters and is configured to carry the second RF waveguide mode through the internal cavity. The RF waveguide is also configured to establish a circular polarization in the RF electromagnetic wave.

The method also includes receiving, at the first mode converter of the RF measurement device, the RF electromagnetic wave from a test RF waveguide. The mode of the RF electromagnetic wave may be set by the test RF waveguide to be the first RF waveguide mode. The method includes converting, by operation of the first mode converter, the mode of the RF electromagnetic wave from the first RF waveguide mode to the second RF waveguide mode. The method also includes guiding, by operation of the RF waveguide, the RF electromagnetic wave through the internal cavity from the first mode converter to the second mode converter, thereby altering a profile of the RF electromagnetic wave to comprise a circular polarization. The circular polarization may be a new circular polarization in the profile of the RF electromagnetic wave (e.g., where there was previously none) or the alteration of a previous circular polarization. The method additionally includes converting, by operation of the second mode converter of the RF measurement device, the mode of the RF electromagnetic wave from the second RF waveguide mode to the first RF waveguide mode. In some implementations, the RF electromagnetic wave is also transmitted from the second mode converter to the test RF waveguide (or RF port thereof).

In many implementations, the method includes measuring, by operation of an optical detector, an optical property of the output optical signal. Examples of the optical property include an amplitude of the output optical signal, a frequency of the output optical signal, a phase of the output optical signal, and a polarization of the output optical signal. Combinations of these optical properties are possible. In these implementations, the optical property may represent a property of the RF electromagnetic wave. For example, the optical property may represent a power of the RF electromagnetic wave, a frequency of the RF electromagnetic wave, a phase of the RF electromagnetic wave, or a polarization of the RF electromagnetic wave. Other properties are possible, including combinations of RF wave properties.

In some implementations, the two or more input optical signals include a probe optical signal that is circularly polarized. In these implementations, passing the two or more input optical signals through the vapor may include interacting the probe optical signal with the vapor to alter an optical property of the probe optical signal. The optical property of the probe optical signal, when altered, can serve to define an optical property of the output optical signal. In further implementations, the two or more input optical signals include a coupling optical signal. The coupling optical signal may be circularly polarized. In these latter implementations, passing the two or more input optical signals through the vapor then includes interacting the coupling optical signal with the vapor to assist in altering the optical property of the probe optical signal.

In some implementations, the RF waveguide includes first and second longitudinal portions disposed on respective, opposite sides of the RF measurement device. The first and second longitudinal portions may be configured to establish a target RF profile in an interaction region of the internal cavity, and the target RF profile may include the circular polarization. Guiding the RF electromagnetic wave may then include altering, by operation of the first and second longitudinal portions, the profile of the RF electromagnetic wave to match the target RF profile.

In some implementations, the RF measurement device includes a perimeter wall that surrounds the internal cavity and passes through the first and second mode converters. The perimeter wall includes a pattern of holes that is disposed adjacent to one or both of the first and second mode converters. The pattern of holes may be configured to reduce transmission losses through the RF measurement device, such as described in relation to FIGS. 7-9B.

In some implementations, the RF measurement device includes a perimeter wall that surrounds the internal cavity and passes through the first and second mode converters. The perimeter wall may define a plane of the RF measurement device, which may serve to establish an axis of rotation for the circular polarization or its helicity. For example, the circular polarization may have an axis of rotation that is perpendicular to the plane of the RF measurement device. In these cases, the internal cavity may be an elongated internal cavity that extends along a cavity axis between first and second ends of the RF measurement device. Moreover, the RF waveguide may include an array of segments that are spaced periodically in an array plane along a direction parallel to the cavity axis, and the array plane may be parallel to the plane of the RF measurement device. An example of this configuration is described in relation to FIGS. 14A-14D. In this configuration, the operation of guiding the RF electromagnetic wave through the internal cavity may include interacting the RF electromagnetic wave with the array of segments to alter the profile of the RF electromagnetic wave.

As another example, the circular polarization may have an axis of rotation that is parallel to the cavity axis. The internal cavity may also be an elongated internal cavity that extends along a cavity axis between first and second ends of the RF measurement device. In these cases, the RF waveguide may include an array of segments that are spaced periodically along a direction parallel to the cavity axis. The segments may be positioned alternatively above and below a reference plane to define respective first and second sub-arrays of segments, and the first and second sub-arrays of segments may be rotated in opposite directions relative to a reference orientation. An example of this configuration is described in relation to FIGS. 15A-15F. In this configuration, the operation of guiding the RF electromagnetic wave through the internal cavity may include interacting the RF electromagnetic wave with the first and second sub-arrays of segments to alter the profile of the RF electromagnetic wave.

In some implementations, the method may be used to measure two or more RF electromagnetic waves. Such measurement may be at different times for each RF electromagnetic waves or concurrent. For example, the RF electromagnetic wave may be a first RF electromagnetic wave, and the circular polarization may be a first circular polarization having a first rotational direction. In such cases, the method includes receiving, at the second mode converter, a second RF electromagnetic wave from the test RF waveguide. The mode of the second RF electromagnetic wave is set by the test RF waveguide to be the first RF waveguide mode. The method also includes converting, by operation of the second mode converter, the mode of the second RF electromagnetic wave from the first RF waveguide mode to the second RF waveguide mode. The second RF electromagnetic wave may then be guided (e.g., by operation of the RF waveguide) through the internal cavity from the second mode converter to the first mode converter. Such guidance alters a profile of the second RF electromagnetic wave to include a second circular polarization having a second rotational direction. The second rotational direction is opposite the first rotational direction of the first circular polarization. The method additionally includes converting, by operation of the first mode converter, the mode of the second RF electromagnetic wave from the second RF waveguide mode to the first RF waveguide mode. In many variations, the first RF electromagnetic wave is transmitted from the second mode converter to the test RF waveguide and the second RF electromagnetic wave is transmitted from the first mode converter to the test RF waveguide.

The RF measurement device may be configured to allow the method to be used to measure the two or more RF electromagnetic waves. For example, the RF waveguide may include first and second longitudinal portions disposed on respective, opposite sides of the RF measurement device. These portions may be configured to establish a first target RF profile in a first interaction region of the internal cavity and a second target RF profile in a second interaction region of the internal cavity. The first target RF profile may include a first circular polarization, and the second target RF profile may include a second circular polarization. In these cases, the second circular polarization is opposite in direction of the first circular polarization. In these cases, the method may also include altering, by operation of the portions, the profile of the first RF electromagnetic wave to match the first target RF profile as well as altering, by operation of the portions, the profile of the second RF electromagnetic wave to match the second target RF profile.

In some implementations, the first and second longitudinal portions may each have first and second apertures therethrough. In these implementations, passing two or more input optical signals through a vapor can include propagating the two or more input optical signals along first and second optical paths. The first optical path extends successively through the first aperture of the first longitudinal portion, the first interaction region, and the first aperture of the second longitudinal portion. Similarly, the second optical path extends successively through the second aperture of the first longitudinal portion, the second interaction region, and the second aperture of the second longitudinal portion.

Figure 17:
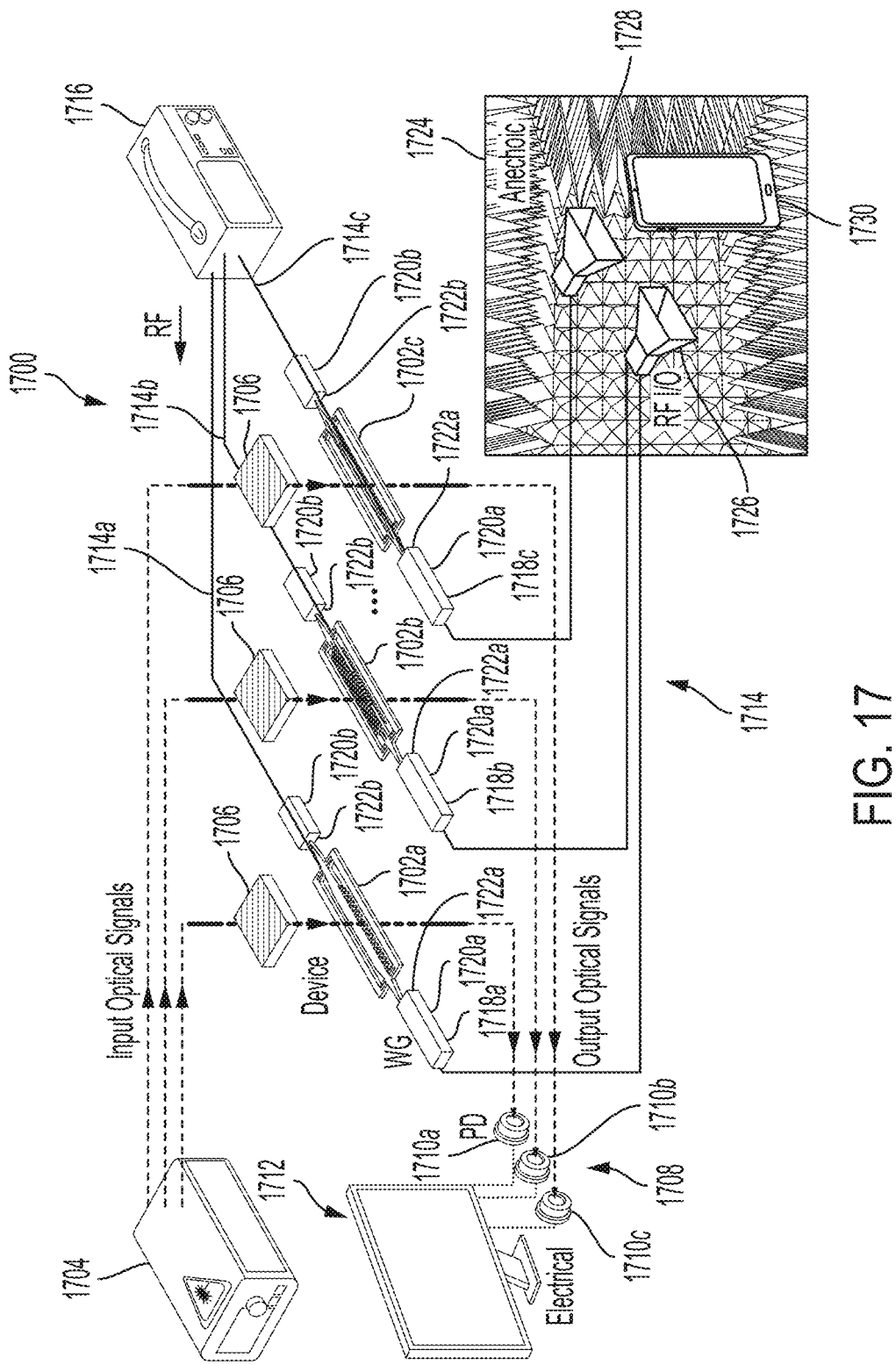
FIG. 17 is a schematic diagram of an example system that includes an RF measurement device.

The RF measurement devices disclosed herein may, in some variations, be part of a system, such as a system for measuring RF electromagnetic waves. In certain cases, the RF electromagnetic waves may define all or part of an RF signal. For example, FIG. 17 presents a schematic diagram of an example system 1700 that includes an RF measurement device 1702. The RF measurement device 1702 may be analogous to the example RF measurement devices 100, 200, 1000, 1400, 1500 described in relation to FIGS. 1A-16C. However, other configurations are possible for the RF measurement device 1702. The example system 1700 may include multiple instances of the RF measurement device 1700. FIG. 17 illustrates an embodiment in which the example system 1700 includes three RF measurement devices 1702a, 1702b, 1702c. However, other numbers of RF measurement devices 1702 are possible, and the RF measurement devices 1702 need not be configured identically.

The example system 1700 may include a laser system 1704 that is configured to generate a plurality of input optical signals. The laser system 1704 may, in certain cases, include a laser to generate each of the input optical signals. However, other configurations are possible for the laser system 1704. For example, the laser system 1704 may include a single laser to generate two or more of the input optical systems. The laser system 1704 may also include optical elements 1706 configured to alter an optical property of an input optical signal, such as intensity, a frequency, a polarization, or a phase of the input optical system. For instance, the laser system 1704 may include a gradient-index polarization control (GRIN-PC) lens to generate an input optical signal that is polarized (e.g., linearly polarized, circularly polarized, etc.). In some variations, the laser system 1704 is configured to generate input optical signals that are each circularly polarized. In these variations, the RF measurement devices 1702 may each have a target RF profile (e.g., in the interaction region of an internal cavity) that includes a circular polarization. In many implementations, such as shown in FIG. 17, the laser system 1704 is optically coupled to the RF measurement devices 1702 such that each RF measurement device receives the plurality of input optical signals. Such optical coupling may occur via respective optical fibers.

The example system 1700 may also include an optical detector system 1708 that is configured to generate a detector signal in response to receiving an output optical signal from one or more of the RF measurement devices 1702a, 1702b, 1702c. The detector signal may represent an optical property of the output optical signal, such as an amplitude of the output optical signal, a frequency of the output optical signal, a phase of the output optical signal, or a polarization of the output optical signal. Other optical properties are possible, and the detector signal may represent more than one optical property. In some variations, the optical detector system 1708 includes a photodetector 1710 (e.g., a photodiode) that is optically coupled to an RF measurement device 1702. Such optical coupling may occur via an optical fiber. FIG. 17 depicts an embodiment in which each photodetector 1710 is optically coupled to a single RF measurement device 1702. In this embodiment, the photodetector 1710a is optically coupled to the RF measurement device 1702a; the photodetector 1710b is optically coupled to the RF measurement device 1702b; and photodetector 1710c is optically coupled to the RF measurement device 1702c. Moreover, each photodetector 1710 is configured to generate a detector signal in response to receiving an output optical signal from its respective RF measurement device 1702.

The example system 1700 may additionally include a signal processing system 1712 that is configured to generate data in response to receiving a detector signal. The signal processing system 1712 may include one or more processors (e.g., an FPGA, an ASIC, etc.) and one or more memories to generate such data. The data may represent the property of an RF electromagnetic wave propagating along an RF measurement device 1702. Examples of the property include the power of the RF electromagnetic wave, a frequency of the RF electromagnetic wave, a phase of the RF electromagnetic wave, and a polarization of the RF electromagnetic wave. Other properties are possible, and the data may represent more than one property. In the example shown in FIG. 17, the signal processing system 1712 is configured to generate data that is based on the detector signal from each photodetector 1710. The data may include a subset of data for each photodetector, and the subset may represent the property of an RF electromagnetic wave traversing the RF measurement device 1702 of the photodetector 1710.

In some implementations, the example system 1700 includes an RF circuit 1714 and an RF control system 1716. The RF control system 1716 may be configured to generate RF signals for, and receive RF signals from, the RF circuit 1714. For example, the RF control system 1716 may be configured to generate RF signals that propagate along first and second branches 1714a, 1714b of the RF circuit 1714. The RF control system 1716 may also be configured to receive an RF signal from a third branch 1714c of the RF circuit 1714. Each branch 1714a, 1714b, 1714c of the RF circuit 1714 may include a test RF waveguide 1718 that has first and second RF ports 1720a, 1720b and an RF pathway therebetween. An RF measurement device 1702 may be disposed along the RF pathway and aligned therewith, thus creating an in-line orientation for the RF measurement device 1702. For example, the RF circuit 1714 may include a first test RF waveguide 1718a, a second test RF waveguide 1718b, and a third test RF waveguide 1718c dispose on, respectively, the first branch 1714a, the second branch 1714b, and the third branch 1714c. The RF ports 1720a, 1720b of the first test RF waveguide 1718a may include the first RF measurement device 1702a disposed therebetween; the RF ports 1720a, 1720b of the second test RF waveguide 1718b may include the second RF measurement device 1702b disposed therebetween; and the RF ports 1720a, 1720b of the third test RF waveguide 1718c may include the third RF measurement device 1702c disposed therebetween.

In some variations, the first and second RF ports 1720a, 1720b include, respectively, first and second waveguide flanges 1722a, 1722b. In these variations, the RF measurement devices 1702 may include a housing (not shown) that extends between the first and second waveguide flanges 1722a, 1722b. The housing may include first and second housing flanges that are coupled to, respectively, the first and second waveguide flanges 1722a, 1722b. The housing may also contain an internal cavity of the RF measurement device 1702, an RF waveguide of the RF measurement device 1702, and at least part of each of the first and second mode converters of the RF measurement device 1702. In many cases, the housing and its flanges are analogous to the housing and flanges described in relation to the example RF measurement device 1000 of FIG. 10.

In some implementations, the branches 1714a, 1714b, 1714c terminate in respective ends that are downstream of their respective RF waveguides 1718a, 1718b, 1718c. These ends may reside in an RF anechoic chamber 1724 of the example system 1700 and may include an input or output RF waveguide. For example, in FIG. 17, the ends of the first and second branches 1714a, 1714b include a transmitting antenna 1726. The end of the third branch 1714c includes a receiving antenna 1728, which is configured to receive RF electromagnetic waves from the RF anechoic chamber 1722. During operation of the example system 1700, these latter waves may be received by the receiving antenna 1728 after interaction with a device-under-test (DUT) 1730.

During operation, the RF measurement devices 1702 may be used to monitor the performance of the RF circuit 1714 by measuring properties of the RF electromagnetic waves that propagate along each of the branches 1714a, 1714b, 1714c. Such monitoring may include determining a difference between the properties of an outgoing RF electromagnetic wave and an incoming RF electromagnetic wave. For example, the outgoing RF electromagnetic wave may propagate away from the RF control system 1716 along the first branch 1714a. The incoming RF electromagnetic wave may then propagate back towards the RF control system 1716 along the third branch 1714c. The difference in properties may allow the example system 1700 to determine one or more characteristics of the device-under-test 1728. Moreover, this difference may be used by the RF control system 1716 to set (or alter) one or more properties of the outgoing RF electromagnetic wave before the wave enters the RF circuit 1714.

In operation, the laser system 1704 may generate a plurality of input optical signals, and these signals may pass through a vapor of an RF measurement device 1702 to generate an output optical signal. In some variations, the laser system 1704 may generate an instance of the plurality of input optical signals for each RF measurement device 1702. For example, the laser system 1704 may generate a first plurality of input optical signals for the first RF measurement device 1702a, a second plurality of input optical signals for the second RF measurement device 1702b, and a third plurality of input optical signals for the third RF measurement device 1702c. As such, the first RF measurement device 1702a may receive the first plurality of input optical signals to generate a first output optical signal, the second RF measurement device 1702b may receive the second plurality of input optical signals to generate a second output optical signal, and the third RF measurement device 1702c may receive the third plurality of input optical signals to generate a third output optical signal.

The RF control system 1716 may also generate RF signals for the RF circuit 1714. Such generation may be concurrent with the generation of the plurality of input optical signals. In many variations, the RF signals are defined by respective RF electromagnetic waves that propagate along the RF circuit 1714. For example, the RF control system 1716 may generate first and second RF electromagnetic waves that propagate along, respectively, the first and second branches 1714a, 1714b. A third RF electromagnetic wave may propagate along the third branch 1714c after being received by the input RF waveguide 1724. Within each branch of the RF circuit 1714, such propagation may allow the RF electromagnetic wave to be transmitted along an RF pathway that extends through an RF measurement device 1702 and between the first and second RF ports 1720a, 1720b of a test RF waveguide 1718.

Transmission of the RF electromagnetic wave through an RF measurement device 1702—and in particular through an internal cavity therein—allows the RF electromagnetic wave to interact with the vapor of the RF measurement device 1702. Such interaction may alter the optical property of an input optical signal as the plurality of input optical signals pass through the vapor. In some instances, the altered input optical signal corresponds to the output optical signal that is generated by the RF measurement device 1702. In implementations where the RF measurement device 1702 includes the housing, the housing may guide the RF electromagnetic wave from a first housing flange to a second housing flange. As such, the housing may be operable to restrict the RF electromagnetic wave to a volume that closely matches that of the RF measurement device 1702. Such matching may reduce or eliminate transmission losses that might otherwise occur if the RF electromagnetic wave were to enter an ambient environment of the RF measurement device 1702.

When the optical detector system 1708 receives an output optical signal, the optical detector system 1708 may generate a detector signal in response that represents an optical property of the output optical signal. In FIG. 17, each photodetector 1710 receives an output optical signal from one of the RF measurement devices 1702, and in response, generates a detector signal that represents an optical property of the output optical signal. The photodetectors 1710 may thus allow the optical detector system 1708 to generate respective detector signals that are associated with a single RF measurement device 1702. The detector signal from the optical detector system 1708 is then transmitted to the signal processing system 1712, which in turn, generates data representing the property of an RF electromagnetic wave in the RF circuit 1714. For example, the signal processing system 1712 may receive a first detector signal from the first photodetector 1710a, and in response, generate data representing a property of the first RF electromagnetic wave as it traverses the first RF measurement device 1702a. An analogous operation occurs for each of the second and third photodetectors 1710b, 1710c.

In some aspects of what is described, a device may be described by the following examples. The device may, in certain cases, be used to measure a property of a radio frequency (RF) electromagnetic wave.

Example 1. A radio frequency (RF) measurement device, comprising:
  first and second mode converters, each configured to convert a mode of an RF electromagnetic wave between a first RF waveguide mode and a second RF waveguide mode;
  an internal cavity between the first and second mode converters that contains a vapor or a source of the vapor, the vapor comprising Rydberg atoms or molecules; and
  an RF waveguide extending between the first and second mode converters and configured to carry the second RF waveguide mode through the internal cavity.

Example 2. The RF measurement device of example 1, wherein the RF waveguide comprises:
  first and second longitudinal portions disposed on respective, opposite sides of the RF measurement device and configured to establish a target RF profile in an interaction region of the internal cavity.

Example 3. The RF measurement device of example 2,
wherein the first longitudinal portion has a first aperture therethrough;
wherein the second longitudinal portion has a second aperture therethrough; and
wherein an optical path extends successively through the first aperture, the interaction region, and the second aperture.

Example 4. The RF measurement device of example 2,
wherein the first longitudinal portion comprises a first pair of longitudinal bodies that extend along a length of the first longitudinal portion and straddle a first elongated aperture through the first longitudinal portion;
wherein the second longitudinal portion comprises a second pair of longitudinal bodies that extend along a length of the second longitudinal portion and straddle a second elongated aperture through the second longitudinal portion; and
wherein an optical path extends successively through the first elongated aperture, the interaction region, and the second elongated aperture.

Example 5. The RF measurement device of example 2 or any one of examples 3-4, wherein the target RF profile comprises a parabolic electric field intensity.

Example 6. The RF measurement device of example 2 or any one of examples 3-5, wherein the target RF profile comprises a uniform electric field intensity.

Example 7. The RF measurement device of example 1 or any one of examples 2-6, wherein the first and second mode converters are adiabatic mode converters.

Example 8. The RF measurement device of example 1 or any one of examples 2-7,
wherein the first mode converter is an input mode converter configured to convert the first RF waveguide mode to the second RF waveguide mode as the RF electromagnetic wave propagates toward the internal cavity; and
wherein the second mode converter is an output mode converter configured to convert the second RF waveguide mode to the first RF waveguide mode as the RF electromagnetic wave propagates away from the internal cavity.

Example 9. The RF measurement device of example 1 or any one of examples 2-8, comprising:
a perimeter wall that surrounds the internal cavity and passes through the first and second mode converters.

Example 10. The RF measurement device of example 9, wherein the perimeter wall comprises a pattern of holes that is disposed adjacent one or both of the first and second mode converters.

Example 11. The RF measurement device of example 9 or example 10,
wherein the internal cavity is an elongated internal cavity that extends along a cavity axis between first and second ends of the RF measurement device; and
wherein the first and second mode converters are aligned with the cavity axis and disposed at, respectively, the first and second ends of the RF measurement device.

Example 12. The RF measurement device of example 11,
wherein the first and second mode converters have respective exterior portions that protrude from the perimeter wall; and
wherein at least part of the exterior portions taper along a direction parallel to the cavity axis.

Example 13. The RF measurement device of example 11 or example 12,
wherein the first and second mode converters have respective interior portions that protrude from the perimeter wall into the internal cavity; and
wherein the interior portions each split into a forked extension along a direction parallel to the cavity axis.

In some aspects of what is described, a method may be described by the following examples. The method may, in certain cases, be used to measure a property of a radio frequency (RF) electromagnetic wave.

Example 14. A method, comprising:
receiving, at a first mode converter of an RF measurement device, an RF electromagnetic wave having a first RF waveguide mode;
converting, by operation of the first mode converter, the mode of the RF electromagnetic wave from the first RF waveguide mode to a second RF waveguide mode;
guiding, by operation of an RF waveguide of the RF measurement device, the RF electromagnetic wave through an internal cavity of the RF measurement device and from the first mode converter to a second mode converter of the RF measurement device, the internal cavity containing a vapor that comprises Rydberg atoms or molecules; and
converting, by operation of the second mode converter, the mode of the RF electromagnetic wave from the second RF waveguide mode to the first RF waveguide mode.

Example 15. The method of example 14,
wherein the RF measurement device defines at least part of an RF pathway that extends between first and second RF ports of a test RF waveguide;
wherein the first mode converter receives the RF electromagnetic wave from the first RF port of the test RF waveguide; and
wherein the method comprises transmitting the RF electromagnetic wave from the second mode converter to the second RF port of the test RF waveguide.

Example 16. The method of example 15,
wherein the RF electromagnetic wave is a first RF electromagnetic wave; and
wherein the method comprises:
receiving, at the second mode converter, a second RF electromagnetic wave from the second RF port of the test RF waveguide, the second RF electromagnetic wave having the first RF waveguide mode,
converting, by operation of the second mode converter, the mode of the second RF electromagnetic wave from the first RF waveguide mode to the second RF waveguide mode,
guiding, by operation of the RF waveguide, the second RF electromagnetic wave through the internal cavity from the second mode converter to the first mode converter, and
converting, by operation of the first mode converter, the mode of the second RF electromagnetic wave from the second RF waveguide mode to the first RF waveguide mode.

Example 17. The method of example 16, comprising:
transmitting the second RF electromagnetic wave from the first mode converter to the first RF port of the test RF waveguide.

Example 18. The method of example 14 any one of examples 15-17, comprising:
passing two or more input optical signals through the vapor to generate an output optical signal;

measuring, by operation of an optical detector, an optical property of the output optical signal, the optical property representing a property of the RF electromagnetic wave.

Example 19. The method of example 18, wherein the optical property of the output optical signal comprises an amplitude of the output optical signal.

Example 20. The method of example 18 or example 19, wherein the optical property of the output optical signal comprises a frequency of the output optical signal.

Example 21. The method of example 18 or any one of examples 19-20, wherein the optical property of the output optical signal comprises a phase of the output optical signal.

Example 22. The method of example 18 or any one of examples 19-21, wherein the optical property of the output optical signal comprises a polarization of the output optical signal.

Example 23. The method of example 18 or any one of examples 19-22, wherein the property of the RF electromagnetic wave comprises a power of the RF electromagnetic wave.

Example 24. The method of example 18 or any one of examples 19-23, wherein the property of the RF electromagnetic wave comprises a frequency of the RF electromagnetic wave.

Example 25. The method of example 18 or any one of examples 19-24, wherein the property of the RF electromagnetic wave comprises a phase of the RF electromagnetic wave.

Example 26. The method of example 18 or any one of examples 19-25,
wherein the two or more input optical signals comprise a probe optical signal;
wherein passing the two or more input optical signals through the vapor comprises interacting the probe optical signal with the vapor to alter an optical property of the probe optical signal; and
wherein the optical property of the probe optical signal, when altered, defines an optical property of the output optical signal.

Example 27. The method of example 18 or any one of examples 19-26,
wherein the RF waveguide comprises first and second longitudinal portions disposed on respective, opposite sides of the RF measurement device; and
wherein guiding the RF electromagnetic wave comprises altering, by operation of the first and second longitudinal portions, a profile of the RF electromagnetic wave to match a target RF profile in an interaction region of the internal cavity.

Example 28. The method of example 27, wherein the target RF profile comprises a parabolic electric field intensity.

Example 29. The method of example 27 or example 28, wherein the target RF profile comprises a uniform electric field intensity.

Example 30. The method of example 27 or any one of examples 28-29,
wherein the first longitudinal portion has a first aperture therethrough;
wherein the second longitudinal portion has a second aperture therethrough; and
wherein passing two or more input optical signals through the vapor comprises propagating the two or more input optical signals along an optical path that extends successively through the first aperture, the interaction region, and the second aperture.

Example 31. The method of example 27 or any one of examples 28-29,
wherein the first longitudinal portion comprises a first pair of longitudinal bodies that extend along a length of the first longitudinal portion and straddle a first elongated aperture through the first longitudinal portion;
wherein the second longitudinal portion comprises a second pair of longitudinal bodies that extend along a length of the second longitudinal portion and straddle a second elongated aperture through the second longitudinal portion; and
wherein passing two or more input optical signals through the vapor comprises propagating the two or more input optical signals along an optical path that extends successively through the first elongated aperture, the interaction region, and the second elongated aperture.

Example 32. The method of example 14 or any one of examples 15-31, wherein the first and second mode converters are adiabatic mode converters.

Example 33. The method of example 14 or any one of examples 15-32, wherein the RF measurement device comprises a perimeter wall that surrounds the internal cavity and passes through the first and second mode converters.

Example 34. The method of example 33, wherein the perimeter wall comprises a pattern of holes that is disposed adjacent one or both of the first and second mode converters.

Example 35. The method of example 33 or example 34,
wherein the internal cavity is an elongated internal cavity that extends along a cavity axis between first and second ends of the RF measurement device; and
wherein the first and second mode converters are aligned with the cavity axis and disposed at, respectively, the first and second ends of the RF measurement device.

In some aspects of what is described, a device may be described by the following examples. The device may, in certain cases, be used to measure a property of a radio frequency (RF) electromagnetic wave, such as by establishing a circular polarization in the RF electromagnetic wave.

Example 36. A radio frequency (RF) measurement device, comprising:
first and second mode converters, each configured to convert a mode of an RF electromagnetic wave between a first RF waveguide mode and a second RF waveguide mode;
an internal cavity between the first and second mode converters that contains a vapor or a source of the vapor, the vapor comprising Rydberg atoms or molecules; and
an RF waveguide extending between the first and second mode converters and configured to establish a circular polarization of the RF electromagnetic wave in the internal cavity.

Example 37. The RF measurement device of example 36, wherein the RF waveguide is configured to establish the circular polarization in:
a first rotational direction when the RF electromagnetic wave is guided by the RF waveguide from the first mode converter to the second mode converter; and
a second rotational direction when the RF electromagnetic wave is guided by the RF waveguide from the second mode converter to the first mode converter, the second rotational direction opposite the first rotational direction.

Example 38. The RF measurement device of example 36 or example 37, wherein the RF waveguide comprises:
first and second longitudinal portions disposed on respective, opposite sides of the RF measurement device and configured to establish:
a first target RF profile in a first interaction region of the internal cavity, the first target RF profile comprising a first circular polarization, and
a second target RF profile in a second interaction region of the internal cavity, the second target RF profile comprising a second circular polarization, the second circular polarization opposite in direction of the first circular polarization.

Example 39. The RF measurement device of example 38, wherein the first and second longitudinal portions each have first and second apertures therethrough;
wherein a first optical path extends successively through the first aperture of the first longitudinal portion, the first interaction region, and the first aperture of the second longitudinal portion; and
wherein a second optical path extends successively through the second aperture of the first longitudinal portion, the second interaction region, and the second aperture of the second longitudinal portion.

Example 40. The RF measurement device of example 36 or any one of examples 37-39, comprising:
a perimeter wall that surrounds the internal cavity and passes through the first and second mode converters, the perimeter wall defining a plane of the RF measurement device;
wherein the circular polarization has an axis of rotation that is perpendicular to the plane of the RF measurement device.

Example 41. The RF measurement device of example 40, wherein the internal cavity is an elongated internal cavity that extends along a cavity axis between first and second ends of the RF measurement device; and
wherein the RF waveguide comprises an array of segments that are spaced periodically in an array plane along a direction parallel to the cavity axis, the array plane parallel to the plane of the RF measurement device.

Example 42. The measurement device of example 41, wherein each segment is oriented perpendicular to the cavity axis.

Example 43. The RF measurement device of example 36 or any one of examples 37-39,
wherein the internal cavity is an elongated internal cavity that extends along a cavity axis between first and second ends of the RF measurement device; and
wherein the circular polarization has an axis of rotation that is parallel to the cavity axis.

Example 44. The RF measurement device of example 43, comprising:
a perimeter wall that surrounds the internal cavity and passes through the first and second mode converters, the perimeter wall defining a plane of the RF measurement device;
wherein the cavity axis and the plane of the RF measurement device are parallel to each other.

Example 45. The RF measurement device of example 43 or example 44, wherein the RF waveguide comprises:
an array of segments spaced periodically along a direction parallel to the cavity axis, the segments positioned alternatively above and below a reference plane to define respective first and second sub-arrays of segments, the first and second sub-arrays of segments rotated in opposite directions relative to a reference orientation.

Example 46. The RF measurement device of example 45, wherein the reference orientation is perpendicular to the cavity axis.

Example 47. The RF measurement device of example 36 or any one of examples 37-46, wherein the first and second mode converters are adiabatic mode converters.

Example 48. The RF measurement device of example 36 or any one of examples 37-47, comprising:
a perimeter wall that surrounds the internal cavity and passes through the first and second mode converters, the perimeter wall comprising a pattern of holes that is disposed adjacent one or both of the first and second mode converters.

Example 49. The RF measurement device of example 36 or any one of examples 37-48,
wherein the internal cavity is an elongated internal cavity that extends along a cavity axis between first and second ends of the RF measurement device; and
wherein the first and second mode converters are aligned with the cavity axis and disposed at, respectively, the first and second ends of the RF measurement device.

In some aspects of what is described, a method may be described by the following examples. The method may, in certain cases, be used to measure a property of a radio frequency (RF) electromagnetic wave, such as by establishing a circular polarization in the RF electromagnetic wave. In some cases, the circular polarization is established by creating a new circular polarization in the RF electromagnetic wave where there was previously none. In some cases, the circular polarization is established by altering an existing circular polarization of the RF electromagnetic wave.

Example 50. A method, comprising:
receiving, at a first mode converter of an RF measurement device, an RF electromagnetic wave having a first RF waveguide mode;
converting, by operation of the first mode converter, the mode of the RF electromagnetic wave from the first RF waveguide mode to a second RF waveguide mode;
guiding, by operation of an RF waveguide of the RF measurement device, the RF electromagnetic wave through an internal cavity of the RF measurement device and from the first mode converter to a second mode converter of the RF measurement device, the RF waveguide establishing a circular polarization of the RF electromagnetic wave in the internal cavity, the internal cavity containing a vapor that comprises Rydberg atoms or molecules; and
converting, by operation of the second mode converter, the mode of the RF electromagnetic wave from the second RF waveguide mode to the first RF waveguide mode.

Example 51. The method of example 50,
wherein the RF waveguide comprises first and second longitudinal portions disposed on respective, opposite sides of the RF measurement device; and
wherein guiding the RF electromagnetic wave comprises altering, by operation of the first and second longitudinal portions, a profile of the RF electromagnetic wave to match a target RF profile in an interaction region of the internal cavity, the target RF profile comprising the circular polarization.

Example 52. The method of example 50 or example 51, wherein the RF measurement device comprises:
- a perimeter wall that surrounds the internal cavity and passes through the first and second mode converters, the perimeter wall defining a plane of the RF measurement device;
- wherein the circular polarization has an axis of rotation that is perpendicular to the plane of the RF measurement device.

Example 53. The method of example 52,
- wherein the internal cavity is an elongated internal cavity that extends along a cavity axis between first and second ends of the RF measurement device;
- wherein the RF waveguide comprises an array of segments that are spaced periodically in an array plane along a direction parallel to the cavity axis, the array plane parallel to the plane of the RF measurement device; and
- wherein guiding the RF electromagnetic wave through the internal cavity comprises interacting the RF electromagnetic wave with the array of segments to alter a profile of the RF electromagnetic wave.

Example 54. The method of example 50 or example 51,
- wherein the internal cavity is an elongated internal cavity that extends along a cavity axis between first and second ends of the RF measurement device; and
- wherein the circular polarization has an axis of rotation that is parallel to the cavity axis.

Example 55. The method of example 54,
- wherein the RF waveguide comprises an array of segments spaced periodically along a direction parallel to the cavity axis, the segments positioned alternatively above and below a reference plane to define respective first and second sub-arrays of segments, the first and second sub-arrays of segments rotated in opposite directions relative to a reference orientation; and
- wherein guiding the RF electromagnetic wave through the internal cavity comprises interacting the RF electromagnetic wave with the first and second sub-arrays of segments to alter a profile of the RF electromagnetic wave.

Example 56. The method of example 50 or any one of examples 51-55,
- wherein the RF measurement device defines at least part of an RF pathway that extends between first and second RF ports of a test RF waveguide;
- wherein the first mode converter receives the RF electromagnetic wave from the first RF port of the test RF waveguide; and
- wherein the method comprises transmitting the RF electromagnetic wave from the second mode converter to the second RF port of the test RF waveguide.

Example 57. The method of example 56,
- wherein the RF electromagnetic wave is a first RF electromagnetic wave, and the circular polarization is a first circular polarization having a first rotational direction; and
- wherein the method comprises:
  - receiving, at the second mode converter, a second RF electromagnetic wave from the second RF port of the test RF waveguide, the second RF electromagnetic wave having the first RF waveguide mode,
  - converting, by operation of the second mode converter, the mode of the second RF electromagnetic wave from the first RF waveguide mode to the second RF waveguide mode,
  - guiding, by operation of the RF waveguide, the second RF electromagnetic wave through the internal cavity and from the second mode converter to the first mode converter, the RF waveguide establishing a second circular polarization of the RF electromagnetic wave in the internal cavity, second circular polarization having a second rotational direction that is opposite the first rotational direction of the first circular polarization, and
  - converting, by operation of the first mode converter, the mode of the second RF electromagnetic wave from the second RF waveguide mode to the first RF waveguide mode.

Example 58. The method of example 57, comprising:
- transmitting the second RF electromagnetic wave from the first mode converter to the first RF port of the test RF waveguide.

Example 59. The method of example 57 or example 58 (but excluding the subject matter of example 51),
- wherein the RF waveguide comprises first and second longitudinal portions disposed on respective, opposite sides of the RF measurement device; and
- wherein guiding the RF electromagnetic wave comprises:
  - altering, by operation of the first and second longitudinal portions, a profile of the first RF electromagnetic wave to match a first target RF profile in a first interaction region of the internal cavity, the first target profile comprising a first circular polarization, and
  - altering, by operation of the first and second longitudinal portions, a profile of the second RF electromagnetic wave to match a second target RF profile in a second interaction region of the internal cavity, the second target profile comprising a second circular polarization that is opposite in direction of the first circular polarization.

Example 60. The method of example 59,
- wherein the first and second longitudinal portions each have first and second apertures therethrough; and
- wherein the method comprises passing two or more input optical signals through the vapor to generate an output optical signal, the two or more input optical signals propagating along:
  - a first optical path that extends successively through the first aperture of the first longitudinal portion, the first interaction region, and the first aperture of the second longitudinal portion, or
  - a second optical path that extends successively through the second aperture of the first longitudinal portion, the second interaction region, and the second aperture of the second longitudinal portion.

Example 61. The method of example 50 or any one of examples 51-60, comprising:
- passing two or more input optical signals through the vapor to generate an output optical signal; and
- measuring, by operation of an optical detector, an optical property of the output optical signal, the optical property representing a property of the RF electromagnetic wave.

Example 62. The method of example 61, wherein the optical property of the output optical signal comprises an amplitude of the output optical signal.

Example 63. The method of example 61 or example 62, wherein the optical property of the output optical signal comprises a frequency of the output optical signal.

Example 64. The method of example 61 or any one of examples 62-63, wherein the optical property of the output optical signal comprises a phase of the output optical signal.

Example 65. The method of example 61 or any one of examples 62-64, wherein the optical property of the output optical signal comprises a polarization of the output optical signal.

Example 66. The method of example 61 or any one of examples 62-65, wherein the property of the RF electromagnetic wave comprises a power of the RF electromagnetic wave.

Example 67. The method of example 61 or any one of examples 62-66, wherein the property of the RF electromagnetic wave comprises a frequency of the RF electromagnetic wave.

Example 68. The method of example 61 or any one of examples 62-67, wherein the property of the RF electromagnetic wave comprises a phase of the RF electromagnetic wave.

Example 69. The method of example 61 or any one of examples 62-68, wherein the property of the RF electromagnetic wave comprises a polarization of the RF electromagnetic wave.

Example 70. The method of example 61 or any one of examples 62-69,
- wherein the two or more input optical signals comprise a probe optical signal that is circularly polarized;
- wherein passing the two or more input optical signals through the vapor comprises interacting the probe optical signal with the vapor to alter an optical property of the probe optical signal; and
- wherein the optical property of the probe optical signal, when altered, defines the optical property of the output optical signal.

Example 71. The method of example 50 or any one of examples 51-70, wherein the RF measurement device comprises:
- a perimeter wall that surrounds the internal cavity and passes through the first and second mode converters, the perimeter wall comprising a pattern of holes that is disposed adjacent one or both of the first and second mode converters.

In some aspects of what is described, a system may be described by the following examples. The system may be used to measure a radio frequency (RF) electromagnetic wave, such as those used to generate RF signals.

Example 72. A system for measuring radio frequency (RF) electromagnetic waves, the system comprising:
- a laser system configured to generate a plurality of input optical signals;
- an RF measurement device comprising:
  - first and second mode converters, each configured to convert a mode of an RF electromagnetic wave between a first RF waveguide mode and a second RF waveguide mode,
  - an internal cavity between the first and second mode converters and containing a vapor that is configured to produce an output optical signal based on the plurality of input optical signals, the vapor comprising Rydberg atoms or molecules, and
  - an RF waveguide extending between the first and second mode converters and configured to carry the second RF waveguide mode through the internal cavity;
- an optical detector system configured to generate a detector signal in response to receiving the output optical signal, the detector signal representing an optical property of the output optical signal; and
- a signal processing system configured to generate data in response to receiving the detector signal, the data representing a property of the RF electromagnetic wave.

Example 73. The system of example 72, comprising:
a test RF waveguide having first and second RF ports and an RF pathway therebetween, the RF measurement device disposed along the RF pathway and aligned therewith.

Example 74. The system of example 73,
- wherein the first and second RF ports comprise, respectively, first and second waveguide flanges; and
- wherein the RF measurement device comprises a housing that extends between the first and second waveguide flanges, the housing comprising first and second housing flanges that are coupled to, respectively, the first and second waveguide flanges.

Example 75. The system of example 74,
- wherein the housing contains the internal cavity, the RF waveguide, and at least part of each of the first and second mode converters; and
- wherein the first and second mode converters reside proximate the first and second housing flanges, respectively.

Example 76. The system of example 72 or any one of examples 73-75, wherein the RF waveguide comprises:
first and second longitudinal portions disposed on respective, opposite sides of the RF measurement device and configured to establish a target RF profile in an interaction region of the internal cavity.

Example 77. The system of example 76, wherein the target RF profile comprises a parabolic electric field intensity.

Example 78. The system of example 76 or example 77, wherein the target RF profile comprises a uniform electric field intensity.

Example 79. The system of example 76,
- wherein the plurality of input optical signals are each circularly polarized; and
- wherein the target RF profile comprises a circular polarization.

Example 80. The system of example 72 or any one of examples 73-79, wherein the optical property of the output optical signal comprises an amplitude of the output optical signal.

Example 81. The system of example 72 or any one of examples 73-80, wherein the optical property of the output optical signal comprises a frequency of the output optical signal.

Example 82. The system of example 72 or any one of examples 73-81, wherein the optical property of the output optical signal comprises a phase of the output optical signal.

Example 83. The system of example 72 or any one of examples 73-82, wherein the optical property of the output optical signal comprises a polarization of the output optical signal.

Example 84. The system of example 72 or any one of examples 73-83, wherein the property of the RF electromagnetic wave comprises a power of the RF electromagnetic wave.

Example 85. The system of example 72 or any one of examples 73-84, wherein the property of the RF electromagnetic wave comprises a frequency of the RF electromagnetic wave.

Example 86. The system of example 72 or any one of examples 73-85, wherein the property of the RF electromagnetic wave comprises a phase of the RF electromagnetic wave.

Example 87. The system of example 72 or any one of examples 73-86, wherein the property of the RF electromagnetic wave comprises a polarization of the RF electromagnetic wave.

Example 88. The system of example 72 or any one of examples 73-87, wherein the RF measurement device is a first RF measurement device and the system comprises a second RF measurement device;
wherein the laser system is optically coupled to the first and second RF measurement devices such that each RF measurement device receives the plurality of input optical signals.

Example 89. The system of claim 88,
wherein the output optical signal is a first output optical signal and the second RF measurement device is operable to generate a second output optical signal;
wherein the optical detection system is optically coupled to the first and second RF measurement devices to receive the first and second output optical signals; and
wherein the optical detection system is configured to generate first and second detector signals based on, respectively, the first and second output optical signals.

Example 90. The system of example 72 or any one of examples 73-89, wherein the vapor is configured to alter an optical property of at least one of the plurality of input optical signals as the plurality of input optical signals pass through the vapor.

Example 91. The system of example 72 or any one of examples 73-90, wherein the Rydberg atoms comprise a Group IA atom selected from the group consisting of Na, K, Rb, and Cs.

In some aspects of what is described, a method may be described by the following examples. The method may be used to measure a radio frequency (RF) electromagnetic wave, such as those used to generate RF signals.

Example 92. A method for measuring radio frequency (RF) electromagnetic waves, the method comprising:
generating a plurality of input optical signals by operation of a laser system;
passing the plurality of input optical signals through a vapor of an RF measurement device to generate an output optical signal, the vapor comprising Rydberg atoms or molecules, the RF measurement device comprising:
first and second mode converters, each configured to convert a mode of an RF electromagnetic wave between a first RF waveguide mode and a second RF waveguide mode,
an internal cavity between the first and second mode converters and containing the vapor, and
an RF waveguide extending between the first and second mode converters and configured to carry the second RF waveguide mode through the internal cavity;
generating, by operation of an optical detector system, a detector signal in response to receiving the output optical signal at the optical detector system, the detector signal representing an optical property of the output optical signal; and
generating, by operation of a signal processing system, data based on the detector signal that represents a property of the RF electromagnetic wave.

Example 93. The method of example 92, comprising:
transmitting the RF electromagnetic wave along an RF pathway that extends between first and second RF ports of a test RF waveguide, the RF measurement device disposed along the RF pathway and aligned therewith.

Example 94. The method of example 93,
wherein the first and second RF ports comprise, respectively, first and second waveguide flanges; and
wherein the RF measurement device comprises a housing that extends between the first and second waveguide flanges, the housing comprising first and second housing flanges that are coupled to, respectively, the first and second waveguide flanges.

Example 95. The method of example 94, wherein transmitting the RF electromagnetic wave comprises guiding, by operation of the housing, at least a portion of the RF electromagnetic wave from the first housing flange to the second housing flange.

Example 96. The method of example 94 or example 95,
wherein the housing contains the internal cavity, the RF waveguide, and at least part of each of the first and second mode converters; and
wherein the first and second mode converters reside proximate the first and second housing flanges, respectively.

Example 97. The method of example 93 or any one of examples 94-96, wherein transmitting the RF electromagnetic wave comprises:
converting, by operation of the first mode converter, the mode of the RF electromagnetic wave from the first RF waveguide mode to the second RF waveguide mode; and
converting, by operation of the second mode converter, the mode of the RF electromagnetic wave from the second RF waveguide mode to the first RF waveguide mode.

Example 98. The method of example 93 or any one of examples 94-97, wherein transmitting the RF electromagnetic wave comprises guiding, by operation of the RF waveguide, the RF electromagnetic wave through the internal cavity from the first mode converter to the second mode converter.

Example 99. The method of example 98,
wherein transmitting the RF electromagnetic wave comprises interacting the RF electromagnetic wave with the vapor; and
wherein the method comprises:
while interacting, altering an optical property of at least one of the plurality of input optical signals as the plurality of input optical signals pass through the vapor.

Example 100. The method of example 93 or any one of examples 92-99,
wherein the RF waveguide comprises first and second longitudinal portions disposed on respective, opposite sides of the RF measurement device, the first and second longitudinal portions configured to establish a target RF profile in an interaction region of the internal cavity; and
wherein transmitting the RF electromagnetic wave comprises altering, by operation of the first and second longitudinal portions, a profile of the RF electromagnetic wave to match the target RF profile.

Example 101. The method of example 100, wherein the target RF profile comprises a parabolic electric field intensity.

Example 102. The method of example 100 or example 101, wherein the target RF profile comprises a uniform electric field intensity.

Example 103. The method of example 100,
wherein the plurality of input optical signals are each circularly polarized; and
wherein the target RF profile comprises a circular polarization.

Example 104. The method of example 92 or any one of examples 93-103, wherein the optical property of the output optical signal comprises an amplitude of the output optical signal.

Example 105. The method of example 92 or any one of examples 93-104, wherein the optical property of the output optical signal comprises a frequency of the output optical signal.

Example 106. The method of example 92 or any one of examples 93-105, wherein the optical property of the output optical signal comprises a phase of the output optical signal.

Example 107. The method of example 92 or any one of examples 93-106, wherein the optical property of the output optical signal comprises a polarization of the output optical signal.

Example 108. The method of example 92 or any one of examples 93-107, wherein the property of the RF electromagnetic wave comprises a power of the RF electromagnetic wave.

Example 109. The method of example 92 or any one of examples 93-108, wherein the property of the RF electromagnetic wave comprises a frequency of the RF electromagnetic wave.

Example 110. The method of example 92 or any one of examples 93-109, wherein the property of the RF electromagnetic wave comprises a phase of the RF electromagnetic wave.

Example 111. The method of example 92 or any one of examples 93-110, wherein the property of the RF electromagnetic wave comprises a polarization of the RF electromagnetic wave.

Example 112. The method of example 92 or any one of examples 93-111, wherein the Rydberg atoms comprise a Group IA atom selected from the group consisting of Na, K, Rb, and Cs.

Example 113. The method of example 93 or any one of examples 94-112, comprising:
generating, by operation of the laser system, a second plurality of input optical signals;
passing the second plurality of input optical signals through a vapor of a second RF measurement device to generate a second output optical signal, the vapor of the second RF measurement device comprising Rydberg atoms or molecules; and
transmitting a second RF electromagnetic wave along a second RF pathway that extends between third and fourth RF ports of the test RF waveguide, the second RF measurement device disposed along the second RF pathway and aligned therewith.

Example 114. The method of example 113, comprising:
generating, by operation of the optical detector system, a second detector signal in response to receiving the second output optical signal at the optical detector system, the second detector signal representing an optical property of the second output optical signal; and
generating, by operation of the signal processing system, second data based on the second detector signal that represents a property of the second RF electromagnetic wave.

Example 115. The method of example 113 or example 114, wherein the Rydberg atoms of the vapor of the second RF measurement device comprise a Group IA atom selected from the group consisting of Na, K, Rb, and Cs.

While this specification contains many details, these should not be understood as limitations on the scope of what may be claimed, but rather as descriptions of features specific to particular examples. Certain features that are described in this specification or shown in the drawings in the context of separate implementations can also be combined. Conversely, various features that are described or shown in the context of a single implementation can also be implemented in multiple embodiments separately or in any suitable sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single product or packaged into multiple products.

A number of embodiments have been described. Nevertheless, it will be understood that various modifications can be made. Accordingly, other embodiments are within the scope of the following claims.

What is claimed is:

1. A system for measuring radio frequency (RF) electromagnetic waves, the system comprising:
a laser system configured to generate a plurality of input optical signals;
an RF measurement device comprising:
first and second mode converters, each configured to convert a mode of an RF electromagnetic wave between a first RF waveguide mode and a second RF waveguide mode,
an internal cavity between the first and second mode converters and containing a vapor that is configured to produce an output optical signal based on the plurality of input optical signals, the vapor comprising Rydberg atoms or molecules, and
an RF waveguide extending between the first and second mode converters and configured to carry the second RF waveguide mode through the internal cavity;
an optical detector system configured to generate a detector signal in response to receiving the output optical signal, the detector signal representing an optical property of the output optical signal; and
a signal processing system configured to generate data in response to receiving the detector signal, the data representing a property of the RF electromagnetic wave.

2. The system of claim 1, comprising:
a test RF waveguide having first and second RF ports and an RF pathway therebetween, the RF measurement device disposed along the RF pathway and aligned therewith.

3. The system of claim 2,
wherein the first and second RF ports comprise, respectively, first and second waveguide flanges; and wherein the RF measurement device comprises a housing that extends between the first and second waveguide flanges, the housing comprising first and second housing flanges that are coupled to, respectively, the first and second waveguide flanges.

4. The system of claim 3,
wherein the housing contains the internal cavity, the RF waveguide, and at least part of each of the first and second mode converters; and
wherein the first and second mode converters reside proximate the first and second housing flanges, respectively.

5. The system of claim 1, wherein the RF waveguide comprises:
first and second longitudinal portions disposed on respective, opposite sides of the RF measurement device and configured to establish a target RF profile in an interaction region of the internal cavity.

6. The system of claim 5, wherein the target RF profile comprises a parabolic electric field intensity.

7. The system of claim 5, wherein the target RF profile comprises a uniform electric field intensity.

8. The system of claim 5,
wherein the plurality of input optical signals are each circularly polarized; and
wherein the target RF profile comprises a circular polarization.

9. The system of claim 1, wherein the optical property of the output optical signal comprises an amplitude of the output optical signal, a frequency of the output optical signal, a phase of the output optical signal, or a polarization of the output optical signal.

10. The system of claim 1, wherein the property of the RF electromagnetic wave comprises a power of the RF electromagnetic wave, a frequency of the RF electromagnetic wave, a polarization of the RF electromagnetic wave, or a phase of the RF electromagnetic wave.

11. The system of claim 1,
wherein the RF measurement device is a first RF measurement device and the system comprises a second RF measurement device;
wherein the laser system is optically coupled to the first and second RF measurement devices such that each RF measurement device receives the plurality of input optical signals.

12. The system of claim 11,
wherein the output optical signal is a first output optical signal and the second RF measurement device is operable to generate a second output optical signal;
wherein the optical detection system is optically coupled to the first and second RF measurement devices to receive the first and second output optical signals; and
wherein the optical detection system is configured to generate first and second detector signals based on, respectively, the first and second output optical signals.

13. The system of claim 1, wherein the vapor is configured to alter an optical property of at least one of the plurality of input optical signals as the plurality of input optical signals pass through the vapor.

14. The system of claim 1, wherein the Rydberg atoms comprise a Group IA atom selected from the group consisting of Na, K, Rb, and Cs.

15. A method for measuring radio frequency (RF) electromagnetic waves, the method comprising:
generating a plurality of input optical signals by operation of a laser system;
passing the plurality of input optical signals through a vapor of an RF measurement device to generate an output optical signal, the vapor comprising Rydberg atoms or molecules, the RF measurement device comprising:
first and second mode converters, each configured to convert a mode of an RF electromagnetic wave between a first RF waveguide mode and a second RF waveguide mode,
an internal cavity between the first and second mode converters and containing the vapor, and
an RF waveguide extending between the first and second mode converters and configured to carry the second RF waveguide mode through the internal cavity;
generating, by operation of an optical detector system, a detector signal in response to receiving the output optical signal at the optical detector system, the detector signal representing an optical property of the output optical signal; and
generating, by operation of a signal processing system, data based on the detector signal that represents a property of the RF electromagnetic wave.

16. The method of claim 15, comprising:
transmitting the RF electromagnetic wave along an RF pathway that extends between first and second RF ports of a test RF waveguide, the RF measurement device disposed along the RF pathway and aligned therewith.

17. The method of claim 16,
wherein the first and second RF ports comprise, respectively, first and second waveguide flanges; and
wherein the RF measurement device comprises a housing that extends between the first and second waveguide flanges, the housing comprising first and second housing flanges that are coupled to, respectively, the first and second waveguide flanges.

18. The method of claim 17, wherein transmitting the RF electromagnetic wave comprises guiding, by operation of the housing, at least a portion of the RF electromagnetic wave from the first housing flange to the second housing flange.

19. The method of claim 17,
wherein the housing contains the internal cavity, the RF waveguide, and at least part of each of the first and second mode converters; and
wherein the first and second mode converters reside proximate the first and second housing flanges, respectively.

20. The method of claim 16, wherein transmitting the RF electromagnetic wave comprises:
converting, by operation of the first mode converter, the mode of the RF electromagnetic wave from the first RF waveguide mode to the second RF waveguide mode; and
converting, by operation of the second mode converter, the mode of the RF electromagnetic wave from the second RF waveguide mode to the first RF waveguide mode.

21. The method of claim 16, wherein transmitting the RF electromagnetic wave comprises guiding, by operation of the RF waveguide, the RF electromagnetic wave through the internal cavity from the first mode converter to the second mode converter.

22. The method of claim 21,
wherein transmitting the RF electromagnetic wave comprises interacting the RF electromagnetic wave with the vapor; and wherein the method comprises:
while interacting, altering an optical property of at least one of the plurality of input optical signals as the plurality of input optical signals pass through the vapor.

23. The method of claim 16,
wherein the RF waveguide comprises first and second longitudinal portions disposed on respective, opposite sides of the RF measurement device, the first and second longitudinal portions configured to establish a target RF profile in an interaction region of the internal cavity; and
wherein transmitting the RF electromagnetic wave comprises altering, by operation of the first and second longitudinal portions, a profile of the RF electromagnetic wave to match the target RF profile.

24. The method of claim 23, wherein the target RF profile comprises a parabolic electric field intensity or a uniform electric field intensity.

25. The method of claim 23,
wherein the plurality of input optical signals are each circularly polarized; and
wherein the target RF profile comprises a circular polarization.

26. The method of claim 15, wherein the optical property of the output optical signal comprises an amplitude of the output optical signal, a frequency of the output optical signal, a phase of the output optical signal, or a polarization of the output optical signal.

27. The method of claim 15, wherein the property of the RF electromagnetic wave comprises a power of the RF electromagnetic wave, a frequency of the RF electromagnetic wave, a phase of the RF electromagnetic wave, or a polarization of the RF electromagnetic wave.

28. The method of claim 15, wherein the Rydberg atoms comprise a Group IA atom selected from the group consisting of Na, K, Rb, and Cs.

29. The method of claim 15, comprising:
transmitting the RF electromagnetic wave along an RF pathway that extends between first and second RF ports of a test RF waveguide, the RF measurement device disposed along the RF pathway and aligned therewith;
generating, by operation of the laser system, a second plurality of input optical signals;
passing the second plurality of input optical signals through a vapor of a second RF measurement device to generate a second output optical signal; and
transmitting a second RF electromagnetic wave along a second RF pathway that extends between third and fourth RF ports of the test RF waveguide, the second RF measurement device disposed along the second RF pathway and aligned therewith.

30. The method of claim 29, comprising:
generating, by operation of the optical detector system, a second detector signal in response to receiving the second output optical signal at the optical detector system, the second detector signal representing an optical property of the second output optical signal; and
generating, by operation of the signal processing system, second data based on the second detector signal that represent a property of the second RF electromagnetic wave.

* * * * *

UNITED STATES PATENT AND TRADEMARK OFFICE
CERTIFICATE OF CORRECTION

PATENT NO. : 12,007,425 B1
APPLICATION NO. : 18/503071
DATED : June 11, 2024
INVENTOR(S) : Yu et al.

Page 1 of 1

It is certified that error appears in the above-identified patent and that said Letters Patent is hereby corrected as shown below:

On the Title Page

Page 2, Column 2, Other Publications, Line 12 Delete "Ribidium" and insert -- Rubidium -- therefor In the Specification Column 9, Detailed Description, Line 12 Delete "12)." and insert -- $I_2$). -- therefor Column 15, Detailed Description, Line 21 Delete "212," and insert -- 214, -- therefor Column 18, Detailed Description, Line 30 Delete "1018*a*," and insert -- 1018*b*, -- therefor Column 18, Detailed Description, Line 31 Delete "1018*b*," and insert -- 1018*a*, -- therefor Column 25, Detailed Description, Line 47 Delete "47." and insert -- 4τ. -- therefor Column 28, Detailed Description, Line 27 Delete "ata" and insert -- at a -- therefor Column 28, Detailed Description, Line 55 Delete "a." and insert -- α. -- therefor Column 33, Detailed Description, Line 21 Delete "1700." and insert -- 1702. -- therefor Column 35, Detailed Description, Line 30 Delete "1728." and insert -- 1730. -- therefor Column 47, Detailed Description, Line 10 After "73-87," insert -- ¶ --

Signed and Sealed this
Twenty-first Day of January, 2025

Coke Morgan Stewart
*Acting Director of the United States Patent and Trademark Office*